United States Patent
Tachibana et al.

(10) Patent No.: US 7,233,273 B2
(45) Date of Patent: Jun. 19, 2007

(54) ANALOG-TO-DIGITAL CONVERTER

(75) Inventors: Suguru Tachibana, Kawasaki (JP);
Kazuhiro Mitsuda, Kawasaki (JP);
Tatsuo Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/363,968

(22) Filed: Mar. 1, 2006

(65) Prior Publication Data

US 2007/0115159 A1    May 24, 2007

(30) Foreign Application Priority Data

Nov. 18, 2005  (JP) .............................. 2005-334563

(51) Int. Cl.
*H03M 1/12* (2006.01)
(52) U.S. Cl. ...................... 341/155; 134/156
(58) Field of Classification Search ................ 341/144, 341/150–172
See application file for complete search history.

(56) References Cited

U.S. PATENT DOCUMENTS

| | | | |
|---|---|---|---|
| 4,803,462 A | 2/1989 | Hester et al. | |
| 4,831,381 A | 5/1989 | Hester | |
| 4,989,002 A | 1/1991 | Tan | |
| 5,581,252 A | 12/1996 | Thomas | |
| 6,714,151 B2 * | 3/2004 | Tachibana et al. | 341/144 |
| 6,750,800 B2 * | 6/2004 | Yoshinaga | 341/155 |
| 6,753,801 B2 * | 6/2004 | Rossi | 341/161 |
| 6,909,391 B2 * | 6/2005 | Rossi | 341/161 |

FOREIGN PATENT DOCUMENTS

| | | |
|---|---|---|
| JP | 06-164399 A | 6/1994 |
| JP | 11-017543 A | 1/1999 |
| JP | 2000-201077 A | 7/2000 |

OTHER PUBLICATIONS

R.K. Hester, et al., "Fully Differential ADC with Rail-to-Rail Common-Mode Range and Nonlinear Capacitor Compensation", IEEE Journal of Solid-State Circuits; vol. 25; No. 1; Feb. 1990, pp. 173-183.
Gilbert Promitzer, "12-bit Low-Power Fully Differential Switched Capacitor Noncalibrating Successive Approximation ADC with 1 MS/s", IEEE Journal of Solid-State Circuits, Jul. 2001, pp. 1138-1143.

* cited by examiner

*Primary Examiner*—Lam T. Mai
(74) *Attorney, Agent, or Firm*—Arent Fox LLP

(57) ABSTRACT

Included are a first unit including a DAC which generates a comparison signal serving as an object of comparison with the first analog signal, taking in and retaining the first analog signal, a second unit including a DAC which generates a comparison signal serving as an object of comparison with the first analog signal, taking in and retaining the second analog signal, a first switch connecting the first unit to an output side of the second unit, a comparator comparing a differential value between the first analog signal and the second analog signal with a differential value between the comparison signal of the first DAC and an output signal of the second DAC, and an electric potential control circuit controlling fluctuations in electric potentials of the first analog terminal and the second analog terminal.

6 Claims, 23 Drawing Sheets

US 7,233,273 B2

ANALOG-TO-DIGITAL CONVERTER

BACKGROUND OF THE INVENTION

The invention relates to generally to an AD (analog-to-digital) converter that converts an analog signal into a digital signal, and more particularly to a differential charge redistribution (or successive approximation register (SAR)) type AD converter.

Known at the present is a charge redistribution (or SAR) type AD converter having broad product applications, which is actualized with a comparatively simple circuit configuration, exhibits high compatibility with a CMOS process that can be manufactured at a comparatively low cost, and is capable of actualizing moderate conversion time and moderate conversion accuracy. Circuits disclosed in, e.g., Patent documents 1–5 and Non-Patent documents 1 and 2 are known as a conventional circuit of the charge redistribution (or SAR) type AD converter.

EXAMPLE 1 OF ELECTRIC CHARGE REDISTRIBUTION TYPE AD CONVERTER

FIG. 19 shows a typical differential capacitance DAC (digital-to-analog converter) of the electric charge redistribution type AD converter among those given above. It is to be noted that the same type of circuit is shown in Non-Patent document 1.

SW1 through SW18 represent switches, C1 through C12 designate capacitances (a combination of the capacitances is also termed a capacitance array), VINP indicates a (+) (which is called "positive" or a positive phase) analog input, VINN denotes a (−) (which is called "negative" or a negative phase (reverse phase) analog input, COMP1 designates a comparator, TOP+ designates a (+) side top plate of a capacitance array, TOP− represents a (−) side top plate of the capacitance array, Vrefp is a (+) side reference electric potential (5V), Vrefn is a (−) side reference electric potential (0V), R1, R2 are resistances, BUF1 is a buffer amplifier, CINP and CINN are comparator inputs, VCM is a bias potential of the comparator input when sampling, COUT1 is an output of the comparator, VIC, VICB represent internal node names given for an explanation, a (+) side capacitance DAC represents DAC constructed of a capacitance array of C1 through C6, and a (−) side capacitance DAC designates DAC constructed of a capacitance array of C7 through C12.

A value of nC (n is an integer) written together with C1 through C12 represents a relative relationship in magnitude between the respective capacitances and is weighted as shown in 1C, 2C, 4C, 8C, 16C. The capacitances C1 through C12 in FIG. 19 form 4-bit DAC.

A state of the switch illustrated in FIG. 19 indicates a state when sampling, wherein at the sampling time the capacitances C1 through C6 are charged with an electric potential of the (+) side analog input VINP, and the capacitances C7 through C12 are charged with an electric potential of the (−) side analog input VINN.

When sampling, an output of the buffer amplifier BUF1 defined as a voltage follower is connected to the top plates TOP+ and TOP− via SW17 and SW18. Namely, SW17, SW18 are closed. Further, through R1, R2, an electric potential of the node VIC becomes an intermediate electric potential between the electric potential of VINP and the electric potential of VINN. An electric potential of the node VICB is also equalized to the electric potential of VIC by the voltage follower (BUF1). To respectively express the electric potential of VINP and the electric potential of VINN by using "VINP" and "VINN", the electric potential of VICB is given by (VINP+VINN)/2.

When sampling, the switches SW17 and SW18 are closed, and hence the electric potentials of both of the (+) side top plate TOP+ and the (−) side top plate TOP− become (VINP+VINN)/2.

At this time, both of difference input terminals of the comparator COMP1 are supplied with the bias electric potential VCM by the switches SW13, SW14. Namely, when sampling, SW13, SW14 get closed (conductive). Further, the top plates TOP+, TOP− are shut off by the switches SW15 and SW16 from the differential input terminals of the comparator COMP1. Namely, when sampling, the SW15, SW16 are opened.

An electric charge QSAMPP accumulated in the top plate TOP+ of the (+) side capacitance DAC constructed of C1 through C6 is expressed by the formula (1). (32C represents a total capacitance of C1 through C6).

$$QSAMPP=-32C(VINP-(VINP+VINN)/2);$$

$$QSAMPP=-32C(VINP-VINN)/2; \quad \text{Formula (1)}$$

An electric charge QSAMPN accumulated in the top plate TOP− of the (−) side capacitance DAC constructed of C7 through C12 is expressed by the formula (2).

$$QSAMPN=-32C(-VINP+VINN)/2; \quad \text{Formula (2)}$$

Namely, the electric potentials of the top plate electric potentials TOP+, TOP− at the sampling time are set to the input common electric potential (VINP+VINN)/2, whereby absolute values of the electric charges subjected to the sampling by the (+) side capacitance DAC and the (−) side capacitance DAC are equal, but their polarities are reversed.

After the end of the sampling, SW13, SW14, SW17, SW18 are opened, while SW15, SW16 are closed. The electric potential of the bottom plate (an electrode side connecting to the switches SW1 through SW12) of C1 through C12 is changed to any one of Vrefp and Vrefn by switching over the switches SW1 through SW12, thus comparing and searching for a digital code corresponding to an analog potential difference (VINP minus VINN) subjected to the sampling in a way that makes the use of COUT1. An example of a searching procedure will hereinafter be briefly explained.

<Determination of Sign Bit>

To begin with, the switch SW6 is connected to Vrefp, SW1 through SW5 are connected to Vrefn. The bottom plate electric potential of a total capacitance 16C of C1 through C5 becomes Vrefn, and the bottom plate electric potential of a capacitance 16C of C6 becomes Vrefp. The electric charges QSAMPP accumulated in the (+) side top plate (TOP+) in the formula (1) are retained, and hence an electric potential Vtp of the (+) side top plate (TOP+) at this time is given by the formulae (3) and (4).

$$-16C(Vrefp-Vtp)+16C(Vtp-Vrefn)=-32C(VINP-VINN)/2; \quad \text{Formula (3)}$$

$$Vtp=-(VINP-VINN)/2+(Vrefp+Vrefn)/2; \quad \text{Formula (4)}$$

The switch of the (−) side capacitance DAC is operated in symmetry with the switch of the (+) side capacitance DAC. The switch SW12 is connected to Vrefn, SW7 through SW11 are connected to Vrefp. The bottom plate electric potential of a total capacitance 16C of C7 through C11 becomes Vrefp, and the bottom plate electric potential of a capacitance 16C of C12 becomes Vrefn. The electric charges QSAMPN accumulated in the (−) side top plate (TOP−) in the formula (2) are retained, and therefore an electric potential Vtn of the (−) side top plate (TOP−) at this time is given by the formulae (5) and (6).

$$-16C(Vrefp-Vtp)+16C(Vtp-Vrefn)=32C(VINP-VINN)/2;\quad \text{Formula (5)}$$

$$Vtn=(VINP-VINN)/2+(Vrefp+Vrefn)/2;\quad \text{Formula (6)}$$

Namely, when VINP−VINN>0, the electric potentials are expressed such as Vtp<Vtn, whereby it can be judged which analog input, VINP or VINN, has a higher electric potential. The circuit in FIG. 19 is a circuit capable of handling a differential signal including the polarity (plus and minus) and can therefore determine a sign bit by this first comparison.

Further, at this time, the common electric potential of the electric potential Vtp of the (+) side top plate TOP+ and the electric potential Vtn of the (−) side top plate TOP−, becomes (Vrefp+Vrefn)/2 and can be thus set as a central electric potential of the reference potential, and it is possible to set operational allowance that is maximum to the comparator. Herein, the common electric potential connotes the central electric potential of the differential inputs.

<Determination of MSB (Most Significant Bit)>

For simplifying the description, a case of VINP−VINN>0 (a case where the sign is plus (+)) will hereinafter be considered.

When VINP−VINN>0, SW6 is connected to Vrefp, and SW12 is connected to Vrefn. The switches SW1 through SW5 of the (+) side capacitance DAC are connected to Vrefp when the corresponding digital code is 1 and are connected to Vrefn when the corresponding digital code is 0. The switches SW7 through SW11 of the (−) side capacitance DAC are connected to Vrefn when the corresponding digital code is 1 and are connected to Vrefp when the corresponding digital code is 0 (when VINP−VINN>0, SW1 is connected to Vrefn, and SW7 is connected Vrefp). Accordingly, it follows that the (+) side capacitance DAC and the (−) side capacitance DAC are connected respectively to the (+) side reference electric potential Vrefp or (−) side reference electric potential Vrefn in symmetry with respect to the same digital code.

Determination of the most significant bit (MSB) (excluding the sign bit) will hereinafter be described. The switch SW6 is connected to Vrefp, SW1 through SW4 are connected to Vrefn, and SW5 is connected to Vrefp. The bottom plate electric potential of a total capacitance 8C of C1 through C4 becomes Vrefn, and the bottom plate electric potential of a total capacitance 24C of C5, C6 becomes Vrefp. The electric charges QSAMPP accumulated in the (+) side top plate (TOP+) in the formula (1) are retained, and hence an electric potential Vtp of the (+) side top plate TOP+ at this time is given by the formulae (7) and (8).

$$-24C(Vrefp-Vtp)+8C(Vtp-Vrefn)=-32C(VINP-VINN)/2;\quad \text{Formula (7)}$$

$$Vtp=-(VINP-VINN)/2+(Vrefp+Vrefn)/2+(Vrefp-Vrefn)/(2\times 2);\quad \text{Formula (8)}$$

The switch SW12 is connected to Vrefn, SW7 through SW10 are connected to Vrefp, and SW11 is connected to Vrefn (note that SW7 is, in the case of generating a 2's compliment, connected to Vrefn). The bottom plate electric potential of a total capacitance 8C of C7 through C10 becomes Vrefp, and the bottom plate electric potential of a total capacitance 24C of C11, C12 becomes Vrefn. The electric charges QSAMPP accumulated in the (−) side top plate TOP− in the formula (2) are retained, and therefore an electric potential Vtn of the (−) side top plate TOP− at this time is given by the formulae (9) and (10).

$$-8C(Vrefp-Vtp)+24C(Vtp-Vrefn)=32C(VINP-VINN)/2;\quad \text{Formula (9)}$$

$$Vtn=(VINP-VINN)/2+(Vrefp+Vrefn)/2-(Vrefp-Vrefn)/(2\times 2);\quad \text{Formula (10)}$$

This top plate electric potential becomes differential inputs CINP, CINN of the comparator. Considering a differential potential "Vtp−Vtn", the formula (11) is obtained.

$$Vtp-Vtn=-(VINP-VINN)+(Vrefp-Vrefn)/2;\quad \text{Formula (11)}$$

Namely, the comparator COMP1 can judge a relationship in magnitude between an input potential difference "VINP−VINN" and a value obtained by multiplying the reference potential difference (Vrefp−Vrefn) by ½.

<Processing of Bits Next to and Subsequent to MSB>

From what has been described so far, the digital codes corresponding to SW5, SW11 that correspond to MSB (Most Significant Bit) can be determined. Given next is an explanation of how a code (the second most significant bit excluding the sign bit) corresponding to SW4, SW10 is determined.

It is assumed that the digital code corresponding to SW5, SW11 is determined to be 0, and (VINP−VINN) is smaller than (Vrefp−Vrefn)/2. In this case, (VINP−VINN) is compared with (Vrefp−Vrefn)/4, and a relationship in magnitude therebetween is examined, thus narrowing down a value range of (VINP−VINN).

To be specific, in the (+) side capacitance DAC, the switch SW6 corresponding to the sign bit is connected to Vrefp, SW1 through SW3 and SW5 corresponding to MSB are connected to Vrefn, and SW4 is connected to Vrefp. The bottom plate electric potential of a total capacitance 12C of C1 through C3, C5 becomes Vrefn, and the bottom plate electric potential of a total capacitance 20C of C4, C6 becomes Vrefp. An electric potential Vtp of the (+) side top plate (TOP+) at this time is given by the formulae (12) and (13).

$$-20C(Vrefp-Vtp)+12C(Vtp-Vrefn)=-32C(VINP-VINN)/2;\quad \text{Formula (12)}$$

$$Vtp=-(VINP-VINN)/2+(Vrefp+Vrefn)/2+(Vrefp-Vrefn)/(2\times 4);\quad \text{Formula (13)}$$

Further, in the (−) side capacitance DAC, the connection symmetric to the (+) side capacitance DAC is established. To be specific, the switch SW12 corresponding to the sign bit is connected to Vrefn, SW7 through SW9 and SW11 are connected to Vrefp, SW10 is connected to Vrefn. The bottom plate electric potential of a total capacitance 12C of C7 through C9, C11 becomes Vrefp, and the bottom plate electric potential of a total capacitance 20C of C10, C12 becomes Vrefn. An electric potential Vtn of the (−) side top plate (TOP−) at this time is given by the formulae (14) and (15).

$$-12C(Vrefp-Vtp)+20C(Vtp-Vrefn)=32C(VINP-VINN)/2;\quad \text{Formula (14)}$$

$$Vtn=(VINP-VINN)/2+(Vrefp+Vrefn)/2-(Vrefp-Vrefn)/(2\times 4);\quad \text{Formula (15)}$$

This top plate electric potential becomes differential inputs CINP, CINN of the comparator. Considering a differential potential "Vtp−Vtn", the formula (16) is obtained $$Vtp-Vtn=-(VINP-VINN)+(Vrefp-Vrefn)/4;\quad \text{Formula (16)}$$

Through these connection, the (+) side capacitance DAC and the (−) side capacitance DAC generate such pieces of analog data that MSB (SW5, SW11) corresponds to a digital code "0", a bit (SW4, SW10) next to MSB corresponds to a digital code "1", and a bit in a lower-order than the bit next to MSB corresponds to the digital code "0". With this contrivance, the comparator COMP1 can judge a relationship in magnitude between an input potential difference "VINP−VINN" and a value obtained by multiplying the reference electric potential (Vrefp−Vrefn) by ¼. Thus, the electric potential of the bottom plate of the capacitances C1 through C12 is set to Vrefp or Vrefn by operating SW1 through SW12. With this setting, it is possible to judge a relationship in magnitude between the potential difference "VINP−VINN" and the electric potential into which "Vrefp−Vrefn" is divided. This enables the determination of the final digital value by sequentially narrowing down the value range of the potential difference "VINP−VINN" subjected to the sampling.

The electric potentials of the top plate TOP+, TOP− at the sampling time are set to the input common electric potential (VINP+VINN)/2, whereby absolute values of the electric charges subjected to the sampling by the (+) side capacitance DAC and the (−) side capacitance DAC are equal, but their polarities are reversed. Therefore, the capacitance DAC outputs thereof can be symmetrically operated by symmetrically operating the switches of the (+) side capacitance DAC and the (−) side capacitance DAC. Moreover, the common electric potential of the electric potential Vtp of the (+) side top plate (TOP+) and the electric potential Vtn of the (−) side top plate (TOP−) is given by (Vrefp+Vrefn)/2 (refer to the formula (4)+the formula (6), the formula (8)+the formula (10), the formula (13)+the formula (15)). Namely, this common electric potential can be set as a central electric potential of the reference potential, and consequently the operational allowance can be maximized. The operation of converting the differential analog input signal into the digital value was implemented by these circuits and the control method thereof.

EXAMPLE 2 OF ANOTHER CHARGE REDISTRIBUTION (OR SAR) TYPE AD CONVERTER

FIG. 20A shows an outline of a circuit of another charge redistribution (or SAR) type AD converter. (It should be noted that Non-Patent document 2 discloses the same circuit.)

In FIG. 20A, SW13 through SW16, S1, S2P, S2N, S3P, S3N represent switches, VINP designates a (+) analog input, VINN denotes a (−) analog input, COMP1 stands for a comparator, TOP+ designates a (+) side top plate of a capacitance array, TOP− represents a (−) side top plate of the capacitance array, Vrefp is a (+) side reference electric potential (e.g., 5V), Vrefn is a (−) side reference electric potential (e.g., 0V), CDACP is a (+) side capacitance DAC, CDACN is a (−) side capacitance DAC, CINP and CINN are comparator inputs, VCM is a bias potential of the comparator input when sampling, COUT1 is an output of the comparator, and NODE1 and NODE2 represent internal nodes.

In the conventional circuit in FIG. 19, the electric potentials of the top plates TOP+, TOP− at the sampling time are set to the input common electric potential ((VINP+VINN)/2).

In the conventional circuit in FIG. 20, the electric potentials of the top plates TOP+, TOP− at the sampling time are set to the input common electric potential ((VINP+VINN)/2) by operating the switches S1, S2P, S2N, S3P, S3N.

Given herein is an explanation of a mechanism for setting the electric potentials of the top plates TOP+, TOP− at the sampling time to the input common electric potential ((VINP+VINN)/2) by the conventional circuit in FIG. 20.

To begin with, in advance of the sampling of the analog input signals VINP and VINN, the switches S3P, S3N are switched ON (see FIG. 20B). At this time, the switches S2P, S2N are opened. The electric charges of the capacitances of CDACP, CDACN become 0 by switching ON the switches S3P, S3N. Hereafter, S3P, S3N are switched OFF, while the switches S1, S2P, S2N are switched ON (see FIG. 20B). The electric potential of NODE1 comes to VINP and the electric potential of NODE2 comes to VINN by switching ON S2P, S2N. Since the electric charge of CDACP is 0 and the electric charge of CDACN is 0, when a value of the sampling capacitance of CDACP is equalized to a value of the sampling capacitance of CDACN, the electric potentials of TOP+, TOP− become the input common electric potential ((VINP+VINN)/2) by switching ON the switch S1.

With this operation, in the same way as by the conventional circuit in FIG. 19, the absolute values of the electric charges subject to the sampling by the (+) side capacitance DAC and the (−) side capacitance DAC are equal, but their polarities are reversed. Therefore, the capacitance DAC outputs thereof can be symmetrically operated by symmetrically operating the switches of the (+) side capacitance DAC and the (−) side capacitance DAC. Moreover, as in the case of FIG. 19, the common electric potential of the electric potential Vtp of the (+) side top plate (TOP+) and the electric potential Vtn of the (−) side top plate (TOP−) is given by (Vrefp+Vrefn)/2. Accordingly, this common electric potential can be set as a central electric potential of the reference potential, and consequently the operational allowance can be maximized. The operation of converting the differential analog input signal into the digital value was actualized by these circuits and the control method thereof.

[Patent document 1] Japanese Patent Application Laid-Open Publication No. 6-164399
[Patent document 2] U.S. Pat. No. 5,581,252
[Patent document 3] U.S. Pat. No. 4,989,002
[Patent document 4] U.S. Pat. No. 4,831,381
[Patent document 5] U.S. Pat. No. 4,803,462
[Patent document 6] Japanese Patent Application Laid-Open Publication No. 2000-201077
[Patent document 7] Japanese Patent Application Laid-Open Publication No. 11-17543
[Non-Patent document 1] Authored by R. K. Hester et al, "Fully Differential ADC with Rail-to-Rail Common-Mode Range and Nonlinear Capacitor Compensation," IEEE Journal of Solid-State Circuits, (U.S.A.), February 1990, Vol. 25, No. 1, p. 173–183
[Non-Patent document 2] Authored by G. Promitzer, "12-bit Low-Power Fully Differential Switched Capacitor Noncalibrating Successive Approximation ADC with 1 MS/s," IEEE Journal of Solid-State Circuits, (U.S.A.), July 2001, Vol. 36, No. 7, p. 1138–1143

SUMMARY OF THE INVENTION

As typified by an LSI referred to as a system LSI or a Mixed-Signal LSI, with advancement of the hyperfine structure, there has hitherto been increased a demand for integrating, on the same chip, a CMOS digital circuit and a CMOS analog circuit. It is requested to integrate the CMOS analog circuit ensuring performance that meets a high speed property of the hyperfine CMOS digital circuit at a low cost and with low power consumption to the greatest possible degree.

For this reason, as described above, the prior art actualized the charge redistribution (or SAR) type AD converter that attains the small area size, the moderate conversion time and the moderate conversion accuracy, however, the much lower cost performance, the lower power consumption and the further speed-up are demanded of the differential charge redistribution (or SAR) type AD converter.

In the prior art (e.g., Non-Patent document 1) shown in FIG. 19, however, the electric potentials of the top plates TOP+, TOP− at the sampling time are set to the input common electric potential ((VINP+VINN)/2), and hence there are needed the resistances R1, R2 that generate the common electric potential of VINP, VINN and the buffer amplifier BUF1 for supplying the top plates with the common electric potential generated by the resistances R1, R2. This is because of the necessity of decreasing the electric current (increasing sensitivity) in the input circuit by increasing the values of R1, R2 and, on the other hand, increasing the electric current supplied to the top plates.

Therefore, a problem arises, wherein the power consumption in the buffer amplifier BUF1 is required with the result that the lower power consumption gets hard to attain.

On the other hand, in the prior art (e.g., Non-Patent document 2) shown in FIG. 20, the buffer amplifier is not employed unlike in FIG. 19, so that there is no problem in terms of the increase in the power consumption. Performance (an input range characteristic) for converting the analog input signal in a range that is very close to a limit of the power source voltage range, was not attained.

It is an object of the invention to provide an AD converter capable of operating with the small area and the low power, and converting the analog input signal that is very close to the limit of the power source voltage range (rail-to-rail range).

The invention adopts the following means in order to solve the problems. Namely, the invention is a digital-to-analog converter circuit including a first analog terminal receiving an input of a first analog signal, a first input switch inputting the first analog signal to the first analog terminal, a second analog terminal receiving an input of a second analog signal, a second input switch inputting the second analog signal to the second analog terminal, a first reference voltage connecting terminal supplied with a first reference voltage, a second reference voltage connecting terminal supplied with a second reference voltage, a first digital-to-analog converter taking in and retaining sample data of the first analog signal from the first analog terminal and generating a comparison signal serving as an object of comparison of the first analog signal, a second digital-to-analog converter taking in and retaining sample data of the second analog signal from the second analog terminal and generating a comparison signal serving as an object of comparison of the second analog signal, a first switch connecting in a mutually openable/closable manner an output side of the first digital-to-analog converter to an output side of the second digital converter, a comparator comparing, when the first switch is opened, a differential value between the first analog signal and the second analog signal with a differential value between the output signal of the first digital-to-analog converter and the output signal of the second digital-to-analog converter, and an electric potential control circuit controlling a fluctuation in the electric potentials of the first analog terminal and the second analog terminal, wherein the first digital-to-analog converter has a plurality of capacitance elements, a first set of a plurality of switches connecting and respective input-side terminals of the plurality of capacitance elements to any one of the first analog terminal, the first reference voltage terminal and the second reference voltage terminal, and a first common terminal connecting in common a plurality of output-side terminals facing the respective input-side terminals of the plurality of capacitance elements, wherein the second digital-to-analog converter has a plurality of capacitance elements, a second set of a plurality of switches connecting and respective input-side terminals of the plurality of capacitance elements to any one of the second analog terminal, the first reference voltage terminal and the second reference voltage terminal, and a second common terminal connecting in common a plurality of output-side terminals facing the respective input-side terminals of the plurality of capacitance elements, wherein at a point of time when the first digital-to-analog converter and the second digital-to-analog converter take in the sample data of the first analog signal and the second analog signal by the first input switch and the second input switch inputting the first analog signal and the second analog signal to the first analog terminal and the second analog terminal, the first common terminal and the second common terminal are connected to each other by the first switch, the connection between the first common terminal and the second common terminal is released when completing the take-in, and the electric potential control circuit, when the first input switch and the second input switch are opened after the completion of taking in the sample data of the first analog signal and the second analog signal, restrains a fluctuation in the electric potential of the first analog terminal and the electric potential of the second analog terminal.

At the point of time when the first digital-to-analog converter and the second digital-to-analog converter take in the sample data of the first analog signal and the second analog signal, the first common terminal and the second common terminal are connected to each other by the first switch, and hence the first digital-to-analog converter and the second digital-to-analog converter can take in the sample data in a way that sets the first common terminal and the second common terminal as a common reference point. Then, when the first input switch and the second input switch are opened after the completion of taking in the sample data, the fluctuation in the electric potential of the first analog terminal and the electric potential of the second analog terminal is restrained, whereby the conversion into the digital data can be done by restraining the electric potential fluctuation as a concomitant of the take-in of the sample data even when the sample data have an amplitude that is as large as approximately a limit of the power source voltage range.

According to the invention, it is possible to provide the analog-to-digital converter capable of operating with the small area and the low power, and converting the analog input signal that is very close to the limit of the power source voltage range.

DETAILED DESCRIPTION OF THE INVENTION

An AD (analog-to-digital) converter according to a best mode (which will hereinafter be termed an embodiment) for carrying out the invention will hereinafter be describe with reference to the drawings. Configurations in the following embodiments are exemplifications, and the invention is not limited to the configurations in the embodiments.

Substance of the Invention

Figure 20A:
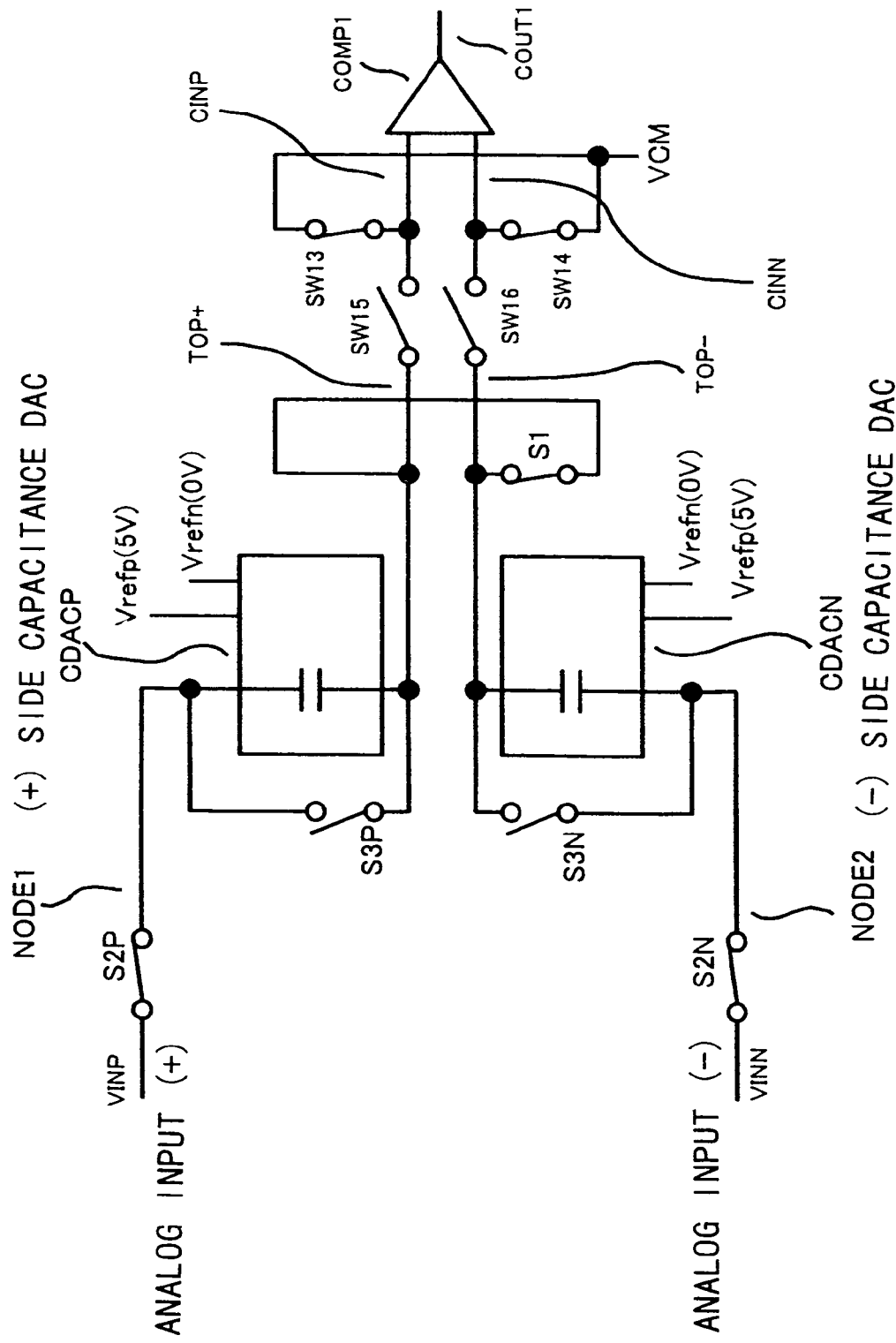
FIG. 20A is a diagram showing a circuit of a conventional charge redistribution (or SAR) type AD converter.
Figure 20B:
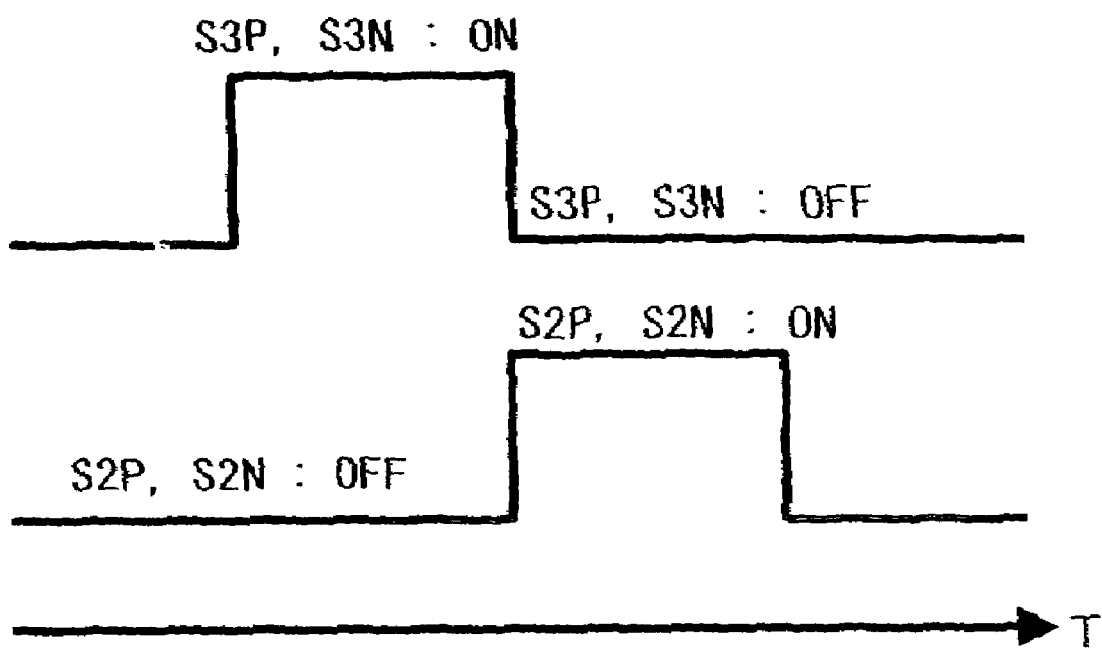
FIG. 20B is a diagram showing a control timing of the conventional charge redistribution (or SAR) type AD converter.
Figure 21:
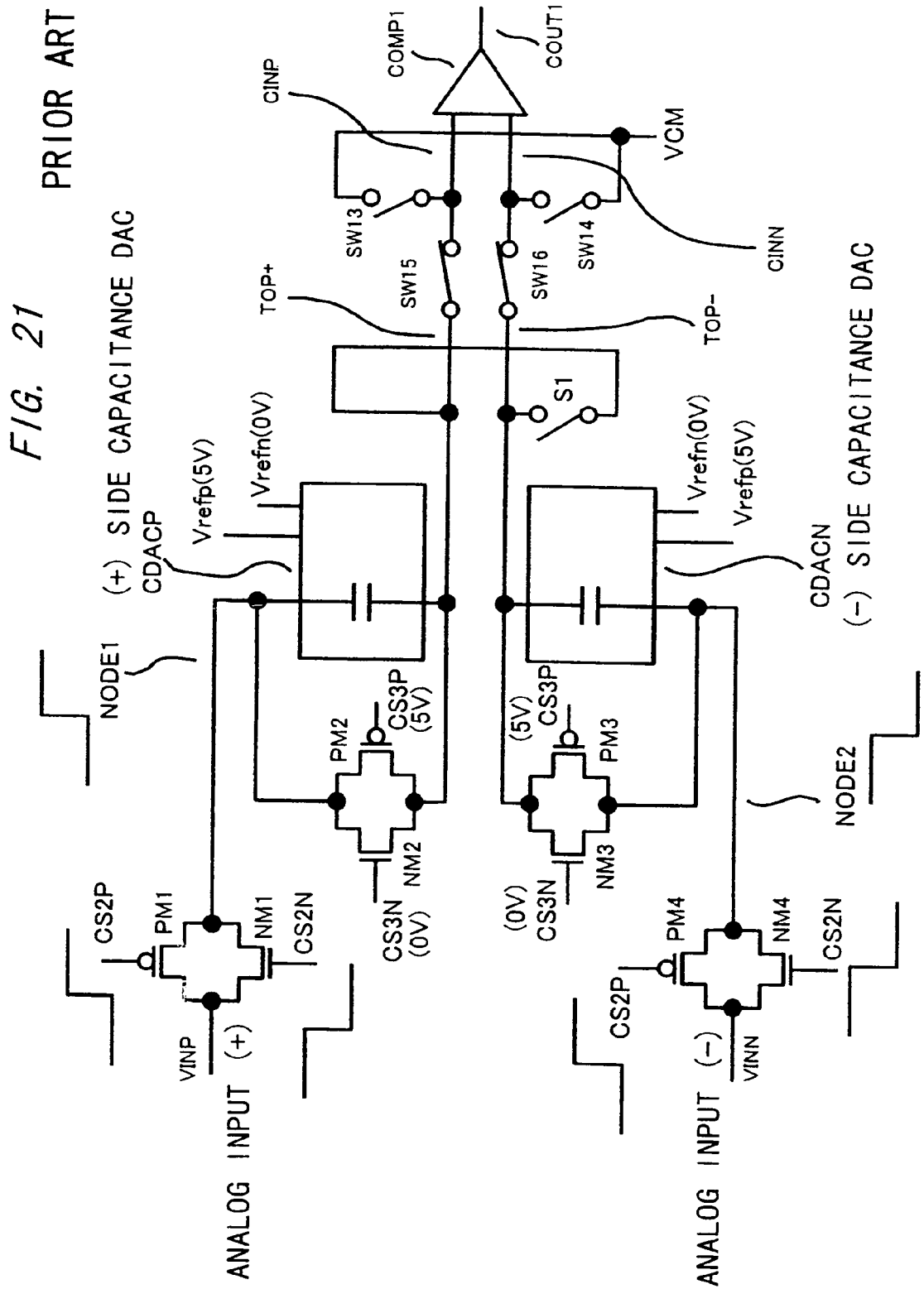
FIG. 21 is a diagram for explaining a problem of the AD converter.

FIG. 21 is a view for explaining a problem of the AD converter in FIG. 20. In FIG. 21, SW13 through SW16 and S1 represent switches, VINP designates a (+) analog input, VINN denotes a (−) analog input, COMP1 stands for a comparator, TOP+ designates a (+) side top plate of a capacitance array, TOP− represents a (−) side top plate of the capacitance array, Vrefp is a (+) side reference electric potential (e.g., 5V), Vrefn is a (−) side reference electric potential (e.g., 0V), CDACP is a (+) side capacitance DAC, CDACN is a (−) side capacitance DAC, CINP and CINN are comparator inputs, VCM is a bias potential of the comparator input when sampling, COUT1 is an output of the comparator, PM1 through PM4 are PMOS transistors, NM1 through NM4 are NMOS transistors, CS2P and CS3P are control signals of the PMOS transistors, CS2N and CS3N are control signals of the NMOS transistors, and NODE1 and NODE2 represent internal nodes.

FIG. 21 is illustrated as a transistor level circuit diagram of the switches S2P, S2N, S3P and S3P in FIG. 20 for facilitating the explanation of the problem of the circuit in FIG. 20.

Figure 19:
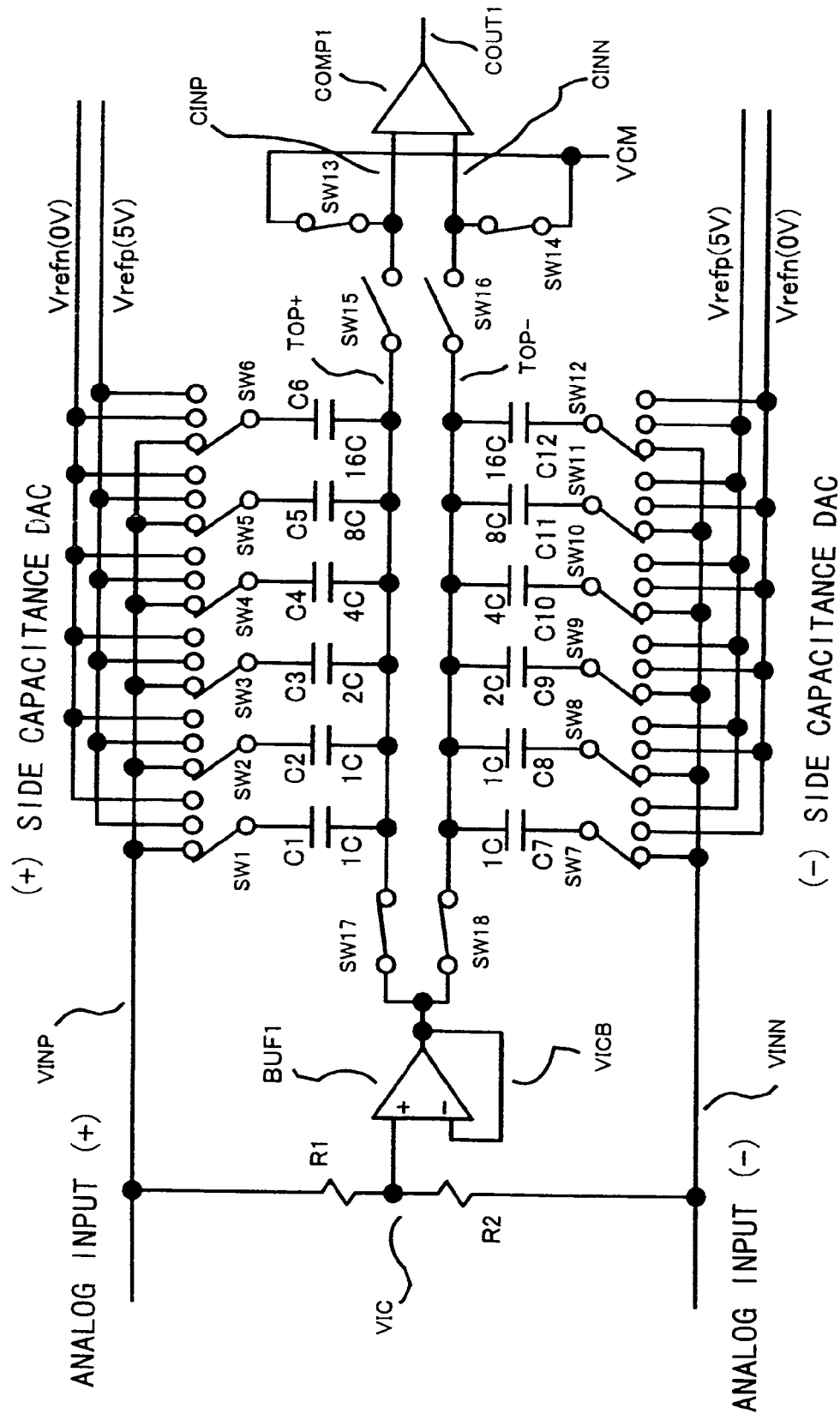
FIG. 19 is a diagram showing a conventional electric charge redistribution type AD converter.

To begin with, in advance of the sampling of the analog input signals VINP and VINN, PM2, NM2, PM3 and NM3 are switched ON (e.g., CS3P is set at 0V, and CS3N is set at 5V). At this time, PM1, NM1, PM4 and NM4 are switched OFF (CS2P is set at 5V, and CS2N is set at 0V). Thereafter, PM2, NM2, PM3 and NM3 are switched OFF (e.g., CS3P is set at 5V, and CS3N is set at 0V). Further, PM1, NM1, PM4, NM4, and S1 are switched ON (e.g., CS2P is set at 0V, and CS2N is set at 5V). With this setting, the electric potentials of TOP+ and TOP− become an input common electric potential ((VINP+VINN)/2), an electric potential of the bottom plate NODE1 of the (+) side capacitance DAC comes to VINP, an electric potential of the bottom plate NODE2 of the (−) side capacitance DAC comes to VINN, and the same electric charges as those of the conventional circuit in FIG. 19 are accumulated in a sampling capacitance and of the (−) side capacitance DAC.

After an end of this sampling, the switch S1 is switched OFF, the transistors PM1, NM1, PM4 and NM4 are switched OFF, and the operation moves to a comparing operation of the comparator by operating the electric potential of each bottom plate of the (+) side capacitance DAC and the electric potential of each bottom plate of the (+) side capacitance DAC and of the (−) side capacitance DAC.

For switching OFF the transistors PM1, NM1, PM4 and NM4, the control signal CS2P changes to H (High level) from L (Low level) (from 0V to 5V). Further, the control signal CS2N changes from H to L (from 5V to 0V).

At this time, for instance, supposing that both of a power source voltage and a reference voltage are 5V, such a case is considered that the electric potential of the VINP is 5V, and the electric potential of VINN is 0V. Namely, the consideration is given to such a case that the power source voltage and the reference voltage are approximately equal to the analog input signals to be converted.

When the electric potential of VINP is 5V, the electric potential of NODE1 is 5V, the electric potential of CS2P is 0V and the electric potential of CS2N is 5V, NM1 is not inverted, and hence a capacitance between a gate, a drain and a source thereof is a value as small as approximately an overlap capacitance. In the case of the NMOS transistor NM1, a gate potential is 5V, however, a source potential and a drain potential is 5V as well. The voltage between the gate and the source is required to exceed a threshold voltage Vth (e.g., 0.7V) in order for the MOS transistor to be inverted, so that an inversion layer is not formed in NM1 where the source potential and the drain potential are 5V. Therefore, it follows that a gate oxide film capacitance is not effectively connected to between the gate and the source (or the drain).

On the other hand, PM1 is formed with the inversion layer, and therefore a capacitance of the gate oxide film exists between the gate, the drain and the source. Namely, in the case of the PMOS transistor PM1, since the gate potential is 0V and both of the source and the drain are 5V, the voltage between the gate and the source is larger than the threshold voltage Vth, and a channel is thus formed. Hence, it follows that the gate oxide film capacitance is connected to between the gate and the source (or the drain).

In this state, when the electric potential of the CS2P changes from 0V to 5V and the electric potential of the CS2N changes from 5V to 0V, the electric potential of NODE1 rises through the gate capacitance of PM1 (a waveform diagram in FIG. 21 illustrates how this electric potential rises). At this time, both of PM1 and NM1 are switched OFF, and therefore it follows that the increased electric potential of the NODE1 is maintained.

Similarly, when the electric potential of VINN is 0V, the electric potential of NODE2 is 0V, the electric potential of CS2P is 0V and the electric potential of CS2N is 5V, PM4 is not inverted, and hence the capacitance between the gate, the drain and the source thereof is a value as small as approximately the overlap capacitance. On the other hand, NM4 is formed with the inversion layer, so that the gate oxide film capacitance exists between the gate, the drain and the source.

When the electric potential of the CS2P changes from 0V to 5V and the electric potential of the CS2N changes from 5V to 0V, the electric potential of NODE2 decreases through the gate capacitance of NM4 (the waveform diagram in FIG. 21 illustrates how this electric potential decreases). At this time, both of PM4 and NM4 are switched OFF, and therefore it follows that the decreased electric potential of the NODE2 is maintained.

Namely, when the sampling is finished, there is a case in which the electric potential of NODE1 rises over the power source voltage of 5V through the gate capacitances of PM1 and NM4, and the electric potential of NODE2 becomes an electric potential lower than the power source voltage of 0V and is thus maintained.

When the sampling is ended, the switch S1 is switched OFF, and the operation moves to a comparing operation of the comparator by operating the electric potential of each bottom plate of the (+) side capacitance DAC and the electric potential of each bottom plate of the (−) side capacitance DAC. At this time, if the electric potential of NODE1 is higher than the power source voltage of 5V, even when trying to switch OFF PM2 by setting the gate potential of PM2 at 5V, since the source potential of PM2 is, i.e., the electric potential of NODE1, a voltage is applied between the gate and the source of PM2, corresponding to a value (increased potential) with which the electric potential of NODE1 rises over the power source voltage of 5V. Hence, a slight electric current flows to TOP+ from NODE1 via PM2. This leads to a change in the electric charges accumulated in TOP+ and becomes a cause of not acquiring a result of proper conversion.

Similarly, if the electric potential of NODE2 is lower than the power source voltage of 0V, even when trying to switch OFF NM3 by setting the gate potential of NM3 at 0V, since the source potential of NM3 is the electric potential of NODE2, a voltage is applied between the gate and the source of NM3, corresponding to a value (decreased potential) with which the electric potential of NODE2 decreases under the power source voltage of 0V, and a slight electric current flows to NODE2 from TOP− via NM3. This leads to a change in the electric charges accumulated in TOP−, and a result of proper conversion is not acquired.

In the circuit in FIG. 21, for avoiding this problem, there is a necessity that a maximum value of an analog input electric potential VINP is set to an electric potential lower than the power source voltage, the lowest electric potential of VINN is set to an electric potential higher than 0V, and each of the electric potentials of NODE1, NODE2 does not exceed a power source voltage range even when each of the electric potentials of NODE1, NODE2 are changed due to coupling. Therefore, the circuit configuration in FIG. 21 is incapable of actualizing performance that converts the analog input signals in the power source voltage range (rail-to-rail range).

The embodiment will exemplify, as a first feature, a differential charge redistribution (or SAR) type AD converter capable of reducing the electric power consumption without any necessity for a buffer amplifier required by the conventional circuit in FIG. 19. Exemplified further is a differential charge redistribution (or SAR) type AD converter capable of converting an analog input signal in the power source voltage range (rail-to-rail range) that is not yet attained in the circuit in FIG. 21. Namely, such a circuit will be exemplified that a low electric power consumption characteristic making the buffer amplifier unnecessary and a characteristic of converting the analog input signal in the power source voltage range (rail-to-rail range), are compatible to each other.

Further, in the conventional circuit in FIG. 19, a digital value, into which the analog input signal is converted, is of 2' complement representation, however, a problem is that a period of conversion time increases corresponding to a code judging cycle. The embodiment will exemplify, as a second feature, a circuit that converts the analog signal into a digital value on the assumption of the code beforehand in such a case as to be capable of predicting a magnitude relationship between a (+) side analog input signal and a (−) side analog input signal.

Further, the embodiment will exemplify, for attaining the second feature, a circuit that converts the analog signal into the digital value, including the code if necessary because of employing the circuit that converts the analog signal into the digital value on the assumption of the sign bit (plus and minus).

For attaining the first feature in the embodiment (FIG. 1), there is provided a switch (S3P in FIG. 1) that equalizes the electric potentials of the top plate TOP+ and the bottom plate (terminals connecting to switches of C1 through C6) of the (+) side capacitance DAC of the differential capacitance DAC, and discharges a sampling capacitance of the (+) side capacitance DAC. Further, there is provided a switch (S3N in FIG. 1) that equalizes the electric potentials of the top plate TOP− and the bottom plate (terminals connecting to switches of C7 through C12) of the (−) side capacitance DAC, and discharges a sampling capacitance of the (−) side capacitance DAC.

Moreover, in the embodiment, there are provided switches S2P, S2N for separating the (+) side analog input signal VINP, the (−) side analog input signal VINN and the bottom plates of the capacitance DAC when the switches S3P, S3N for discharging the sampling capacitances are kept ON. Provided further is the switch S1 for equalizing the electric potential of the (+) side top plate TOP+ with the electric potential of the (−) side top plate TOP− at the time of the sampling of the analog input signal.

Then, when the sampling is finished, the switches S2P, S2N for supplying the bottom plates with the analog input signals VINP, VINN are switched OFF. Provided is a switch S4 that equalizes the electric potentials of NODE1, NODE2 so that the electric potentials of the nodes NODE1, NODE2 do not exceed the power source voltage range at this time.

Further, for attaining the second feature, in the embodiment (FIG. 1), the electric potential of the bottom plate of a capacitance C6 having a magnitude that is ½ a total sampling capacitance of the (+) side capacitances DAC, is set to the (+) reference voltage Vrefp simultaneously with starting the comparison by the comparator. The bottom plate of a remaining binary weighted capacitance is connected to the (+) reference voltage Vrefp when the corresponding DAC input is 1, and is connected to the (−) reference voltage Vrefn when the corresponding DAC input is 0. Further, throughout the comparison period, without depending on the result of the comparison by the comparator COMP1, the electric potential of the bottom plate of the capacitance C6 corresponding to sign bit shall be the (+) reference voltage Vrefp.

Moreover, the electric potential of the bottom plate of a capacitance C12 (corresponding to the sign bit) having a magnitude that is ½ a total sampling capacitance of the (−) side capacitances DAC, is set to the (−) reference voltage Vrefn simultaneously with starting the comparison by the comparator. The bottom plate of a remaining binary weighted capacitance is connected to the (−) reference voltage Vrefn when the corresponding DAC input is 1, and is connected to the (+) reference voltage Vrefp when the corresponding DAC input is 0. Further, throughout the comparison period, without depending on the result of the comparison by the comparator COMP1, the electric potential of the bottom plate of the capacitance C12 corresponding to the sign bit shall be the (−) reference voltage Vrefn.

When at the end of the sampling of the analog input signal, even if the switches S2P, S2N that supply the bottom pales with the analog input signals VINP, VINN are switched OFF, the switch S4 (FIG. 1) equalizes the electric potentials of the nodes NODE1, NODE2, and hence the electric potentials of the nodes NODE1, NODE2, in which S2P, S2N are connected to the bottom plates, do not exceed the power source voltage range. It is possible to prevent the electric current from flowing to the top plates TOP+, TOP− via the switches S3P, S3N by converging the electric potentials of the nodes NODE1, NODE2 within the power source voltage range. This prevents a loss of the electric charges of the top plates TOP+, TOP− and enables acquirement of the proper conversion result.

Moreover, with the operation, on the assumption that the analog input VINP supplied to the bottom plate of the (+) side capacitance DAC is larger than or equal to the analog input VINN supplied to the bottom plate of the (−) side capacitance DAC, an analog input electric potential difference (VINP−VINN) can be converted into a digital value.

Namely, in a case where VINP−VINN>=0 is presumed beforehand, it is capable to perform the AD conversion by omitting the cycle required for the sign bit determination which is needed in the conventional circuit (FIG. 19). With this omission, the conversion time can be reduced correspondingly to a period of time required for the sign bit determination.

FIRST EMBODIMENT

Figure 1:
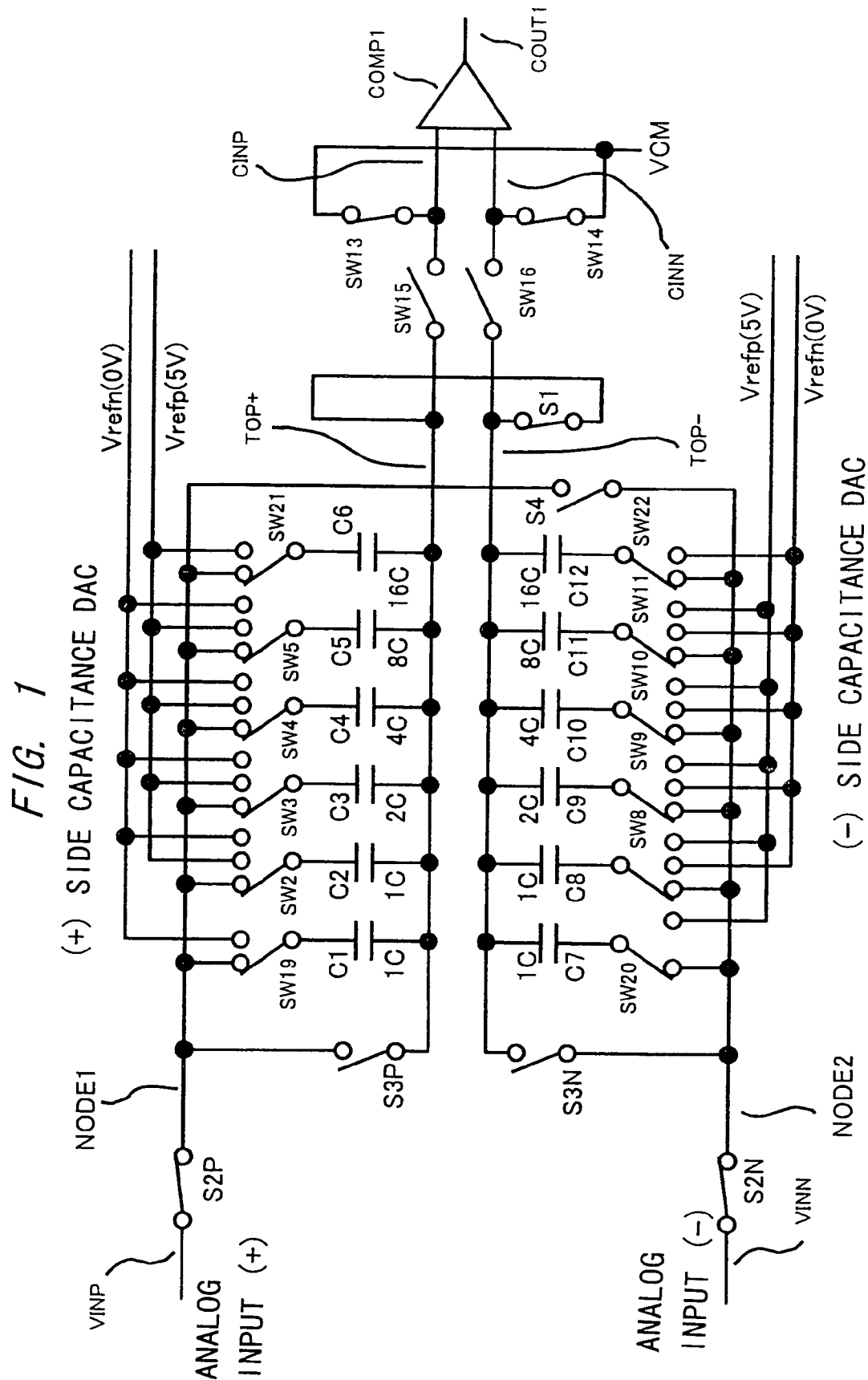
FIG. 1 is a circuit diagram showing an AD converter according to a first embodiment of the invention.
Figure 2:
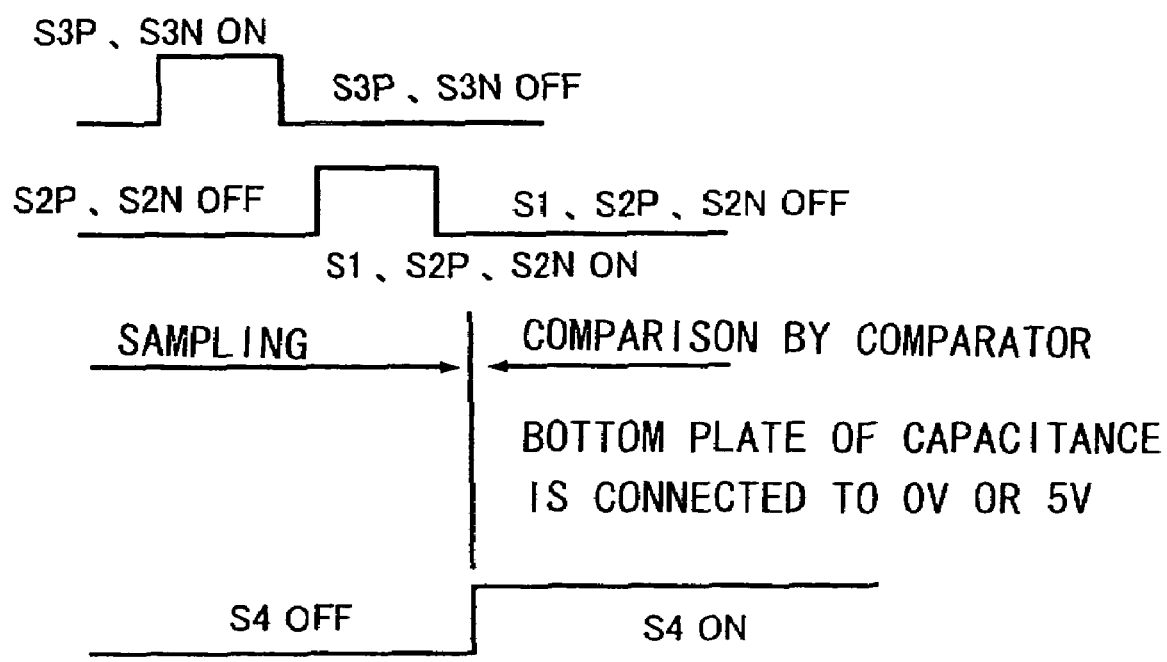
FIG. 2 is a diagram showing a control timing of the AD converter in FIG. 1.

A first embodiment of the invention will hereinafter be explained in detail. FIG. 1 is a circuit diagram showing an AD converter according to the first embodiment of the invention. FIG. 2 is a diagram showing a control timing of the switches S1, S2P, S2N, S3P, S3N and S4 in FIG. 1.

In FIG. 1, SW2 through SW5, SW8 through SW11, SW13 through SW16, SW19 through SW22, S1, S2P, S2N, S3P, S3N and S4 represent switches, C1 through C12 designate capacitances, VINP indicates a (+) analog input, VINN denotes a (−) analog input, TOP+ designates a (+) side top plate of a capacitance array, TOP− represents a (−) side top plate of the capacitance array, Vrefp is a (+) side reference electric potential (e.g., 5V), Vrefn is a (−) side reference electric potential (e.g., 0V), COMP1 stands for a comparator, CINP and CINN are comparator inputs, COUT1 is an output of the comparator, VCM is a bias potential (e.g., 2.5V) of the comparator input when sampling, NODE1 and NODE2 represent internal nodes, a (+) side capacitance DAC represents DAC constructed of a capacitance array of C1 through C6, and a (−) side capacitance DAC designates DAC constructed of a capacitance array of C7 through C12. Portions corresponding to the circuit elements of the conventional circuits in FIGS. 19 and 20 and elements having the same functions as those thereof, are shown in a way that gives the same element names and the same terminal names.

The comparator COMP1 corresponds to a comparator according to the invention, the (+) side capacitance DAC corresponds to a first digital-to-analog converter, the (−) side capacitance DAC corresponds to a second digital-to-analog converter, a terminal to be connected to the (+) side reference voltage Vrefp corresponds to a first reference voltage connecting terminal, and a terminal to be connected to the (−) side reference voltage Vrefn corresponds to a second reference voltage connecting terminal.

Herein, the top plate TOP+ connotes, in the capacitance DAC, a terminal opposite to a terminal (bottom plate) connected via the switches SW19, SW2–SW5 and SW21 to NODE1 to which a (+) side analog signal is inputted. Further, the top plate TOP− connotes, in the capacitance DAC, a terminal opposite to a terminal (bottom plate) connected via the switches SW20, SW8–SW11 and SW22 to NODE2 to which a (−) side analog signal is inputted.

A value of bC (b is an integer) written together with the capacitance Ca (a is an integer) represents a relative relationship in magnitude between the respective capacitances and is weighted as shown in 1C, 2C, 4C, 8C, 16C (etc). The capacitances C1 through C12 in FIG. 1 form 4-bit DAC.

A state of the switch represents a sampling state of the capacitance DAC. When sampling, C1 trough C6 are charged with the electric potential of VINP, and C7 trough C12 are charged with the electric potential of VINN.

At first, in advance of the sampling of the analog input signals VINP, VINN, the switches S3P, S3N for discharging are switched ON (see FIG. 2). At this time, the switched S2P, S2N for inputting the analog signals are set open (more precisely, it is not dispensable to switch OFF both of the switches, and any one switch, e.g., S2N may be kept ON).

Moreover, for instance, the switch S1 is switched ON, and the switches SW2 through SW5, SW19 and SW21 are connected to NODE1. Further, for example, SW8 through SW11, SW20 and SW22 are connected to NODE2. The electric potentials of the top plates (TOP+, TOP−) of C1 through C12 are equalized to the electric potentials of the bottom plates of C1 through C12 by switching ON S3P and S3N, and the electric charges accumulated in the sampling capacitances C1 through C12 of the (+) side capacitance DAC and the (−) side capacitance DAC become 0.

Thereafter, S3P, S3N are switched OFF, and S1, S2P, S2N are switched ON (see FIG. 2). At this time, a (+) side analog signal (corresponding to a first analog signal) is inputted to NODE1 (corresponding to a first analog terminal according to the invention) via the switch S2P (corresponding to a first input switch according to the invention). Moreover, a (−) side analog signal (corresponding to a second analog signal) is inputted to NODE2 (corresponding to a second analog terminal according to the invention) via the switch S2N (corresponding to a second input switch according to the invention).

As to S1, however, in a state where S3P, S3N are kept ON, S1 is switched ON, and an ON-state may e maintained). The electric potential of NODE1 becomes VINP, and the electric potential of NODE2 becomes VINN by switching ON S2P, S2N. The switches SW2 through SW5, SW19 and SW21 are to be connected to NODE1, and the switches SW8 through SW11, SW20 and SW22 are to be connected to NODE2. A total sampling capacitance (a total capacitance 32C of C1 through C6) of the (+) side capacitance DAC is equalized to a total sampling capacitance (a total capacitance 32C of C7 through C12) of the (−) side capacitance DAC, S1 is kept ON, and the electric potential of the top plate TOP+ is equal to the electric potential of the top plate TOP−, whereby the electric potentials of the top plates TOP+, TOP− become an input common electric potential ((VINP+VINN)/2). (VINP, VINN represent the electric potential of the (+) analog input VINP, and the electric potential of the (−) analog input VINN.) An electric charge QSAMPP accumulated in the top plate (TOP+) of the (+) side capacitance DAC constructed of C1 through C6 is expressed by the formula (17). (32C represents a total capacitance of C1 through C6).

$$QSAMPP = -32C(VINP - (VINP + VINN)/2);$$

$$QSAMPP = -32C(VINP - VINN)/2; \quad \text{Formula (17)}$$

An electric charge QSAMPN accumulated in the top plate (TOP−) of the (−) side capacitance DAC constructed of C7 through C12 is expressed by the formula (18).

$$QSAMPN = -32C(-VINP + VINN)/2; \quad \text{Formula (18)}$$

Namely, the electric potentials of the top plate TOP+, TOP− at the sampling time are set to the input common electric potential (VINP+VINN)/2, whereby absolute values of the electric charges subjected to the sampling by the (+) side capacitance DAC and the (−) side capacitance DAC are equal, but their polarities are reversed.

After the end of the sampling, S1 is set open (open-circuit). Further, S2P and S2N are also set open (open-circuit). The top plates TOP+, TOP− get floating by setting S1 open first, so that the electric potential of the top plate of C1 through C12 is retained.

Figure 3:
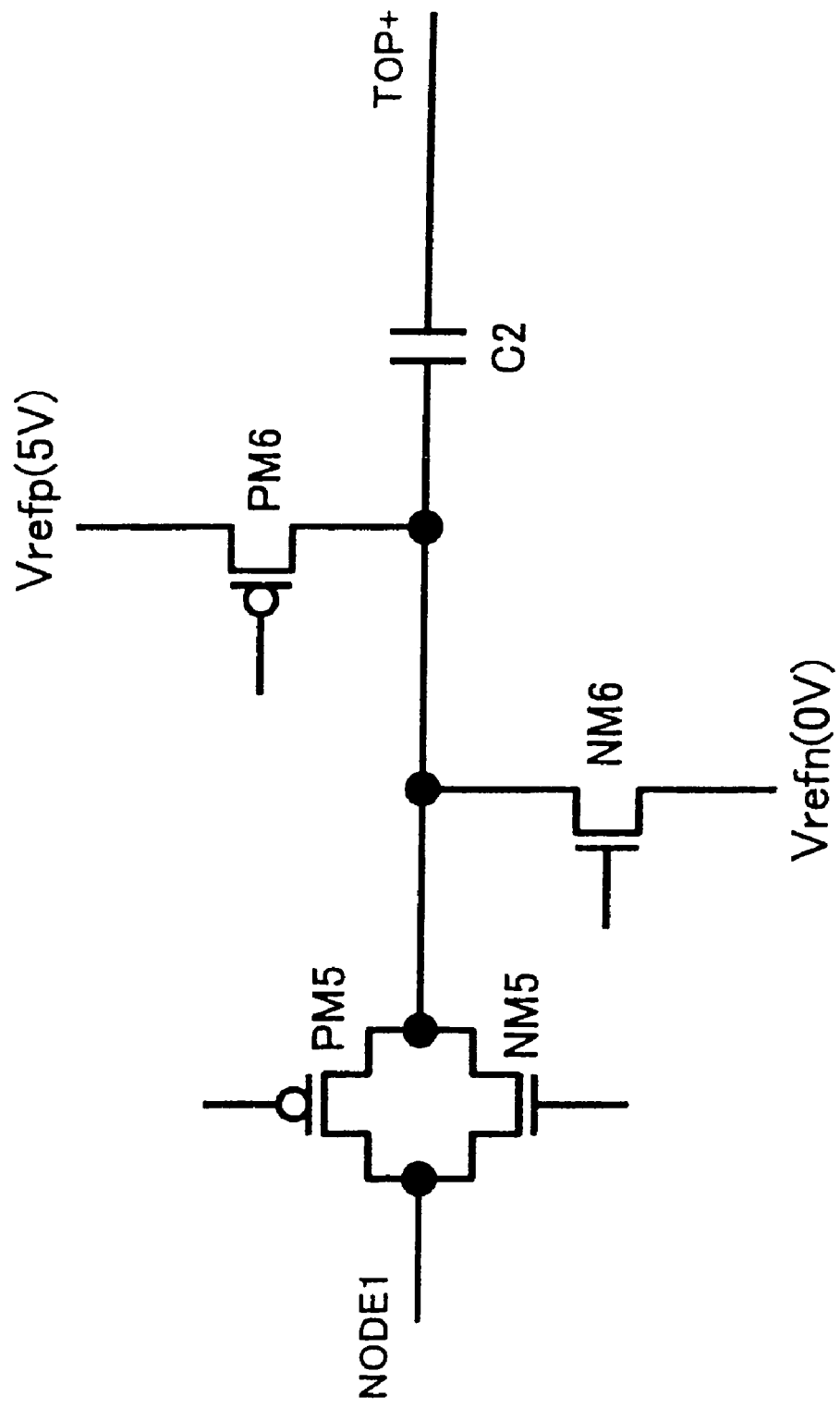
FIG. 3 is a diagram exemplifying a configuration of a switch.

For better convenience of an explanation that will be made later on, herein FIG. 3 illustrates an example of a transistor level circuit of the switches SW2 through SW5, SW8 through SW11 and SW19 through SW22 in a way that exemplifies SW2.

PM5, PM6 in FIG. 3 represent PMOS transistors, NM5 and NM6 designate NMOS transistors, C2 denotes a capacitance, NODE1 and TOP+ stand for node names, Vrefp indicates a (+) side reference electric potential (e.g., 5V), and Vrefn represents a (−) side reference electric potential (e.g., 0V). In FIG. 3 the nodes etc corresponding to those in FIG. 1 are illustrated in a way that gives the same names as those in FIG. 1. As shown in FIG. 3, for example, a function of SW2 in FIG. 1 can be actualized by connecting the transistors.

To get back to the explanation in FIG. 1, after setting S1 open (open-circuit), the electric potential of the bottom plate of the capacitances C1 through C12 is set to Vrefp or Vrefn by operating SW2 through SW5, SW8 through SW11 and SW19 through SW22. At this time, when the switch (e.g., SW2) is constructed of the circuit as shown in FIG. 3, before the electric potential of the bottom plate of C2 is set to Vrefp or Vrefn, the transistors PM5, NM5 are switched OFF, and thereafter the electric potential of the bottom plate of C2 is set to Vrefp or Vrefn.

When operating SW2 through SW5, SW8 through SW11 and SW19 through SW22 at such a switch timing, before and after S2P is and has been switched OFF, SW2 through SW5, SW19 and SW21 also become floating as viewed from NODE1. Therefore, as discussed in the description in FIG. 21, if the electric potential of VIPN is an electric potential approximate to a positive power source voltage, there is a possibility that the electric potential of NODE1 rises over the S2P positive power source voltage due to a gate capacitance of the PMOS transistor constituting S2P along with OFF of the switch S2P.

Similarly, before and after S2N is and has been switched OFF, SW8 through SW11, SW20 and SW22 also become floating as viewed from NODE2. Hence, in a case where the electric potential of VINN is approximate to a negative power source voltage, there is a possibility that an electric potential of NODE2 decreases under the negative power source voltage due to the gate capacitance of the NMOS transistor configuring S2N along with OFF of the switch S2N.

For preventing this, after S2P, S2N have been switched OFF, a switch S4 (corresponding to an electric potential control circuit and a second switch according to the invention) that equalizes the electric potentials of NODE1 and NODE2, is switched ON (see FIG. 2). With this operation, the electric potentials of NODE1 and NODE2 are equalized into an intermediate electric potential. Therefore, even when any one of NODE1, NODE2 just before switching OFF S2P, S2N has the electric potential approximate to the positive power source voltage or the negative power source voltage, the electric potentials of NODE1, NODE2 can be set not to exceed the power source voltage range when switching OFF S2P or S2N on condition that a potential difference between NODE1 and NODE2 is large to some extend.

Supposing that the electric potentials of NODE1, NODE2 exceed the power source voltage range, even when switching OFF the switches S3P and S3N, potential differences occur between the gates and the sources (in a forward direction, i.e., in a direction that facilitates a flow of the electric current) of the MOS transistors constituting these switches, and hence such a problem arises that a slight current flows to TOP+ from NODE1 or to NODE2 from TOP− via S3P, S3N, the electric charges accumulated in the top plates TOP+, TOP− are caused to change. (This is as discussed in the description of the problem of the circuit in FIG. 21.) Such being the case, as in the circuit in FIG. 1, S4 is provided, after the end of the sampling, the electric potentials of NODE1, NODE2 are prevented by S4 from exceeding the power source voltage range, whereby the electric potentials of the internal nodes NODE1, NODE2 can be prevented from exceeding the power source voltage range even when sampling the analog input signals in the power source voltage range. Therefore, it is possible to prevent the loss of the electric charges subjected to the sampling, resulting in acquirement of the proper conversion result.

When finishing the sampling, the switch S1 is switched OFF, the switches S2P, S2N are switched OFF, the switches SW2 through SW5, SW8 through SW11 and SW19 through SW22 are set floating (S3P, S3N are kept OFF since the start of the sampling), and S4 is switched ON. Further, SW13, SW14 are switched OFF, while SW15, SW16 are switched ON. Preparations for the sequential comparison by the comparator are thereby made.

SW13, SW14 function as switches for giving a bias VCM to inputs CINP, CINN of the comparator COMP1 during the sampling. For instance, if the bias VCM is equalized to a final common electric potential ((Vrefp+Vrefn)/2) for the comparison by the comparator, during the sampling, an offset voltage of the comparator COMP1 is stored in, e.g., the capacitance, and an offset affection can be reduced by auto-zero (a procedure for eliminating the cancellation).

Further, SW15, SW16 function as switches for separating TOP+, TOP− from the comparator input terminals (CINP, CINN) in order to set the electric potentials of TOP+, TOP− to the analog input common electric potential. After the sampling, the electric potential of the bottom plate of the capacitances C1 through C12 is set to Vrefp or Vrefn by operating SW2 through SW5, SW8 through SW11 and SW19 through SW22, thereby judging a relationship in magnitude between a voltage into which the reference voltage is divided and an electric potential difference subjected to the sampling (by use of COUT1) and searching for a digital value corresponding to the analog input electric potential difference.

The assumption in the embodiment is that VINP−VINN>=0, and therefore SW21 is connected to Vrefp, and SW22 is connected to Vrefn. The switches SW2 through SW5 of the (+) side capacitance DAC are connected to Vrefp when the corresponding digital code is 1 and connected to Vrefn when the corresponding digital code is 0. The switch SW19 for generating a 1-bit added value in order to generate a 2' compliment is connected to Vrefn (corresponding to the digital code "0"). This is because there is no necessity of generating the 2' compliment data.

The switches SW8 through SW11 of the (−) side capacitance DAC are connected to Vrefn when the corresponding digital code is 1 and connected to Vrefp when the corresponding digital code is 0. The assumption in the embodiment is that VINP−VINN>=0, and hence SW20 is connected to Vrefp (corresponding to the digital code "0"). This is because of generating the 2' compliment data at all times.

It is required that SW1 corresponding to SW19 be connected to Vrefp in FIG. 19 when VINP<VINN. This is because of aiming at obtaining the digital value expressed by the 2' compliment as a result of the conversion when VINP<VINN. On the other hand, the assumption in the circuit according to the invention in FIG. 1 is only that VINP>VINN, and therefore a positive number is always assumed as the (+) side electric potential. Accordingly, SW19 may merely be connected to Vrefn. Similarly, a negative number is always assumed as the (−) side electric potential, and SW20 may merely be connected to Vrefp.

<Searching Procedure>

In the conventional circuit in FIG. 19, the relationship in magnitude between VINP and VINN is judged by connecting SW6 to Vrefp, SW1 through SW5 to Vrefn, SW12 to Vrefn and SW7 through SW11 to Vrefp, thereby determining the sign bit. In the actual application, however, there is a case where the relationship in magnitude between VINP and VINN can be previously presumed. In the case that the sign bit can be presumed, the comparison cycle for determining the sign bit can be said to be redundant.

This being the case, the AD conversion circuit in the embodiment provides a search method and a circuit for determining the digital value on the premise that VINP is larger than VINN (the sign bit is assumed). The premise is that VINP>VINN, and hence it is possible to attain a faster conversion by such a degree as to eliminate the necessity for determining the sign bit (a circuit in the case of not satisfying VINP>VINN will be described in a seventh embodiment).

In the circuit in the embodiment, SW21 in FIG. 1 corresponds to SW6 in FIG. 19 in the conventional circuit, and SW22 in FIG. 1 corresponds to SW12 in FIG. 19.

Because of the premise that VINP>VINN, the comparison by the comparator starts with comparing with, e.g., the reference voltage/2 on the assumption that VINP>VINN, wherein if (VINP−VINN) is larger than the reference voltage/2, (VINP−VINN) is compared with the reference voltage×¾. If (VINP−VINN) is smaller than the reference voltage/2, (VINP−VINN) is compared with the reference voltage×¼. Further, supposing that (VINP−VINN) is larger than the reference voltage×¼, (VINP−VINN) is compared with the reference voltage×⅜. Alternatively, if (VINP−VINN) is smaller than the reference voltage×¼, (VINP−VINN) is compared with the reference voltage×⅛. Namely, the relationship in magnitude between the electric potential difference of (VINP−VINN) and the electric potential into which the reference voltage (Vrefp−Vrefn) is divided, is judged, and the range of the value of the electric potential difference of (VINP−VINN) that is subjected to the sampling is sequentially narrowed down, thus determining the final digital value.

<Determination of MSB (Most Significant Bit)>

The switch SW21 is connected to Vrefp, SW2 through SW4 and SW19 are connected to Vrefn, and SW5 is connected to Vrefp. The bottom plate electric potential of a total capacitance 8C of C1 through C4 becomes Vrefn, and the bottom plate electric potential of a total capacitance 24C of C5, C6 becomes Vrefp. The electric charges QSAMPP accumulated in the (+) side top plate (TOP+) in the formula (17) are retained, and hence an electric potential Vtp of the (+) side top plate (TOP+) at this time is given by the formulae (19) and (20).

$$-24C(Vrefp-Vtp)+8C(Vtp-Vrefn)=-32C(VINP-VINN)/2; \qquad \text{Formula (19)}$$

$$Vtp=-(VINP-VINN)/2+(Vrefp+Vrefn)/2+(Vrefp-Vrefn)/(2\times2); \qquad \text{Formula (20)}$$

The switch SW22 is connected to Vrefn, SW8 through SW10 and SW20 are connected to Vrefp, and SW11 is connected to Vrefn. The bottom plate electric potential of a total capacitance 8C of C7 through C10 becomes Vrefp, and the bottom plate electric potential of a total capacitance 24C of C11, C12 becomes Vrefn. The electric charges QSAMPP accumulated in the (−) side top plate (TOP−) in the formula (18) are retained, and therefore an electric potential Vtn of the (−) side top plate (TOP−) at this time is given by the formulae (21) and (22).

$$-8C(Vrefp-Vtp)+24C(Vtp-Vrefn)=32C(VINP-VINN)/2; \qquad \text{Formula (21)}$$

$$Vtn=(VINP-VINN)/2+(Vrefp+Vrefn)/2-(Vrefp-Vrefn)/(2\times2); \qquad \text{Formula (22)}$$

The top plate electric potential becomes differential inputs CINP, CINN of the comparator. Considering a differential potential "Vtp−Vtn", the formula (23) is obtained.

$$Vtp-Vtn=-(VINP-VINN)+(Vrefp-Vrefn)/2; \quad \text{Formula (23)}$$

Namely, the comparator COMP1 can judge a relationship in magnitude between an input potential difference "VINP−VINN" and a value obtained by multiplying the reference electric potential (Vrefp−Vrefn) by ½.

<Determination of Subsequent Bits Next to MSB>

Since this enables determination of a digital code corresponding to SW5, SW11, an explanation of how a code (the second highest bit; the second most significant bit) corresponding to SW4, SW10 is determined will be given.

It is assumed that the digital code corresponding to SW5, SW11 is determined to be 1, and (VINP−VINN) is larger than (Vrefp−Vrefn)/2. In this case, (VINP−VINN) is compared with (Vrefp−Vrefn)×¾, and a relationship in magnitude therebetween is examined, thus narrowing down a value range of (VINP−VINN).

To be specific, the switch SW21 is connected to Vrefp, SW19, SW2 and SW3 are connected to Vrefn, and SW4, SW5 are connected to Vrefp. The bottom plate electric potential of a total capacitance 4C of C1 through C3 becomes Vrefn, and the bottom plate electric potential of a total capacitance 28C of C4, C5, C6 becomes Vrefp. An electric potential Vtp of the (+) side top plate (TOP+) at this time is given by the formulae (24) and (25).

$$-28C(Vrefp-Vtp)+4C(Vtp-Vrefn)=-32C(VINP-VINN)/2; \quad \text{Formula (24)}$$

$$Vtp=-(VINP-VINN)/2+(Vrefp+Vrefn)/2+3\times(Vrefp-Vrefn)/(2\times 4); \quad \text{Formula (25)}$$

The switch SW22 is connected to Vrefn, SW20, SW8 and SW9 are connected to Vrefp, and SW10, SW11 are connected to Vrefn. The bottom plate electric potential of a total capacitance 4C of C7 through C9 becomes Vrefp, and the bottom plate electric potential of a total capacitance 28C of C10, C11, C12 becomes Vrefn. An electric potential Vtn of the (−) side top plate (TOP−) at this time is given by the formulae (26) and (27).

$$-4C(Vrefp-Vtp)+28C(Vtp-Vrefn)=32C(VINP-VINN)/2; \quad \text{Formula (26)}$$

$$Vtn=(VINP-VINN)/2+(Vrefp+Vrefn)/2-3\times(Vrefp-Vrefn)/(2\times 4); \quad \text{Formula (27)}$$

The top plate electric potentials become differential inputs CINP, CINN of the comparator. Considering a differential potential "Vtp=Vtn", the formula (28) is obtained.

$$Vtp-Vtn=-(VINP-VINN)+3\times(Vrefp-Vrefn)/4; \quad \text{Formula (28)}$$

Namely, the comparator COMP1 can judge a relationship in magnitude between an input potential difference "VINP−VINN" and a value obtained by multiplying the reference electric potential (Vrefp−Vrefn) by ¾. Thus, the electric potential of the bottom plate of the capacitances C1 through C12 is set to Vrefp or Vrefn by operating SW2 through SW5, SW8 through SW11 and SW19 through SW22, thereby making it possible to judge a relationship in magnitude between the potential difference "VINP−VINN" and the electric potential into which "Vrefp−Vrefn" is divided. This enables the determination of the final digital value by sequentially narrowing down the value range of the potential difference "VINP−VINN" subjected to the sampling.

<Effects>

As discussed above, the electric potentials of the top plates TOP+, TOP− at the sampling time are set to the input common electric potential of (VINP+VINN)/2, whereby the absolute values of the electric charges subjected to the sampling by the (+) side capacitance DAC and the (−) side capacitance DAC are equal, but their polarities are reversed. Therefore, the capacitance DAC outputs thereof can be symmetrically operated by symmetrically operating the switches of the (+) side capacitance DAC and the (−) side capacitance DAC. Moreover, the common electric potential of the electric potential Vtp of the (+) side top plate (TOP+) and the electric potential Vtn of the (−) side top plate (TOP−) is given by (Vrefp+Vrefn)/2, which can be set as a central electric potential of the reference potential (refer to the formula (20)+the formula (22), the formula (25)+the formula (27)), and consequently the operational allowance can be maximized.

As explained above, it is feasible to actualize the operation of converting the differential analog input signal into the digital value on the assumption of the sign bit (on the premise of the relationship such as VINP>VINN) by the circuit configuration in FIG. 1.

Further, SW4 is provided and is switched ON after the end of the sampling, thereby preventing the electric potentials of NODE1, NODE2 from exceeding the power source voltage range. It is therefore possible to prevent the loss of the electric charges of the top plates TOP+, TOP− via the S3P, S3N and to acquire the proper conversion result even in the case of converting the analog input signal having an amplitude as large as reaching the power source voltage range.

Moreover, the analog input potential difference is converted into the digital value on the assumption of the sign bit (on the premise of the relationship such as VINP>VINN), whereby the comparison cycle for judging the code can be omitted and the conversion time can be speeded up to a degree corresponding to this omission.

FIG. 1 shows the example, wherein the charge redistribution (or SAR) type AD converter is constructed of the 4-bit capacitance DAC by way of one example, and the idea of the invention is applied to the charge redistribution (or SAR) type AD converter, however, as a matter of course, there is no problem if a bit count of DAC may be set to a general case (which is equal to or smaller than 3 bits or equal to or larger than 5 bits).

SECOND EMBODIMENT

The AD converter according to a second embodiment of the invention will be described with reference to FIG. 4. In the first embodiment, after switching OFF the switch S2P for connecting the (+) side analog input to NODE1 and the switch S2N for connecting the (−) side analog input VINN to NODE2, the fluctuations of the electric potentials of NODE1 and NODE2 are restrained by switching ON the switch S4 that equalizes the electric potentials of NODE1 and NODE2.

The second embodiment will exemplify an electric potential fluctuation restraining means that restrains the fluctuation of the electric potentials of NODE1 and NODE2 in addition to the operation of this switch S4. Alternatively, the electric potential fluctuation restraining means in the second embodiment will be exemplified as a substitute for the operation of the switch S4. In the second embodiment also, when finishing the sampling, the switches S2P, S2N for supplying the analog input signals VINP, VINN to the bottom plates are switched OFF. In the second embodiment, there are provided coupling capacitances NM7, PM7, NM8, PM8 for supplying NODE1, NODE2 with electric charges reversed to the electric charges injected from the gate capacitances of the switches S2P, S2N so that the electric potentials of the internal nodes NODE1, NODE2 do not exceed the power source voltage range at that time.

Other configurations and operations in the second embodiment are the same as those in the case of the first embodiment. Namely, in FIG. 4 also, there are provided the switch (S3P in FIG. 1) that equalizes the electric potentials of the top plate TOP+ and the bottom plate (terminals connecting to switches of C1 through C6) of the (+) side capacitance DAC of the differential capacitance DAC and discharges a sampling capacitance of the (+) side capacitance DAC, and a switch (S3N in FIG. 1) that equalizes the electric potentials of the top plate TOP– and the bottom plate (terminals connecting to switches of C7 through C12) of the (–) side capacitance DAC, and discharges a sampling capacitance of the (–) side capacitance DAC. Provided are switches S2P, S2N for separating the (+) side analog input signal VINP, the (–) side analog input signal VINN and the bottom plates of the capacitance DAC when the switches S3P, S3N for discharging the sampling capacitances are kept ON. Provided further is the switch S1 for equalizing the electric potential of the (+) side top plate TOP+ with the electric potential of the (–) side top plate TOP– at the time of the sampling of the analog input signal.

Then, in the second embodiment, there are provided the coupling capacitances NM7, PM7, NM8, PM8 (FIG. 4) for supplying NODE1, NODE2 with electric charges reversed to the electric charges injected from the gate capacitances of the switches S2P, S2N, and the electric charges injected from the switches S2P, S2N are cancelled by signals (NG7, PG7, NG8, PG8) having reverse phases to those of the control signals of the switches S2P, S2N by driving the capacitances NM7, PM7, NM8, PM8, and the electric potentials of the internal nodes NODE1, NODE2 can be controlled so as not to exceed the power source voltage range. With this configuration, the electric current can be prevented from flowing to the top plates TOP+, TOP– through the switches S3P, S3N, and, because of having no loss of the electric charges of the top plates TOP+, TOP–, the proper conversion result is acquired.

<Configuration>

Figure 4:
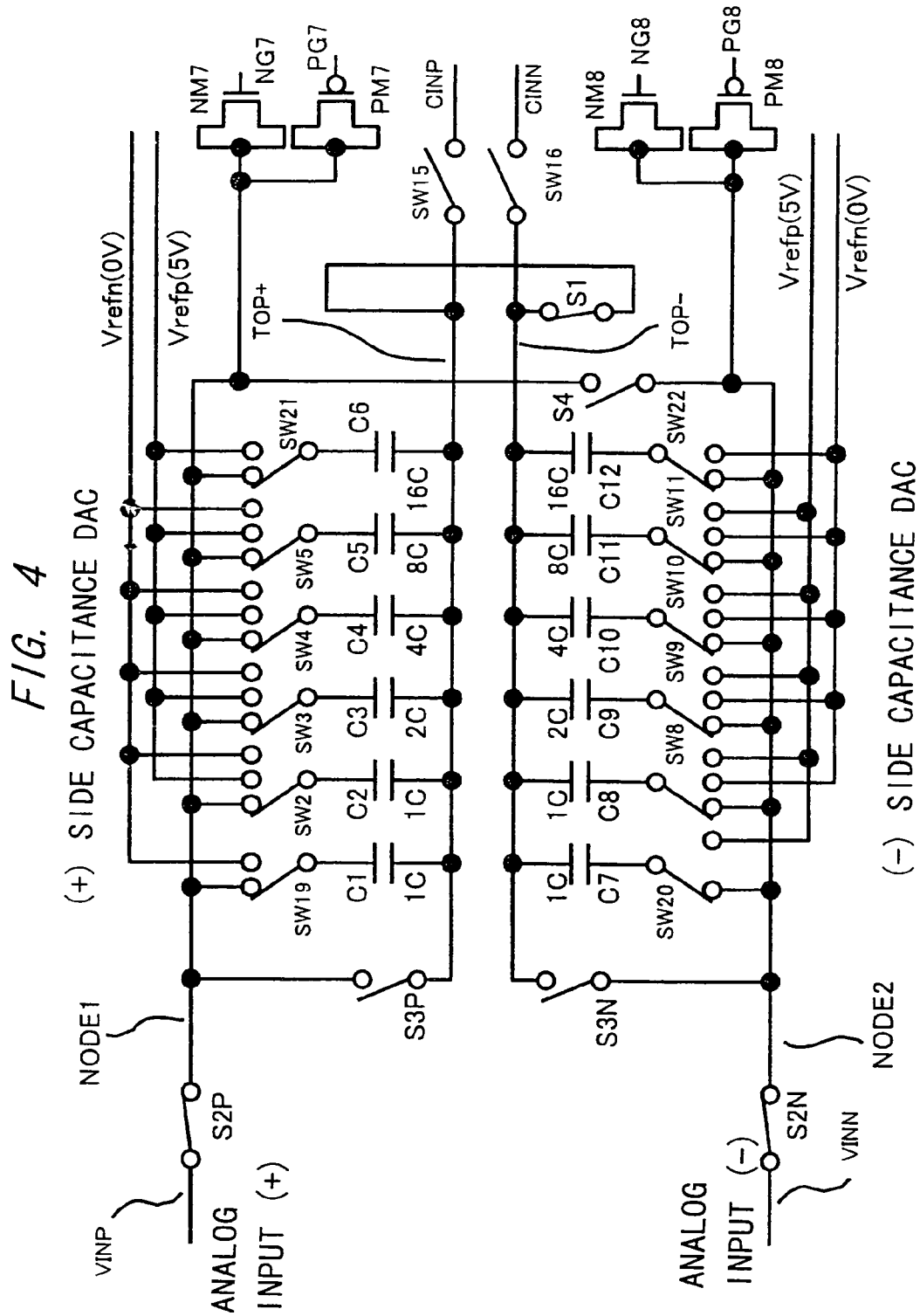
FIG. 4 is a circuit diagram showing an AD converter according to a second embodiment of the invention.

In FIG. 4, SW2 through SW5, SW8 through SW11, SW15 SW16, SW19 through SW22, S1, S2P, S2N, S3P, S3N and S4 represent switches, C1 through C12 designate capacitances, VINP indicates a (+) analog input, VINN denotes a (–) analog input, TOP+ designates a (+) side top plate of a capacitance array, TOP– represents a (–) side top plate of the capacitance array, Vrefp is a (+) side reference electric potential (e.g., 5V), Vrefn is a (–) side reference electric potential (e.g., 0V), CINP and CINN are comparator inputs, NODE1 and NODE2 represent internal nodes, a (+) side capacitance DAC represents DAC constructed of a capacitance array of C1 through C6, and a (–) side capacitance DAC designates DAC constructed of a capacitance array of C7 through C12, NM7, NM8 represent NMOS transistors, PM7, PM8 denote PMOS transistors, and NG7, PG7, NG8, PG8 indicate gate signals for controlling NM7, PM7, NM8, PM8. In FIG. 4 also, portions corresponding to the circuit elements and elements having the same functions as those in FIGS. 19, 20, are shown in a way that gives the same element names etc.

A value of bC (b is an integer) written together with the capacitance Ca (a is an integer) represents a relative relationship in magnitude between the respective capacitances and is weighted as shown in 1C, 2C, 4C, 8C, 16C (etc). The capacitances C1 through C12 in FIG. 4 form 4-bit DAC.

A state of the switches shown in FIG. 4 represents a sampling state of the capacitance DAC. When sampling, C1 trough C6 are charged with the electric potential of VINP, and C7 trough C12 are charged with the electric potential of VINN.

The main portions of the circuit in FIG. 4 are the same as those of the circuit in FIG. 1, and a different point of the circuit in FIG. 4 from the circuit in FIG. 1 lies in an addition of the NMOS transistors NM7, NM8 and the PMOS transistors PM7, PM8. This being the case, the discussion in the second embodiment will focus on functions of the NMOS transistors NM7, NM8 and the PMOS transistors PM7, PM8. The portions that are not particularly explained shall function in the same way as the circuit in FIG. 1 functions.

The transistors NM7, PM7, NM8, PM8 function as capacitances for controlling the electric potentials of NODE1, NODE2 so as not to exceed the power source voltage range when switching OFF the switches S2P, S2N after the end of the sampling. The circuit example in FIG. 4 shows the example of the circuit that uses NM7, PM7, NM8, PM8 and the switch S4 in combination, however, only the transistors NM7, PM7, NM8 and PM8 may also be applied. Furthermore, as discussed in the first embodiment, the switch S4 may also be employed solely.

At the point of time when finishing the sampling, the switch S1 is set open (open-circuit), and the switches SW2 through SW5, SW19 and SW21 are set floating as viewed from NODE1. Moreover, the switches SW8 through SW11, SW20 and SW22 are also set floating as viewed from NODE2. Further, the switches S2P, S2N are switched OFF.

As discussed in the description in FIG. 1, if the electric potential of the (+) side analog input VINP is approximate to the positive power source voltage, there is a possibility that the electric potential of NODE1 rises over the positive power source voltage due to the gate capacitance of the PMOS transistor constituting the switch S2P. This is because If VINP and NODE1 are approximate to the positive power source voltage (5V) and the switch S2P closes (becomes conductive, and the gate comes to the negative power source voltage of 0V), an inversion layer is formed just under the gate of the PMOS transistor, and a capacitance composed of a gate oxide film is interposed between the gate and the drain (and the source).

Moreover, if the electric potential of the (–) side analog input VINN is approximate to the negative power source voltage, there is a possibility that the electric potential of NODE2 decreases under the negative power source voltage due to the gate capacitance of the NMOS transistor constituting the switch S2N. This is because If VINN and NODE2 are approximate to the negative power source voltage (0V) and the switch S2N closes (becomes conductive, and the gate comes to the positive power source voltage of 5V), an inversion layer is formed just under the gate of the NMOS transistor, and a capacitance composed of a gate oxide film is interposed between the gate and the drain (and the source).

For preventing these possibilities, in the circuit in FIG. 1, after switching OFF S2P and S2N, the switch S4 for equalizing the electric potentials of NODE1, NODE2 is switched ON. The circuit in FIG. 4 is provided with, in addition to the switch S4, the NMOS transistors NM7, NM8 and the PMOS transistors PM7, PM8. Then, on the occasion of switching OFF the switches S2P, S2N, a gate potential NG7 of NM7 is changed from L to H (ON). Further, a gate potential PG7 of PM7 is changed from H to L (ON). Similarly, a gate potential NG8 of NM8 is changed from L to H (ON). Further, a gate potential PG8 of PM8 is changed from H to L (ON).

The transistors PM7, NM7 correspond to first adjusting MOS transistors according to the invention. Further, the transistors PM8, NM8 correspond to second adjusting MOS transistors according to the invention. Still further, the transistors PM7, PM8 correspond to third MOS transistors according to the invention. Yet further, the transistors NM7, NM8 correspond to fourth MOS transistors according to the invention.

If the gate capacitance of the PMOS transistor configuring the switch S2P is set approximately equal to the capacitance of PM7, when switching OFF the PMOS transistor configuring the switch S2P, the electric charges acting to increase the electric potential of NODE1 can be cancelled by changing PG7 from H to L. Similarly, If the gate capacitance of the NMOS transistor configuring the switch S2P is set approximately equal to the capacitance of NM7, when switching OFF the NMOS transistor configuring the switch S2P, the electric charges injected from S2P can be cancelled by changing NG7 from L to H.

If the gate capacitance of the PMOS transistor configuring the switch S2N is set approximately equal to the capacitance of PM8, when switching OFF the PMOS transistor configuring the switch S2N, the electric charges acting to decrease the electric potential of NODE2 can be cancelled by changing PG8 from H to L. Similarly, If the gate capacitance of the NMOS transistor configuring the switch S2N is set approximately equal to the capacitance of NM8, when switching OFF the NMOS transistor configuring the switch S2N, the electric charges injected from S2N can be cancelled by changing NG8 from L to H.

Thus, the electric potentials of NODE1, NODE2 can be set also by NM7, PM7, NM8, PM8 in FIG. 4 so as not to exceed the power source voltage range. The explanation in FIG. 1 is made by way of one example in which S2P, S2N are simultaneously switched OFF, however, the electric charges of the top plates TOP+, TOP− are retained by switching OFF S1 and setting in the floating state the switches SW2 through SW5, SW19, SW21 and also the switches SW8 through SW11, SW20, SW22. Hence, the conversion can be done without switching OFF necessarily both of the switches S2P and S2N. Moreover, the timing when switching OFF S2P and S2N can be set as a slow timing according to the necessity on condition that the timing is after the point of time when finishing the sampling. Further, it is not indispensable that the switches S2P, S2N are switched OFF at the same timing.

If the switches S2P, S2N are switched OFF at different timings, the gate potential NG7 of NM7 is changed from L to H at the timing when switching OFF S2P. Further, at this time, the gate potential PG7 of PM7 is changed from H to L. The gate potential NG8 of NM8 is changed from L to H at the timing when switching OFF S2N. At this time, the gate potential PG8 of PM8 is changed from H to L.

Even when any one of the electric potentials (i.e., the analog input signals VINP, VINN) of NODE1, NODE2 just before switching OFF S2P, S2N gets approximate to the positive power source voltage or the negative power source voltage by switching ON S4 in FIG. 1, if the potential difference between NODE1, NODE2 is large to some extent, the electric potentials of NODE1, NODE2 can be set so as not to exceed the power source voltage range. If, for example, both of the electric potentials of VINP, VINN are approximate to the negative power source voltage and if the potential difference therebetween is small, however, the effect of S4 is small. As in the circuit in FIG. 6, even if both of VINP, VINN are, e.g., 0V, the electric potentials of NODE1, NODE2 can be controlled within the power source voltage range by use of the capacitances NM7, PM7, NM8, PM8 that cancel the electric charges injected from S2P, S2N. It is needless to say that the design is facilitated by employing NM7, PM7, NM8, PM8 and S4 in combination.

Similarly, If, for instance, both of VINP and VINN are approximate to the positive power source voltage and if the potential difference therebetween is small, the electric potentials of NODE1, NODE2 can be controlled within the power source voltage range by use of the capacitances NM7, PM7, NM8, PM8 that cancel the electric charges injected from S2P, S2N.

As explained above, the circuit configuration in FIG. 4, in the same way as by the circuit in FIG. 1, restrains the electric potentials of NODE1, NODE2 from exceeding the power source voltage range by use of S4, NM7, PM7, NM8, PM8. It is therefore possible to prevent the loss of the electric charges of the top plates TOP+, TOP− through S3P, S3N, and the accurate conversion result is acquired also in the case of converting the analog input signals within the power source voltage range.

The circuit is the same as the circuit in FIG. 1 except NM7, PM7, NM8, PM8, whereby, in the same way as by the circuit in FIG. 1, the operation of converting the differential analog input signal into the digital value on the assumption of the sign bit (on the premise that VINP>VINN) can be actualized, the comparison cycle for judging the code can be omitted, and the conversion time can be speeded up to a degree corresponding to this omission.

THIRD EMBODIMENT

Figure 5:
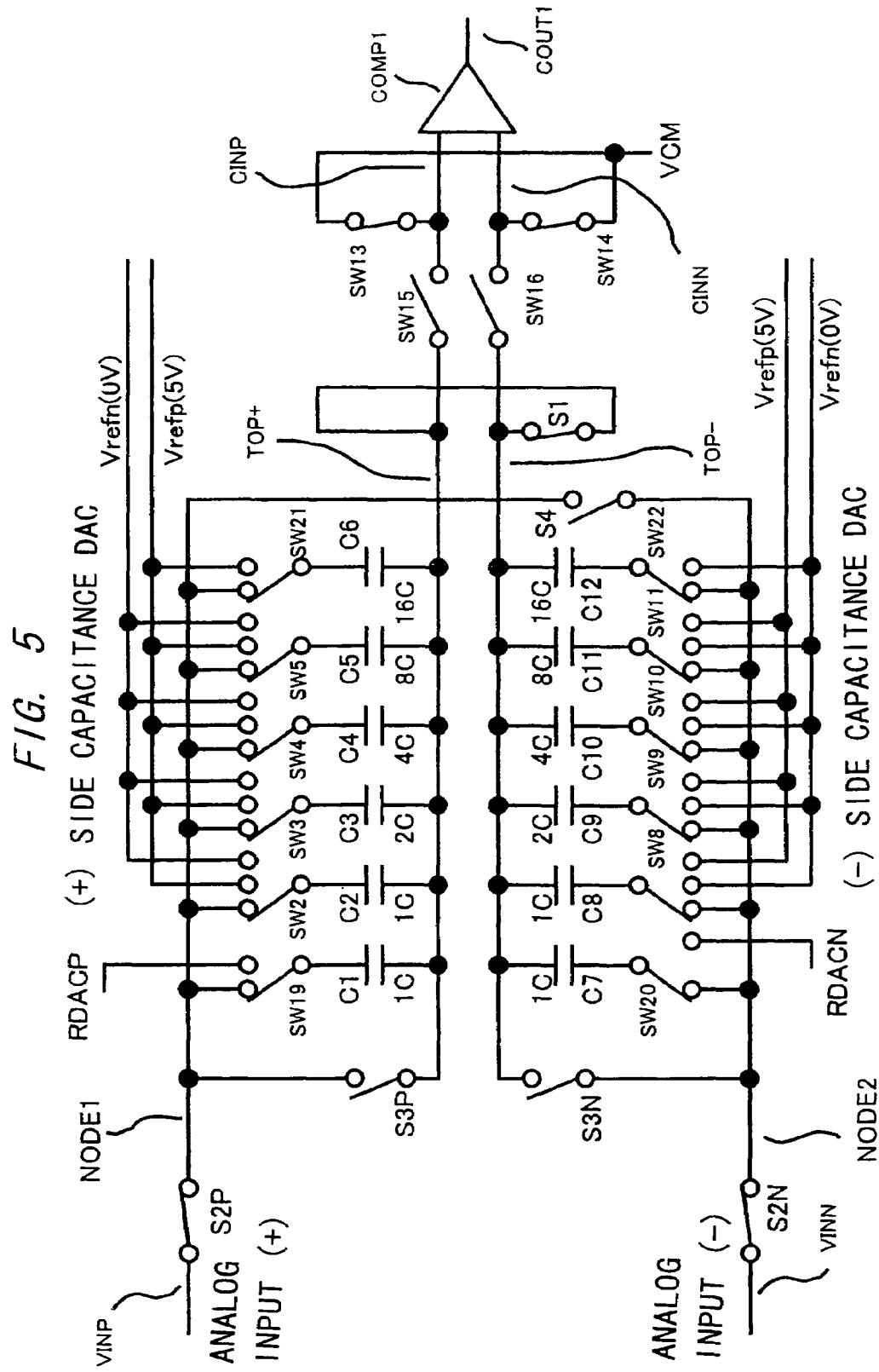
FIG. 5 is a circuit diagram showing an AD converter according to a third embodiment of the invention.
Figure 6:
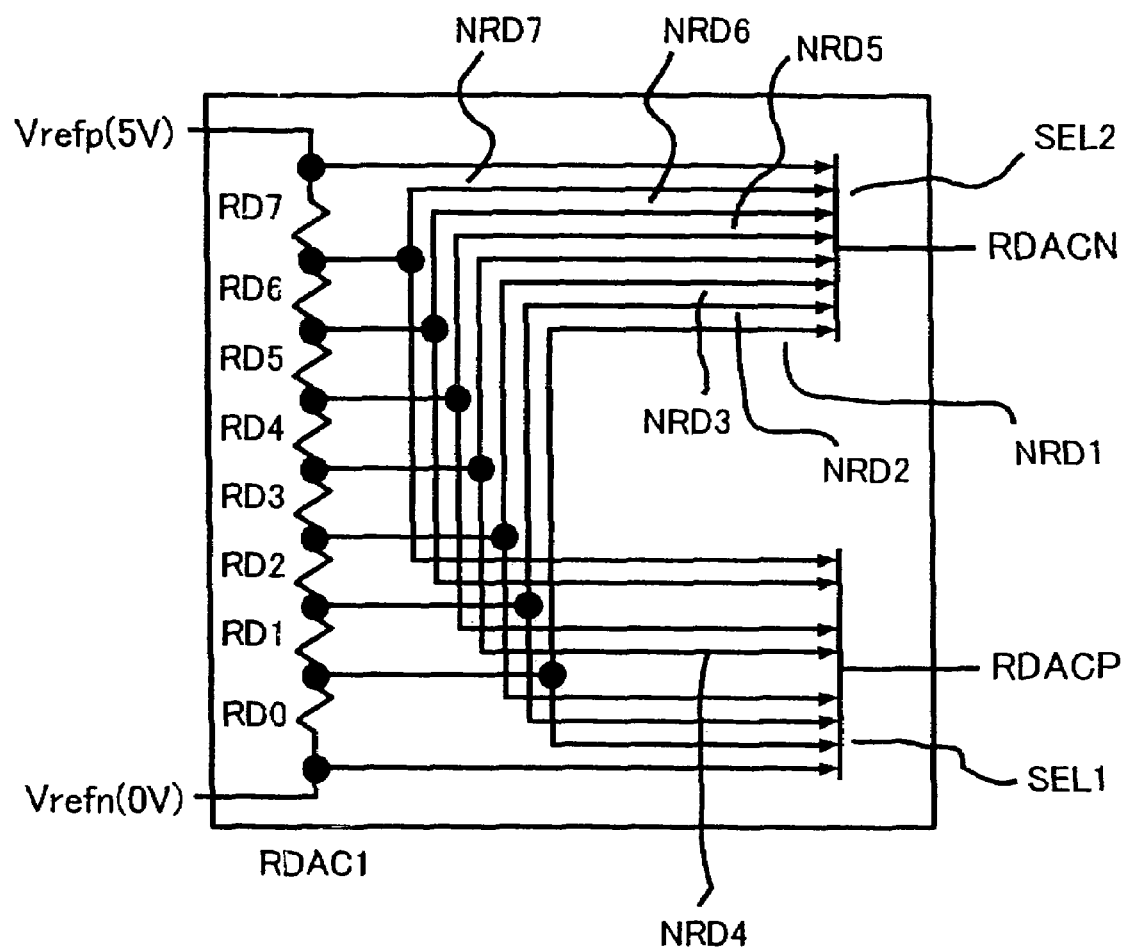
FIG. 6 is a diagram showing a configuration of resistance DAC included in the AD converter.

FIGS. 5 and 6 are circuit diagrams each showing an AD converter according to a third embodiment of the invention. In FIG. 5, SW2 through SW5, SW8 through SW11, SW13 through SW16, SW19 through SW22, S1, S2P, S2N, S3P, S3N and S4 represent switches, C1 through C12 designate capacitances, VINP indicates a (+) analog input, VINN denotes a (−) analog input, TOP+ designates a (+) side top plate of a capacitance array, TOP− represents a (−) side top plate of the capacitance array, Vrefp is a (+) side reference electric potential (e.g., 5V), Vrefn is a (−) side reference electric potential (e.g., 0V), COMP1 stands for a comparator, CINP and CINN are comparator inputs, COUT1 is an output of the comparator, VCM is a bias potential of the comparator input when sampling, NODE1 and NODE2 represent internal nodes, a (+) side capacitance DAC represents DAC constructed of a capacitance array of C1 through C6, and a (−) side capacitance DAC designates DAC constructed of a capacitance array of C7 through C12. Further, RDACP, RDACN in FIG. 6 represent resistance DAC outputs, RDAC1 denotes resistance DAC, RD0 through RD7 indicate resistances, NRD1 through NRD7 designate internal nodes of the resistance DAC, and SEL1, SEL2 represent selectors. In FIG. 5, the portions corresponding to the circuit elements in FIGS. 1, 4 and so on and the elements having the same functions as those thereof, are shown in a way that gives the same element names etc.

The resistance DAC connotes a circuit that generates analog data by extracting a voltage divided by the resistance corresponding to digital data.

A value of bC (b is an integer) written together with the capacitance Ca (a is an integer) represents a relative relationship in magnitude between the respective capacitances and is weighted as shown in 1C, 2C, 4C, 8C, 16C (etc). The capacitances C1 through C12 in FIG. 5 form 4-bit DAC. Further, in the circuit in FIG. 5, as in the circuit in FIG. 1, only the switch S4 is illustrated, however, the NMOS transistors NM7, NM8 and the PMOS transistors PM7, PM8 explained in the second embodiment (FIG. 4) are also usable. The omission of NM7, PM7, NM8, PM8 from FIG. 5 aims at simplifying the illustration. Accordingly, the portion using the switch S4 in the following drawings including FIG. 5 may involve using, as a substitute for S4, the NMOS transistors NM7, NM8 and the PMOS transistors PM7, PM8. Moreover, the switch S4 and the transistors NM7, PM7, NM8, PM8 may be employed in combination.

A different point of the circuits in the third embodiment (FIGS. 5 and 6) from the circuits in FIGS. 1 and 4 is that the AD converter circuit is constructed of only the (4-bit by way of the example) capacitance DAC in the circuits in FIGS. 1 and 4, and, by contrast, in the circuits in the third embodiment, there is constructed a circuit that performs the AD conversion by CR double stage DAC determining the high-order bit by the capacitance DAC and determining the low-order bit by the resistance DAC. As shown in FIGS. 5 and 6, the idea of the invention can be applied to the capacitance/resistance composite DAC.

The explanations of the portions performing the same operations in the circuit in FIGS. 5 and 6 as those in the circuit in FIG. 1 and the circuit in FIG. 4 are omitted, and the discussion will focus on portions having difference configurations. In the circuit in FIG. 1, in the case of searching for a digital code corresponding to the analog input, the bottom plate of C1 is fixed to Vrefn, the bottom plate of C6 is fixed to Vrefp, the bottom plate of C2 through C5 is connected to Vrefp when the corresponding digital value is 1 and connected to Vrefn when the corresponding digital value is 0 (the (−) side capacitance DAC is, symmetrically to the (+) side capacitance DAC, connected to Vrefn when the corresponding digital value is 1 and connected to Vrefp when the corresponding digital value is 0, the bottom plate of C7 is fixed to Vrefp symmetrically to C1, and the bottom plate of C12 is fixed to Vrefn symmetrically to C1).

As in the circuit in FIG. 1, when scheming to configure the AD converter circuit by only one stage capacitance DAC, for example, in the case of requiring, e.g., 10-bit resolution, such a problem arises that 2048 pieces of unit capacitances are needed for only one side, and an occupancy area increases. This occupancy area problem can be solved by constructing DAC as double stage DAC. FIG. 5 shows an example of combining double stage DAC with the idea of the invention.

As in FIG. 5, CR double stage DAC can be configured by connecting the resistance DAC output RDACP to the bottom plate of C1. Further, with respect to (−) side capacitance DAC, CR double stage DAC can be configured by connecting the resistance DAC output RDACN to the bottom plate of C7 of the (−) side capacitance DAC.

RDAC1 in FIG. 6 shows one example of the resistance DAC for converting the low-order 3 bits, wherein the reference voltage (a potential difference between Vrefp and Vrefn) is divided equally by 8 (in a way that gives codes of NRD1 through NRD7 sequentially from the lowest electric potential), using the unit resistances RD0 through RD7. The selector SEL1 selects any one of electric potentials within Vrefn and one electric potentials of the internal nodes NRD1 up to NRD7 of the resistance DAC, according to input digital value, and outputs the selected elements to RDACP (to configure in the plainest manner, when the input digital value is 000, Vrefn is outputted, and the values up to NRD7 are outputted as the digital value becomes large).

The selector SEL2 selects any one of electric potentials within Vrefp and electric potentials of the electric potentials of NRD7 down to NRD1, according to input digital value, and outputs the selected elements to RDACN (symmetrically to RDACP, when the input digital value is 000, Vrefp is outputted, and the values, gradually lower electric potentials, down to NRD1 are outputted as the digital value becomes large).

An affection exerted by the resistance DAC outputs RDACP, RDACN upon the top plate electric potential can be reduced to a degree corresponding to a bit count of the capacitance DAC by connecting the resistance DAC output RDACP to the bottom plate of C1 of the (+) side capacitance DAC and connecting the resistance DAC output RDACN to the bottom plate of C7 of the (−) side capacitance DAC, and, in the case of FIGS. 5 and 6, it is possible to operate as totally 7-bit DAC of the 4-bit capacitance DAC and the 3-bit resistance DAC. The effect is caused by adding, e.g., the resistance DAC output to the top plate potential TOP+ through the unit capacitance 1C having a magnitude that is $\frac{1}{32}$ the total sampling capacitance of the (+) side capacitance DAC.

By the way, as understood from the formulae (19) through (23) used for the explanation in FIG. 1, the inputted analog electric potential, when considering only the one-side DAC, is ½. Namely, paying attention to the one-side capacitance DAC, the formula is given for comparing the amplitude signal that is ½ the input potential difference of VINP−VINN with the amplitude signal that is ½ the reference potential difference of Vrefp−Vrefn. This becomes, when considering the output signal difference (the potential difference between the (+) side TOP+ and (−) side TOP−) between the capacitances DAC on both side, the formula for comparing a signal of the input potential difference of VINP−VINN with a signal of the reference potential difference of Vrefp−Vrefn.

Therefore, the resistance DAC output (RDACP, RDACN) that is attenuated down to a magnitude of $\frac{1}{32}$ is equivalent to being attenuated down to $\frac{1}{16}$ to each of TOP+, TOP−, and is decreased in its weight to a degree corresponding to the bit count of the 4-bit capacitance DAC. With this operation, it follows that DAC in FIG. 5 functions as totally 7-bit DAC.

As shown in FIGS. 5 and 6, the double stage DAC in which DAC is constructed the capacitance and the resistance has no necessity of changing the circuit portions constructed of the switches S2P, S2N, S1, S3P, S3N, S4 and the operations thereof that are shown in the circuit in FIG. 1, so that the same effects as those of the circuits FIGS. 1 and 4 are acquired in the circuit in FIG. 5.

As described above, the invention can be applied also to the case of using the CR double stage DAC. Namely, it is possible to directly apply the potential fluctuation restraining technology of NODE1, NODE2 on the basis of the combination of the switch S4 (or the NMOS transistors NM7, NM8 and the PMOS transistors PM7, PM8) and the switches S1, S2P, S2N, S3P, S3N. Hence, it is feasible to make compatible the advantage of the double stage DAC capable of restraining the occupancy area small, the characteristic of obtaining the proper conversion result even in the case of converting the analog input signal within the power source voltage range and the speed-up of the conversion time by omitting the comparison cycle for judging the sign bit.

FOURTH EMBODIMENT

Figure 7:
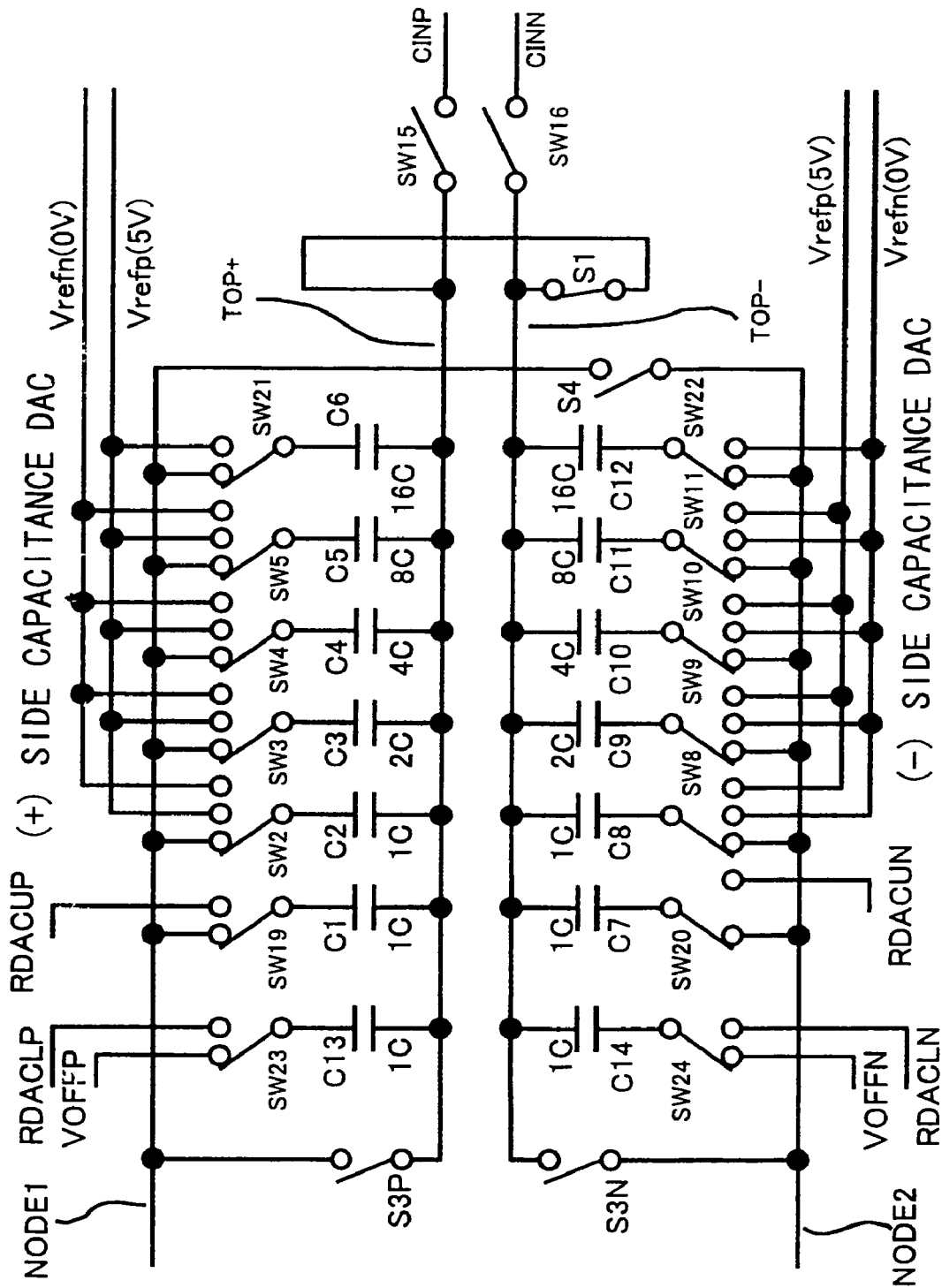
FIG. 7 is a circuit diagram showing an AD converter according to a fourth embodiment of the invention.
Figure 8:
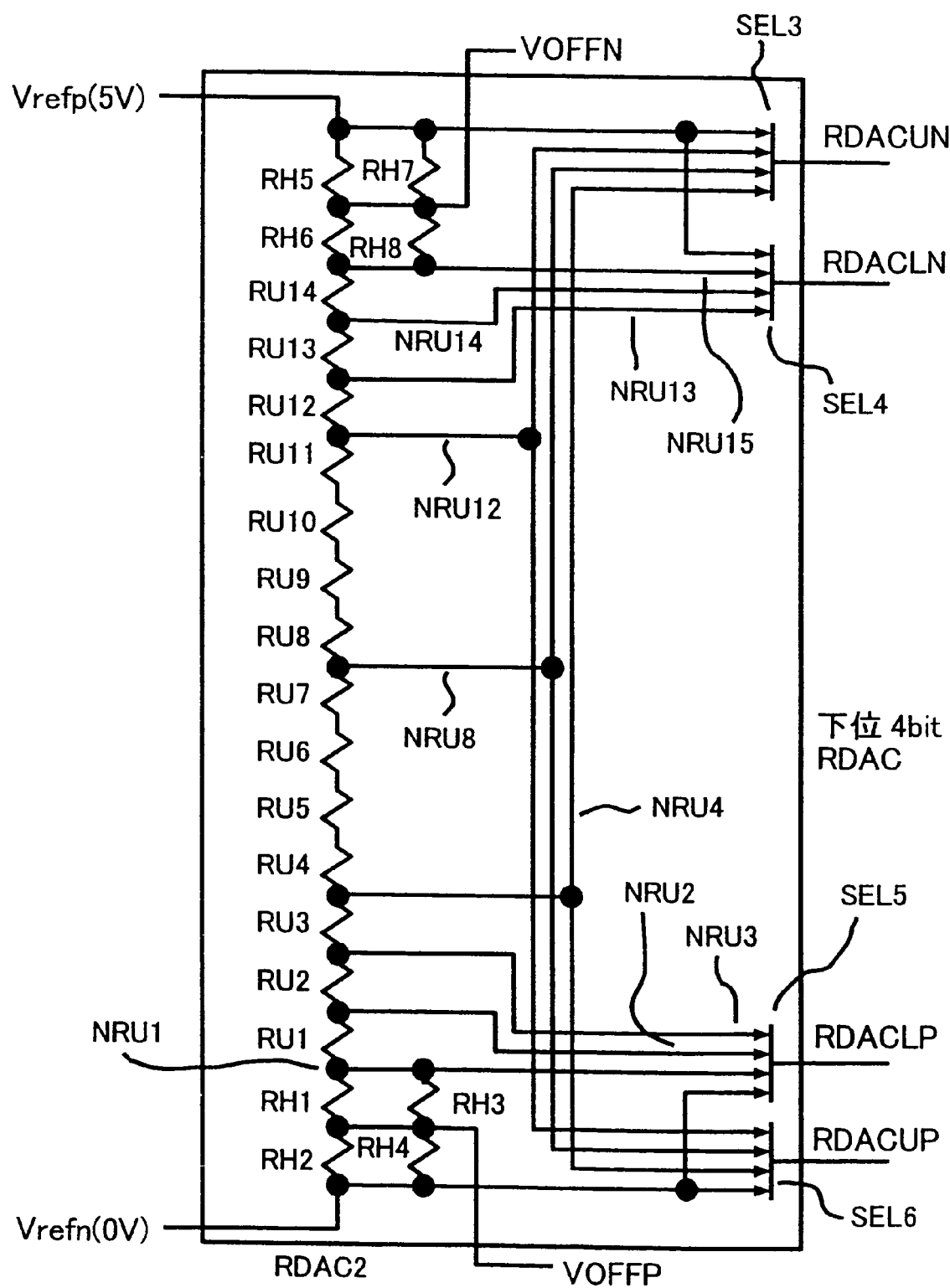
FIG. 8 is a diagram showing a configuration of the resistance DAC included in the AD converter.

FIGS. 7 and 8 are circuit diagrams each showing an AD converter according to a fourth embodiment of the invention. In FIG. 7, SW2 through SW5, SW8 through SW11, SW15, SW16, SW19 through SW24, S1, S2P, S2N, S3P, S3N and S4 represent switches, C1 through C14 designate capacitances, TOP+ designates a (+) side top plate of a capacitance array, TOP− represents a (−) side top plate of the capacitance array, Vrefp is a (+) side reference electric potential (e.g., 5V), Vrefn is a (−) side reference electric potential (e.g., 0V), CINP and CINN are comparator inputs, NODE1 and NODE2 represent internal nodes, a (+) side capacitance DAC represents DAC constructed of a capacitance array of C1 through C6, C13 and a (−) side capacitance DAC designates DAC constructed of a capacitance array of C7 through C12, C14. Further, RDACLP, RDACUP, RDACLN, RDACUN in FIG. 8 represent resistance DAC outputs, VOFFP, VOFFN are bias potentials for giving an offset to the conversion result, RDAC2 denotes resistance DAC, RU1 through RU14, RH1 through RH8 indicate resistances, NRU1 through NRU4, NRU8, NRU12 through NRU15 designate internal nodes of the resistance DAC, and SEL3, SEL4, SEL5, SEL6 represent selectors.

The portions corresponding to the circuit elements in FIGS. 1, 4, 5, etc., and the elements having the same functions are shown in a way that gives the same names. Further, for simplifying the illustration, some portions such as VINP, VINN, S2P, S2N, the comparator COMP1, etc are omitted from the drawings, however, the omitted portions shall have the same configurations as those in FIGS. 1, 4, 6, etc, unless particularly specified.

A value of bC (b is an integer) written together with the capacitance Ca (a is an integer) represents a relative relationship in magnitude between the respective capacitances and is weighted as shown in 1C, 2C, 4C, 8C, 16C (etc).

The circuits in FIGS. 5 and 6 show the example of the circuit that supplies the resistance DAC output to the bottom plates of C1, C7, however, the circuits in FIGS. 7 and 8 show an example in which C13, C14 are provided in addition to C1, C7, the resistance DAC output is supplied to the bottom plates of C1, C13, C7, C14, and the respective resistance DAC outputs are added by the capacitances C1, C7 or C13, C14. The fourth embodiment shows that the invention can be likewise applied also to the circuit configurations as in FIGS. 7 and 8 without adding any change to the configurations of the switches S1, S2P, S2N, S3P, S3N, S4 (and NM7, PM7, NM8, PM8).

A different point of the circuit in FIG. 7 from the circuit in FIG. 5 is that the circuit in FIG. 5 etc has the configuration in which the high-order bit is determined by the capacitance DAC, while the low-order bit is determined by the sole resistance DAC, however, by contrast, FIG. 7 shows a point of providing capacitances C13, C14 for adding further other resistance DAC outputs.

The portions having the same circuit functions in FIGS. 7 and 8 as the circuit functions in FIGS. 5 and 6 are omitted in their explanations, and the discussion will focus on portions having different configurations.

At first, a configuration of the resistance DAC will be explained with reference to FIG. 8. RDAC2 in FIG. 8 functions as a resistance DAC for converting the low-order 4 bits. RU1 through RU14 and RH1 through RH8 represent unit resistances having the same resistance value. RH1 through RH4 are formed by connecting two unit resistances in parallel and connecting these resistances in series, and therefore eventually the four resistances are equivalent to one unit resistance. A synthesized resistance of the four resistances RH5 through RH8 is similarly equivalent to the unit resistance. Accordingly, the reference voltage (the potential difference between Vrefp and Vrefn) is divided equally by 16, using RU1 through RU14 and RH1 through RH8. Codes named NRUe (e is an integer) are given to the internal nodes of the resistance DAC in the sequence from the lowest according to the electric potential. Herein, e of NRUe corresponds to the electric potential that is e/16 which denotes each position of the divided-by-16 reference potentials.

VOFFN, into which the potential difference between NRU15 and Vrefp is further divided by 2 with RH5 through RH8, becomes an electric potential lower by (Vrefp−Vrefn)/32 than Vrefp. Similarly, VOFFP, into which the potential difference between NRU1 and Vrefn is further divided by 2 with RH1 through RH4, becomes an electric potential higher by (Vrefp−Vrefn)/32 than Vrefn.

RDAC2 functions as a 4-bit input 4-output DAC circuit that inputs a 4-bit digital signal, outputs the electric potential corresponding to the high-order 2 bits to RDACUN and RDACUP, and outputs the electric potential corresponding to the low-order 2 bits to RDACLN and RDACLP.

The selector SEL5 selects one of the electric potentials of Vrefn, NRU1, NRU2, NRU3, and outputs the selected electric potential to the RDACLP. When the input low-order 2 bits of RDAC2 are 00, Vrefn is outputted, and the higher electric potentials of NRU1, NRU2, NRU3 are selected corresponding to 01, 10, 11, respectively.

RDACLN outputs the electric potential symmetrical to RDACLP. The selector SEL4 selects one of the electric potentials of Vrefp, NRU15, NRU14, NRU13, and outputs the selected electric potential to the RDACLN. When the input low-order 2 bits of RDAC2 are 00, Vrefp is outputted, and the lower electric potentials of NRU15, NRU14, NRU13 are selected corresponding to 01, 10, 11, respectively.

Next, the electric potential of RDACUP will be explained. The selector SEL6 selects one of the electric potentials of Vrefn, NRU4, NRU8, NRU12, and outputs the selected electric potential to the RDACUP. When the input high-order 2 bits of RDAC2 are 00, Vrefn is outputted, and the higher electric potentials of NRU4, NRU8, NRU12 are selected corresponding to 01, 10, 11, respectively.

Next, the electric potential of RDACUN will be explained. RDACUN outputs the electric potential symmetrical to RDACUP. The selector SEL3 selects one of the electric potentials of Vrefp, NRU12, NRU8, NRU4, and outputs the selected electric potential to the RDACUN. When the input high-order 2 bits of RDAC2 are 00, Vrefp is outputted, and the lower electric potentials of NRU12, NRU8, NRU4 are selected corresponding to 01, 10, 11, respectively.

RDACUP, RDACLP, RDACUN, RDACLN having these characteristics are supplied to the bottom plates of the minimum capacitances C1, C13M C7, C14 of the capacitance DAC as shown in FIG. 7, thereby making it possible to configure the CR double stage DAC that adds output of the resistance DAC by using capacitances.

The capacitances C1, C7 function also as the sampling capacitances in the same way as in the case of C1 in the circuit in FIG. 5 and C1, C7 in the circuit in FIG. 1. The capacitances C13, C14 are provided in parallel therewith. The capacitances C13, C14 are not the capacitances that perform the sampling of VINP, VINN, and hence the operation itself of the capacitance DAC is equivalent to the circuit in FIG. 5 when considering C1 through C12.

The circuit in FIG. 7 can be considered such that C13, C14 are added to the circuit portion thereof, and the electric potential of RDACLP and the electric potential of RDACLN are added to the electric potentials of the top plates TOP+, TOP− by C13 and C14.

In FIG. 1 or FIG. 5, even if parasitic capacitances exist between the top plates and predetermined electric potentials and if the parasitic capacitances are equal with respect to TOP+, TOP−, nothing affects the result. Namely, the function of the capacitance DAC is, in FIG. 7, roughly coincident in the case of having C13, C14 and in the case of having none of C13, C14. Such validity will be understood from these points that C13, C14 are provided separately, the resistance DAC output is added to the bottom plates thereof, and the electric potential of RDACLP and the electric potential of RDACLN are added (with a weight determined by the whole capacitance and the capacitance of 1C) to the top plates TOP+, TOP−.

Herein, a purpose of VOFFP and VOFFN will be explained. In the AD converter circuit, in the input/output characteristics of the analog input electric potential and the digital conversion result, there is a case where a transition point of the digital code (conversion result) is desired to be shifted by ½×LSB from the characteristic actualized by the circuits in FIGS. 1, 5, etc. C13, C14 in FIG. 7 and VOFFP, VOFFN supplied to the bottom plates thereof when sampling, serve for this purpose.

As already described, the electric potential of VOFFN is lower by (Vrefp−Vrefn)/32 than Vrefp. The electric potential of VOFFP is higher by (Vrefp−Vrefn)/32 than Vrefn. Each voltage NRUe (e is an integer) made by dividing (Vrep−Vrefn) by 16 at RDAC2 corresponds to LSB of the AD converter circuit in FIG. 8, so that VOFFP, VOFFN supply the bottom plates of C13, C14 with the voltage equivalent to ½×LSB from the positive/negative reference voltages when performing the sampling.

In the case of making the consideration with (+) side signal, when sampling, a voltage equivalent to ½×LSB is supplied to C13 having the capacitance that is 1/32 the whole (+) side capacitance DAC. Then, when searching, it follows that a voltage (equivalent to 0 through 3 LSB), which is 0/16, 1/16, 2/16 or 3/16 by the standard of 0V, is inputted as the resistance DAC output VOFFP. The same operation is applied to the (−) side capacitance DAC and to the resistance DAC output VOFFN.

This operates to shift the sampling result by the electric potential equivalent to ½×LSB upon a start of the conversion.

FIGS. 7 and 8 show the example, wherein the resolution of the capacitance DAC is 4 bits, and the resolution of the resistance DAC is 4 bits (2 bits+2 bits), however, the idea of the invention can be readily applied to the case of the general resolution, including the circuits in FIGS. 1 and 5 (together with the capacitance DAC, the resistance DAC) without being limited to the cases in FIGS. 7 and 8.

An effect of reducing the area size is acquired in addition to the effects in the fourth embodiment by taking the configurations as shown in FIGS. 7 and 8.

Even when the capacitance DAC is changed into the complicated CR double stage DAC as in FIGS. 7 and 8, nothing affects the control and the function needed for S1, S2P, S2N, S3P, S3N, S4 that have been explained in FIG. 1 or FIG. 4. Thus, the idea of the invention can be applied also to the charge redistribution (or SAR) type AD converter circuit constructed of the CR double stage DAC (which is the circuit that generates the digital data by shifting the sampling result to a degree corresponding to ½×LSB) having the configurations as in FIGS. 7 and 8.

<<Configuration of Comparator>>

Figure 9:
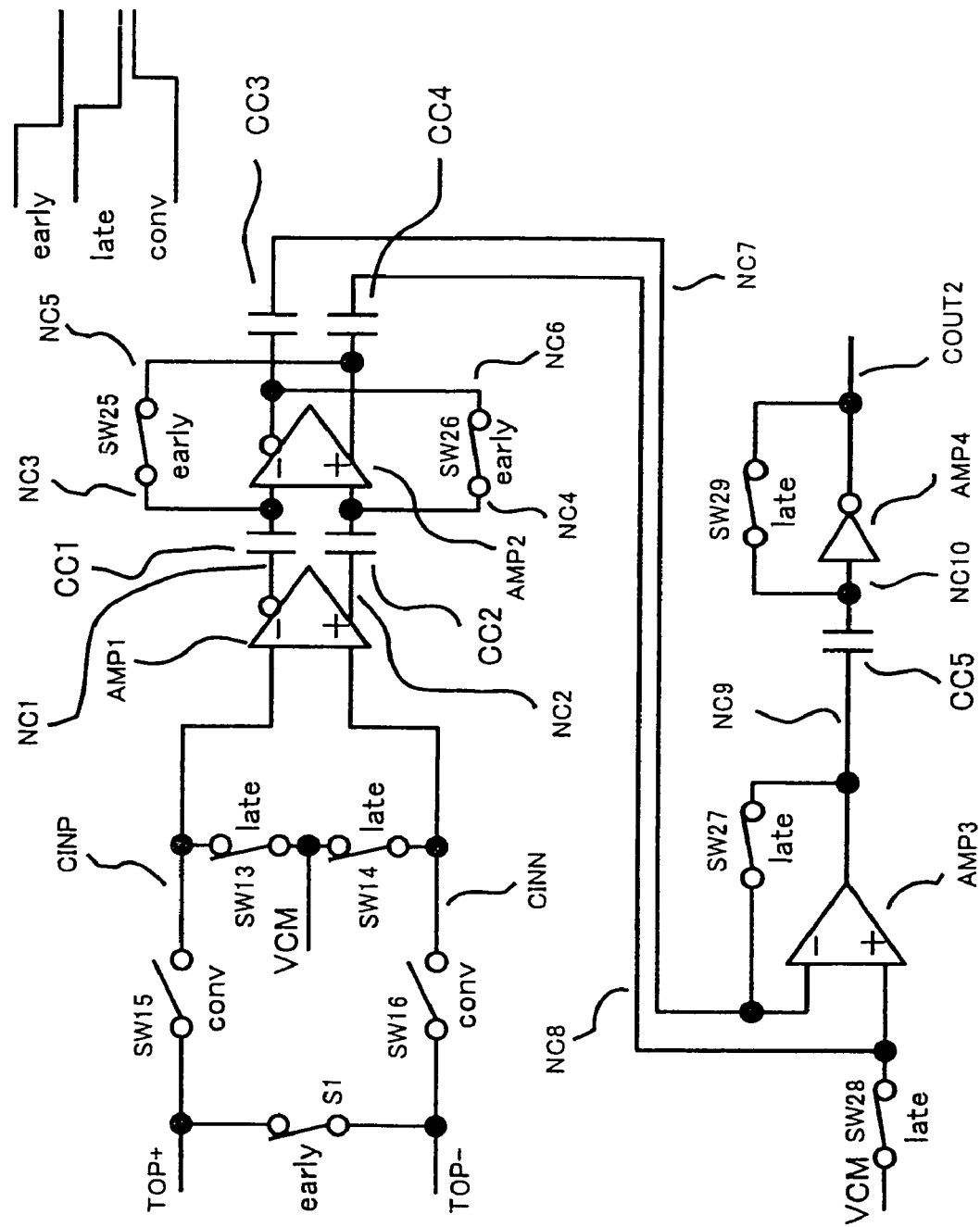
FIG. 9 is a diagram showing a comparator applicable to the AD converter according to each embodiment of the invention.

Herein, the comparator applicable to the AD converter according to each of the embodiments of the invention will be described with reference to FIG. 9. The description in FIG. 1 and FIGS. 4–8 has dealt with mainly the example of the circuit configuration up to the capacitance DAC and the operating concept of the switches S4 etc. FIG. 9 shows a circuit example of the comparator that detects the capacitance DAC output and the potential differential between TOP+ and TOP−.

In FIG. 9, SW13 through SW16, SW25 through SW29, S1 represent switches, CC1 through CC5 denote coupling capacitances, TOP+ designates a (+) side top plate of a capacitance array, TOP− represents a (−) side top plate of the capacitance array, CINP and CINN are comparator inputs, VCM is a bias potential (2.5V) of the comparator input when sampling, early, late, conv represent timing signals shown in the drawings, AMP1 through AMP4 designate amplifier circuits, NC1 through NC10 indicate internal nodes, and COUT2 stands for a comparison result of the comparator. Node names corresponding to those in FIG. 1 and FIGS. 5–8, etc are shown in a way that gives the same element names and the same node names.

A timing signal name written together with the switch represents a timing at which the switch is closed. A state of the switch in FIG. 9 indicates control of the switch in a state where the electric potentials of VINP, VINN are subjected to the sampling by the capacitance DAC.

To start with, the state where the electric potentials of VINP, VINN are subjected to the sampling by the capacitance DAC will be explained.

As already explained, the top plates TOP+, TOP− of the capacitance DAC are controlled by S1 so that their electric potentials become substantially the same as the common electric potential of the input analog electric potential.

At the final point of time of the comparison period during which the bits are determined by the comparator in a way that operates the switch of the capacitance DAC, the final electric potentials of the comparator inputs CINP, CINN becomes approximately VCM (which is ½ the reference potential). The reason why so is that the comparator COMP1 explained in the first through fourth embodiments compares the (+) side capacitance DAC output signal (the electric potential of the (+) side top plate TOP+) with the (−) side capacitance DAC output signal (the electric potential of the (−) side top plate TOP−), and the (+) side capacitance DAC and the (−) side capacitance DAC are controlled so that the potential difference therebetween disappears. To be specific, at the final point of time of the comparison period, the final electric potentials of TOP+, TOP− and the comparator inputs CINP, CINN become ½ the reference potential if the offset of the comparator COMP1 is ignored.

In this case, it is desired that the offset voltage of the comparator be stored in some means in a state of adding the common electric potential that is ½ the reference potential, and the auto-zero is executed.

The electric potentials of TOP+, TOP− during the sampling, however, become the common electric potential of the analog input signals VINP, VINN. Generally, it can not be expected that the common electric potential of the analog input signals VINP, VINN gets coincident with the electric potential that is ½ the reference potential (which is (Vrefp+Vrefn)/2). This being the case, during the sampling, CINP, CINN are separated from TOP+, TOP− by SW15 and SW16, and are separately supplied with the electric potential that is ½ the reference potential (which is (Vrefp+Vrefn)/2), i.e., supplied with VCM, and the offset voltage is stored, thus executing the auto-zero.

For example, if the offset voltage exists in AMP1 in FIG. 9, even when giving the same electric potential of VNM (Vrefp+Vrefn)/2) to CINP, CINN, the outputs NC1, NC2 thereof do not become the same electric potential. The offset voltage can be cancelled by storing this electric potential in CC1, CC2.

For example, an equal electric potential VCM is given to CINP, CINN. At this time, the electric potentials of NC1, NC2 do not become the equal electric potentials by the offset voltage of AMP1. It is assumed that the electric potential of NC1 comes to ½+100 mV, and the electric potential of NC2 comes to ½−100 mV of the power source voltage. The switches SW25, SW26 are kept closing. The electric potentials of NC3, NC4 become the electric potential equivalent to the offset voltage of AMP2.

Supposing that the offset voltage of AMP2 is 10 mV (when NC4 is larger by 10 mV than NC3, the output voltage of AMP2 comes to a voltage that is approximately ½ the power source voltage), the electric potential of NC4 is ½+5 mV, and the electric potential of NC3 is ½−5 mV. The electric potential of NC1 is ½+100 mV of the power source voltage, and the electric potential of NC2 is ½−100 mV of the power source voltage. Namely, the electric potentials at both terminals of CC1 become ½+100 mV of the power source voltage and ½−5 mV of the power source voltage, and the electric potentials at both terminals of CC2 become ½−100 mV of the power source voltage and ½+5 mV of the power source voltage.

Even when the offset voltage exists in AMP1, AMP2, during the sampling, the electric charges are accumulated in CC1, CC2, whereby the electric charges of NC5, NC6 can be substantially equalized. With this operation, when there occurs the potential difference between CINP and CINN, the electric potentials of NC5, NC6 change respectively, and the relationship in magnitude between CINP and CINN can be judged without being affected by the offset voltage.

As already explained, for the period during which VINP, VINN are subjected to the sampling by the capacitance DAC, the switches SW25, SW26, SW27, SW28, SW29 are kept closing. The potential difference between NC3 and NC4 comes to a value as close as the offset voltage of AMP2 by closing the switches SW25, SW26.

As to AMP3 also, the offset voltage is similarly stored in the coupling capacitances CC3, CC4. Since the electric potentials of NC7, NC9 are equalized, when an amplitude rate is extremely large, the potential difference between NC8 and NC7 gets equal to the offset voltage. The reason by so is that if the potential difference between NC8 and NC7 is not equal to the offset voltage, the output voltage takes a value as close as the (+) or (−) power source voltage. (The understanding is facilitated if considering a limit to which the amplitude rate becomes extremely large.) The information that the potential difference between NC7 and NC8 is equal to the offset voltage is stored in CC3, CC4, and hence the electric potentials of NC5, NC6 change from the state at the sampling time, wherein when any one of the electric potentials changes high or low, and the relationship in magnitude therebetween can be judged by AMP3 without being affected by the offset voltage of AMP3.

Further, as to AMP4 also, the offset voltage is stored in the coupling capacitance CC5. For instance, NC9 is assumed to takes an idealistic value that is ½ the power source voltage. If a theoretic threshold value of AMP4 is ½ as small as the power source voltage, the offset voltage of AMP4 becomes 0, however, actually the theoretic threshold value of AMP4 deviates from ½ the power source voltage. In this case also, the electric potential of NC10 during the sampling can be set to the theoretic threshold value of AMP4 by equalizing the electric potentials of NC10 and COUT2 through SW29. With this operation, it can be judged by AMP 4 and CC5 whether the electric potential of NC9 rises above or decreases under the electric potential during the sampling. After VINP, VINN have been subjected to the sampling by the capacitance DAC, the switch with early written together is opened. Next, the switch with late written together is opened, while the switch with conv written together is closed.

The circuit shown by way of an example in FIG. 9 can detect the potential difference between the capacitance DAC outputs TOP+ and TOP−, and can judge the relationship in magnitude therebetween.

FIFTH EMBODIMENT

Figure 10:
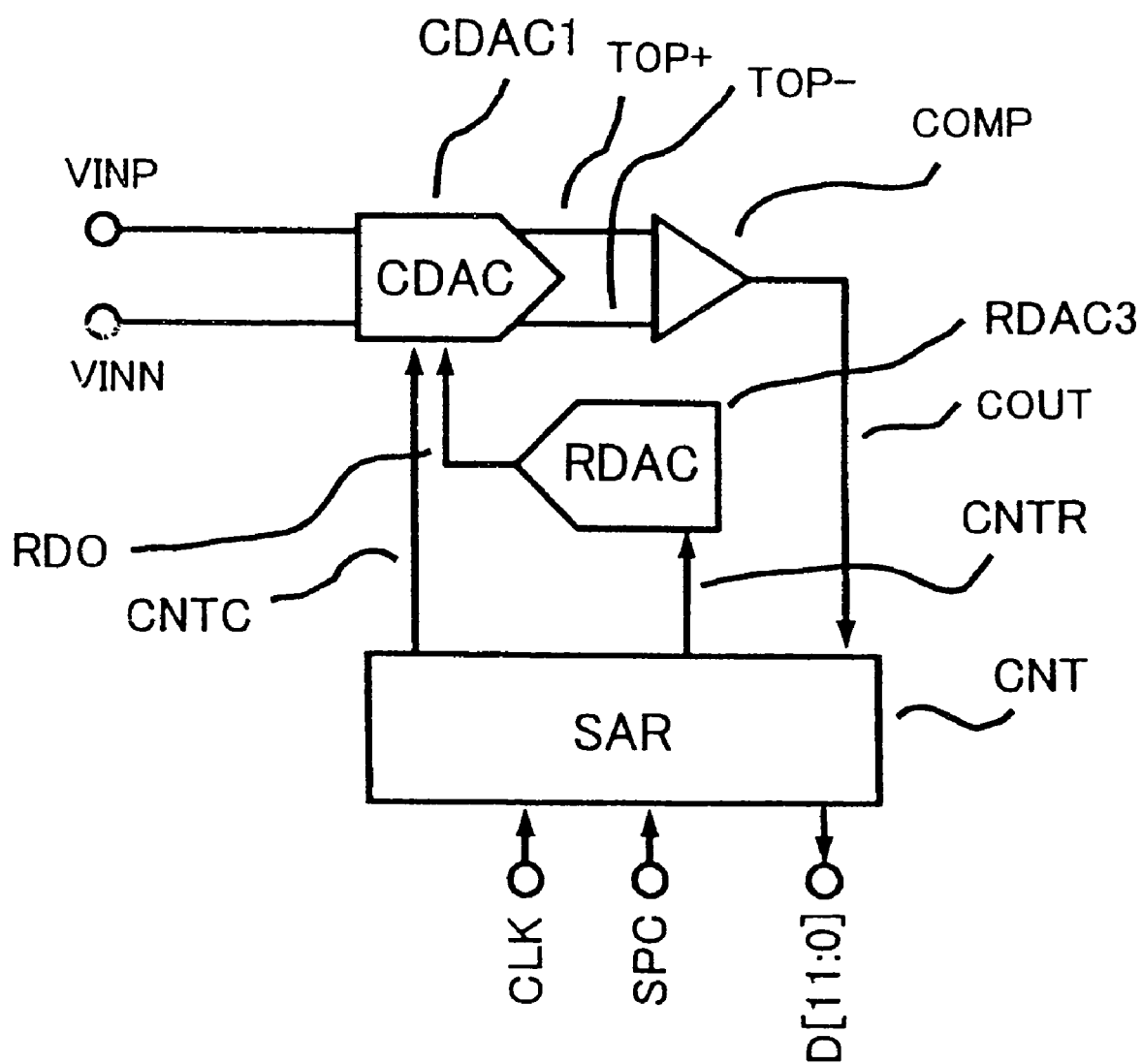
FIG. 10 is a block diagram of a charge redistribution (or SAR) type AD converter circuit according to the fifth embodiment of the invention.
Figure 11:
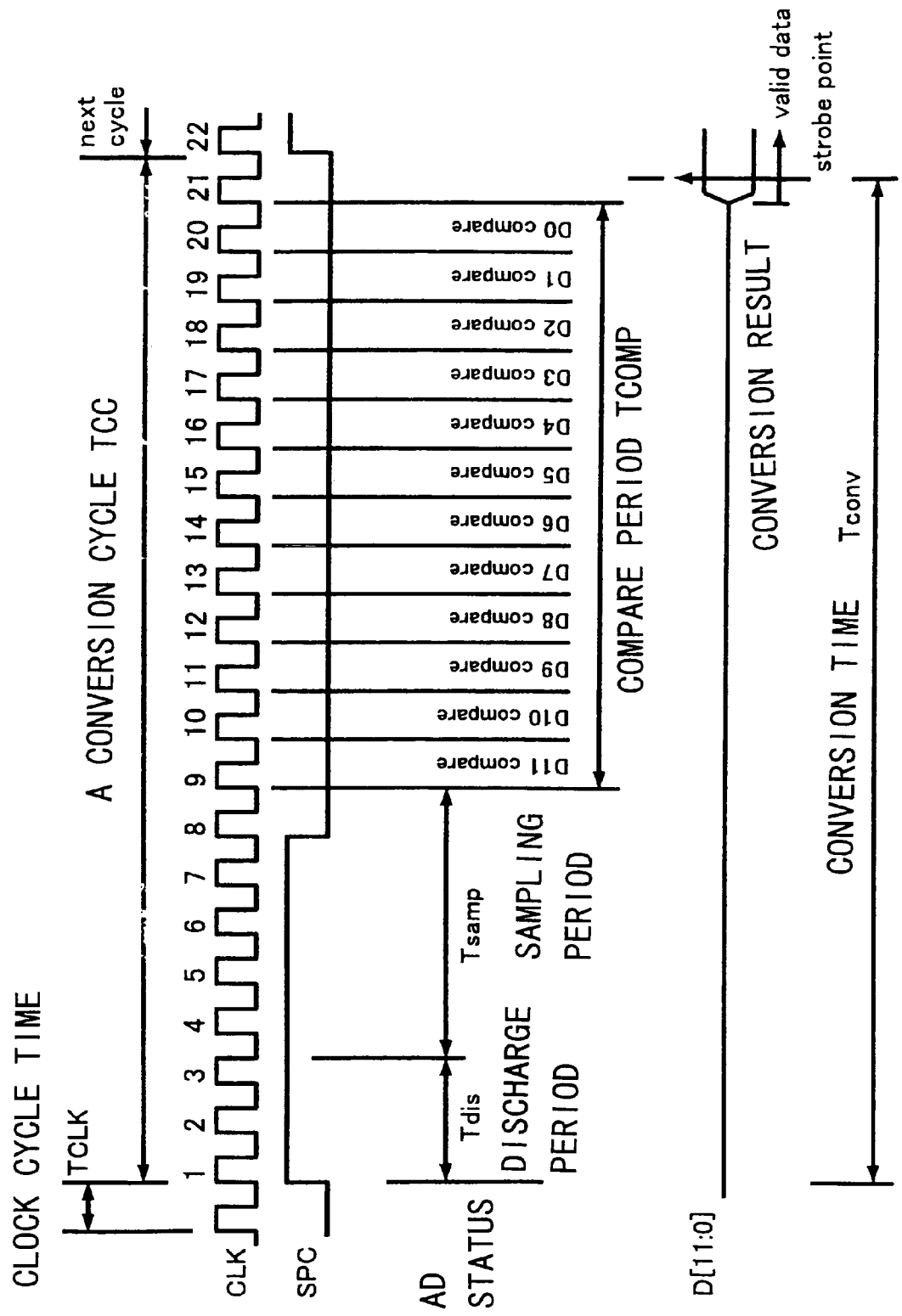
FIG. 11 is a diagram showing an example of an operation timing.

FIG. 10 shows one example of a charge redistribution (or SAR) type AD converter circuit according to a fifth embodiment of the invention, and FIG. 11 shows an operation timing example thereof. Herein, the capacitance DAC (CDAC1) involves using a circuit including the switch S1, the PMOS transistors PM7, PM8 and the NMOS transistors NM7, NM8 shown in FIG. 4.

In FIG. 10, VINP designates a (+) analog input, VINN denotes a (−) analog input, TOP+ designates a (+) side top plate of a capacitance array, TOP− represents a (−) side top plate of the capacitance array, COUT is an output of the comparator circuit, RDO represents a resistance DAC (RDAC3) output, CNTR denotes a control signal of the resistance DAC, CNTC represents a control signal of the capacitance DAC, CLK is a clock input for specifying the whole timings of the AD converter circuit, SPC is a signal that specifies a sampling period and a discharge period (a period during which the electric charge of the sampling capacitance is initialized to 0) during which S3P, S3N are kept ON, D[11:0] represents (for instance) a 12-bit AD conversion result, CDAC1 is capacitance DAC, COMP designates a comparator, RDAC3 represents resistance DAC, and CNT denotes a control circuit that controls the sequential comparison. In FIG. 10, the portions corresponding to those in the circuits in FIGS. 1 through 9 are illustrated in the way of being given the same element names and the same terminal names.

An operation of the circuit in FIG. 10 will be explained with reference to FIG. 11. As shown in FIG. 11, it is assumed that the clock signal CLK is inputted. After the control signal SPC has changed to H, A3P, S3N are kept ON during, e.g., a 2.5 clock (CLK cycle time) period, and the electric charge of the sampling capacitance of the capacitance DAC is initialized to 0. Next, till an elapse of the 1-clock period since SPC has changed to L from H, VINP, VINN are subjected to the sampling (wherein "discharge period" represents the period during which S3P, S3N are kept ON, and "sampling period" designates a sampling period during which the analog input signals are thereafter subjected to the sampling in FIG. 11).

After the end of the sampling period, the bits are determined sequentially from MSB down to LSB by controlling the input signals of the capacitance DAC (CDAC1) and the resistance DAC (RDAC3) (which is shown as "compare period" in FIG. 11). After finishing the determination of LSB, the conversion result D[11:0] becomes effective.

FIGS. 12A–12D, 13A–13C and 14A–14C show examples, wherein the circuit of the invention in FIG. 10 is designed to operate at the timing in FIG. 11, and the waveforms of the respective portions are obtained through circuit simulation. Herein, a circuit of CDAC1 defined as the capacitance DAC shown in FIG. 10 involves employing the circuit shown in FIG. 4. The switches S1, S2P, S2N, S3N, S3P, S4 are respectively constructed by combining the PMOS transistor and the NMOS transistor as PM5 and NM5 are paired in FIG. 3.

The respective transistors such as the NMOS transistor, the PMOS transistor and PM7, NM7, PM8, NM8 shown in FIG. 4, etc involve using a MOS model on the assumption of MOS transistors that are approximately 0.7 μm in channel length and 5V in withstand pressure, wherein the operating waveform is obtained by SPICE (Software Programs for Integrated Circuit Evaluation) simulation.

Figure 12A:
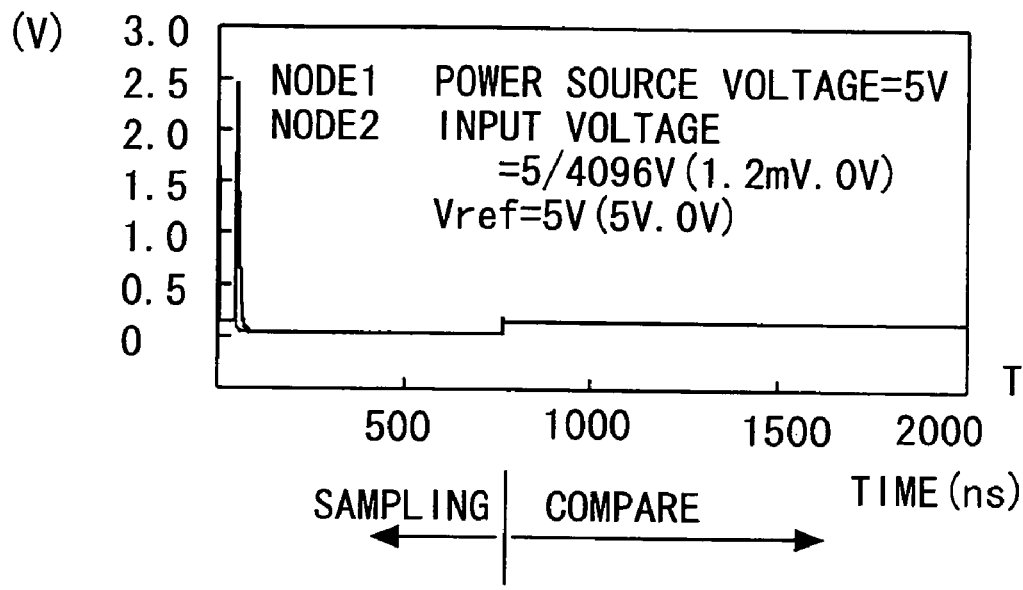
FIG. 12A is an example (part 1) of a circuit simulation result.
Figure 12B:
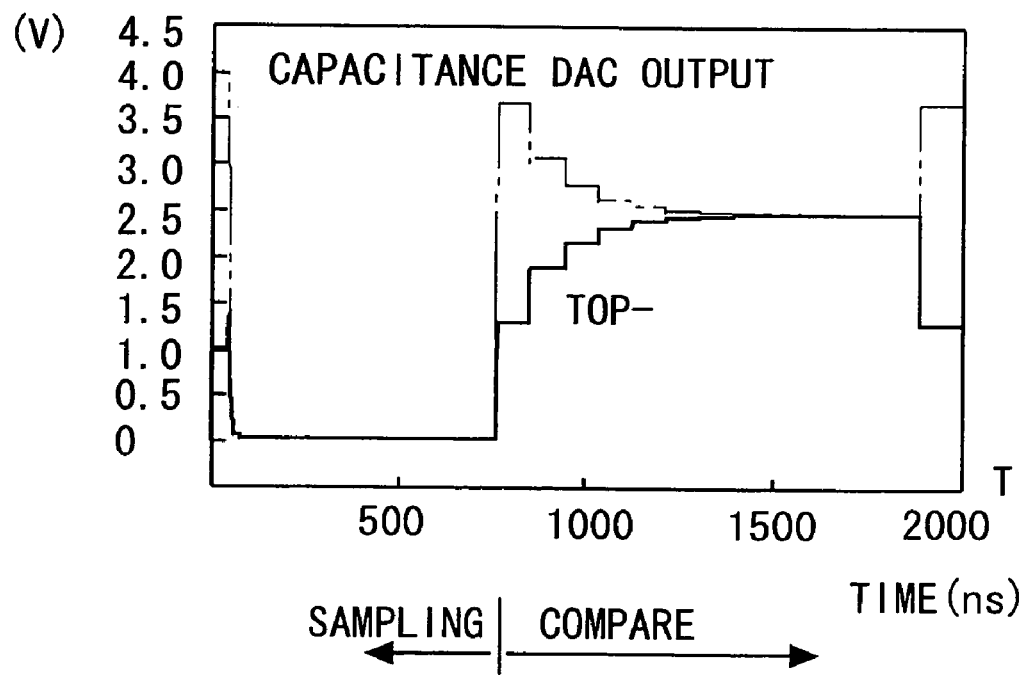
FIG. 12B is an example (part 1) of a circuit simulation result.
Figure 12C:
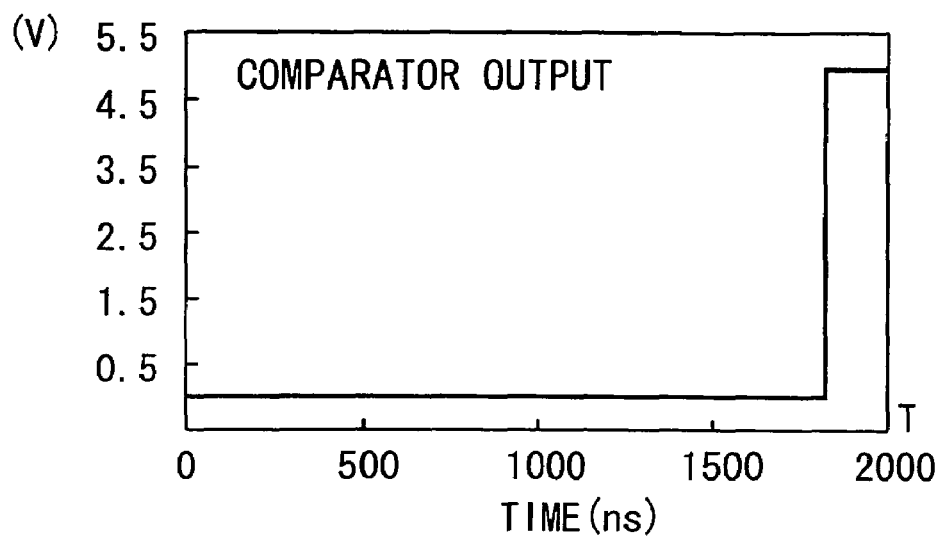
FIG. 12C is an example (part 1) of a circuit simulation result.
Figure 12D:
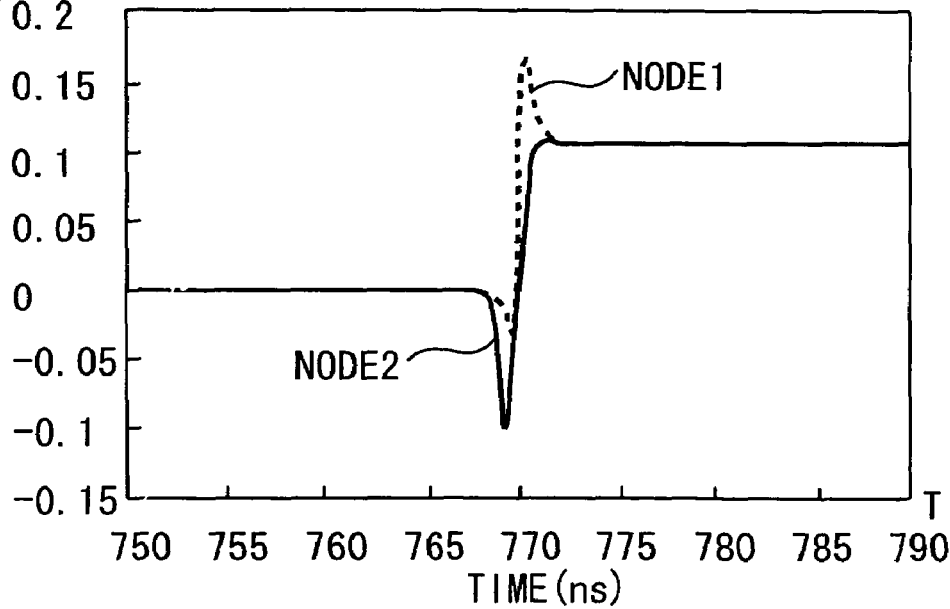
FIG. 12D is an enlarged diagram showing the time at a point of time when shifting to comparison from sampling in FIG. 12A.

FIGS. 12A–12D show the waveforms of the respective portions when the power source voltage is 5V, Vrefp=5V, Vrefn=0V, VINP=1.2 mV and VINN=0V (a case where $1/4096$ is inputted to VINP, where LSB is $1/4096$ into which 5V is divided by 4096). FIG. 12D, however, shows a result of enlarging the waveform in FIG. 12A at a point of time when shifting to the comparison by the comparator from the sampling.

Figure 13A:
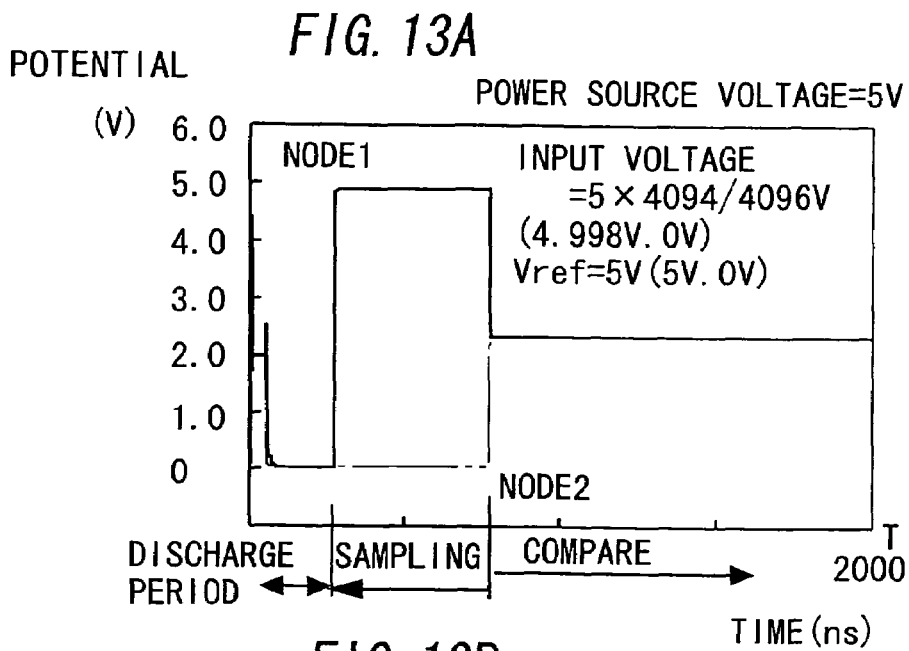
FIG. 13A is an example (part 2) of a circuit simulation result.
Figure 13B:
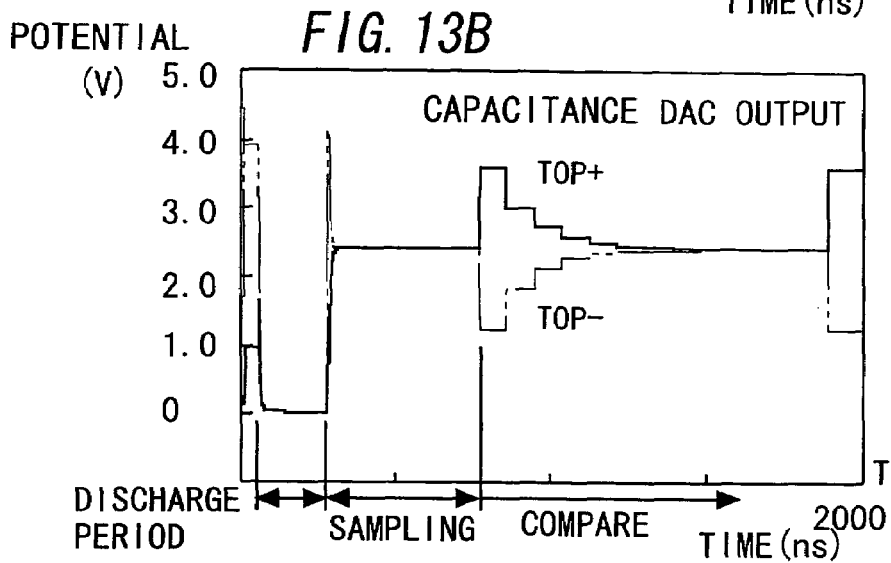
FIG. 13B is an example (part 2) of a circuit simulation result.
Figure 13C:
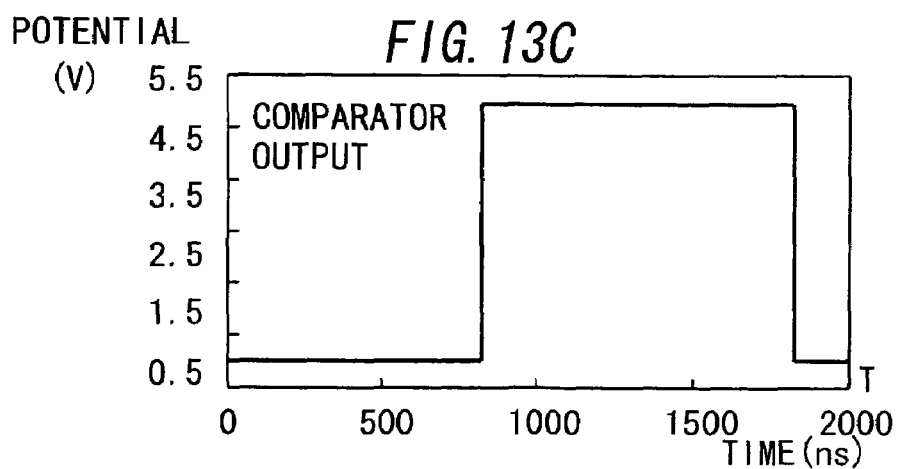
FIG. 13C is an example (part 2) of a circuit simulation result.

Further, FIGS. 13A–13C show the waveforms of the respective portions when the power source voltage is 5V, Vrefp=5V, Vrefn=0V, VINP=4.998V, VINN=0V (a case where $4094/4096$ is inputted to VINP, where LSB is $1/4096$ into which 5V is divided by 4096).

Figure 14A:
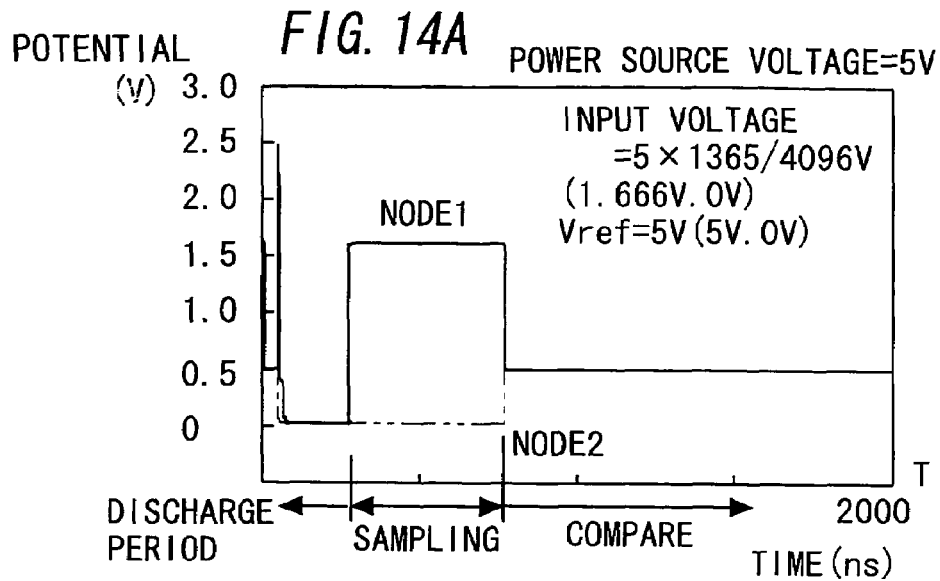
FIG. 14A is an example (part 3) of a circuit simulation result.
Figure 14B:
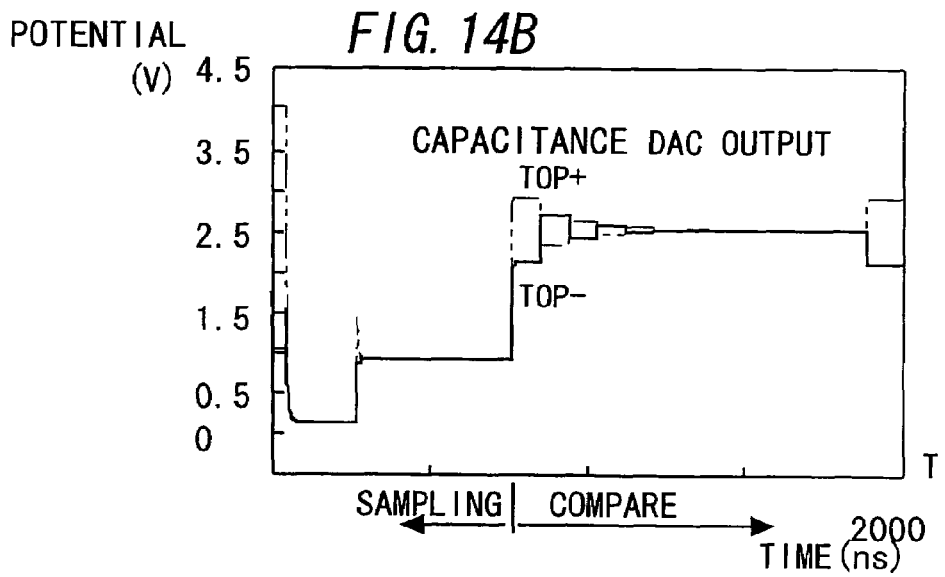
FIG. 14B is an example (part 3) of a circuit simulation result.
Figure 14C:
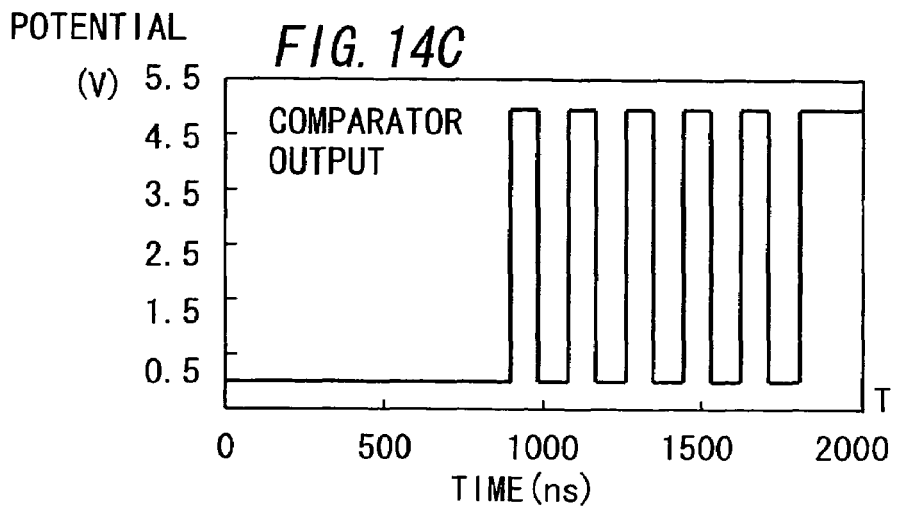
FIG. 14C is an example (part 3) of a circuit simulation result.

Moreover, FIGS. 14A–14C show the waveforms of the respective portions when the power source voltage is 5V, Vrefp=5V, Vrefn=0V, VINP=1.666V, VINN=0V (a case where $1365/4096$ is inputted to VINP, where LSB is $1/4096$ into which 5V is divided by 4096).

Because of the example of the 12-bit AD conversion, the conversion results to be expected are 000000000001 in the case of FIGS. 12A–12C, 111111111110 in the case of FIGS. 13A–13C and 010101010101 in the case of FIGS. 14A–14C.

The waveforms in FIG. 12A are shown as waveforms of the portions corresponding to NODE1, NODE2 in FIG. 1, 4 or 7. The simulation circuit, which acquires the conversion result, controls the switch so that the electric potential VNODE2 is equalized to the electric potential of VINN. Further, each of the electric potentials of the top plates TOP+, TOP−, and NODE1 is also equalized to the electric potential of VINN during the discharge period (the period during which the electric charge of the sampling capacitance is initialized to 0). The inputs are extremely small such as VINP=1.2 mV and VINN=0V, and hence the electric potentials of NODE1 and NODE2 appear to be almost 0V in FIG. 12A.

Further, in a graph in FIG. 12A, it seems that the electric potentials of NODE1, NODE2 do not exceed the power source voltage range during the comparison period of the comparator. As in FIG. 12D, however, when enlarging a point of time when shifting to the comparison by the comparator from the sampling, a much minuter phenomenon is clarified. According to FIG. 12D, it is comprehended that the electric potential of NODE2 decreases down to approximately −0.08V at the point of time when shifting to the comparison by the comparator from the sampling. This is attributed to such a point that as already described, in FIG. 4, the switch S2N is shut off when the electric potential of VINN is nearly 0V and the electric potential of NODE2 is nearly 0V, in which case since the inversion layer is formed on the NMOS transistor configuring the S2N, the gate capacitance is connected between the gate, the drain and the source via the inversion layer, and the gate potential of the NMOS transistor configuring the S2N changes to 0V from 5V, whereby the electric potential of NODE2 decreases via the gate capacitance.

In the simulation result in FIG. 12D, however, as explained in FIG. 4, when shutting off S2P and S2N, NODE1 and NODE2 are equalized by S4. Furthermore, the gate potentials of the transistors NM7, NM8, PM7, PM8 connected to NODE1 and NODE2 are changed in a direction opposite to the gate potentials of the transistors constituting S2P and S2N (these transistors NM7, NM8, PM7, and PM8 are switched ON). As a result, it is understood that the electric potential of NODE2, which has decreased down to about −0.08V temporarily, rises and converges within the power source voltage range. It is further understood that the electric potentials of NODE1 and NODE2 get equal to each other by equalization.

Thus, the electric potentials of NODE1 and NODE2 are controlled to converge within the power source voltage range to the greatest possible degree, thereby enabling reduction of the electric current flowing to the top plates TOP+, TOP− via the switches S3P, S3N. This operation restrains a loss of the electric charges in the top plates TOP+, TOP− and leads to acquirement of more precise conversion results.

After the end of the sampling, the comparison by the comparator is started (which is expressed as "comparison by comparator" in FIG. 12A). it is comprehended that the comparator output changes to 000000000001 (the waveform diagram in FIG. 12C). This value is coincident with the expected value stated above.

FIG. 12B (which is a diagram shown as the waveforms of the capacitance DAC outputs) shows the waveforms of TOP+, TOP−. During the sampling period, the electric potentials of TOP+, TOP− become the input common electric potential and therefore come to approximately 0V. When starting the comparison, the common electric potential becomes about 2.5V and gradually changes from a large potential difference state to a small potential difference state, and eventually the electric potentials of TOP+, TOP− get substantially coincident with each other.

In FIGS. 13A–13C, the electric potentials of NODE1 and NODE2 come to 0V given by VINN during the discharge period. It is understood from FIG. 13A that during the sampling period, the electric potentials of VINP, VINN are respectively approximately 5V and 0V, and therefore the electric potentials of NODE1 and NODE2 become respectively about 5V and 0V. It is comprehended from the waveforms of TOP+, TOP− in FIG. 13B that during the sampling period, the electric potentials of TOP+, TOP− become the input common electric potential of approximately 2.5V. Further, it is also understood that during the comparison period of the comparator, the electric potentials of NODE1 and NODE2 do not exceed the power source voltage range.

It is also understood from 13C that the comparator output is coincident with the expected value "111111111110". The potential difference between TOP+ and TOP− gradually changes from a large potential difference state to a small potential difference state, and still the electric potentials of TOP+, TOP− eventually get substantially coincident with each other. The codes are reversed to those in the case of FIG. 12.

In FIGS. 14A–14C, the electric potentials of NODE1 and NODE2 come to 0V given by VINN during the discharge period. It is understood from FIG. 14A that during the sampling period, the electric potentials of VINP, VINN are respectively approximately 1.6V and 0V, and therefore the electric potentials of NODE1 and NODE2 become respectively about 1.6V and 0V. It is comprehended from the waveforms of TOP+, TOP− in FIG. 14B that during the sampling period, the electric potentials of TOP+, TOP−
become the input common electric potential of approximately 0.8V. Further, it is also understood that during the
comparison period of the comparator, the electric potentials
of NODE1 and NODE2 do not exceed the power source
voltage range.

In FIG. 14C, the comparator output changes to
"010101010101", and the code of the potential difference
changes alternately corresponding to the change of the
comparator output as "010101010101". In FIG. 14B, at a
point of time when the comparison is finished, the electric
potentials of TOP+, TOP− get substantially coincident with
each other.

As discussed so far, it will be understood from the
waveform diagrams that the circuits shown in FIGS. 10, 11,
etc operate in the way described in the explanations of the
respective drawings.

SIXTH EMBODIMENT

<Outline>

An AD converter according to a sixth embodiment of the
invention will be described with reference to FIG. 15. In the
sixth embodiment, switches (SW30, SW31, SW32, SW33)
are provided in input portions of the AD converter for
converting the differential analog input into the digital value
on the assumption of the sign bit. Provided further is a
comparator COMP2 that judges a relationship in magnitude
between the (+) side analog input signal VINP and the (−)
side analog input signal VINN. In the AD converter for
converting the differential analog input into the digital value
on the assumption of the sign bit, in the case of converting
an analog difference potential (ICDACP−ICDCAN) into the
digital value on the assumption that an input ICDACP
thereof is larger than or equal to ICDCAN, if VINP is larger
than VINN, ICDACP is supplied with VINP, and ICDCAN
is supplied with VINN. Conversely, if VINP is smaller than
VINN, the switches (SW30, SW31, SW32, SW33) may be
operated so that the ICDACN is supplied with VINP, and
ICDCAP is supplied with VINN.

With these contrivances, the circuit that converts the
analog signal including the polarity (plus and minus), if
necessary, into the digital value can be actualized by use of
the AD circuit for converting the analog signal into the
digital value on the assumption of the sign bit.

EXAMPLE

Figure 15:
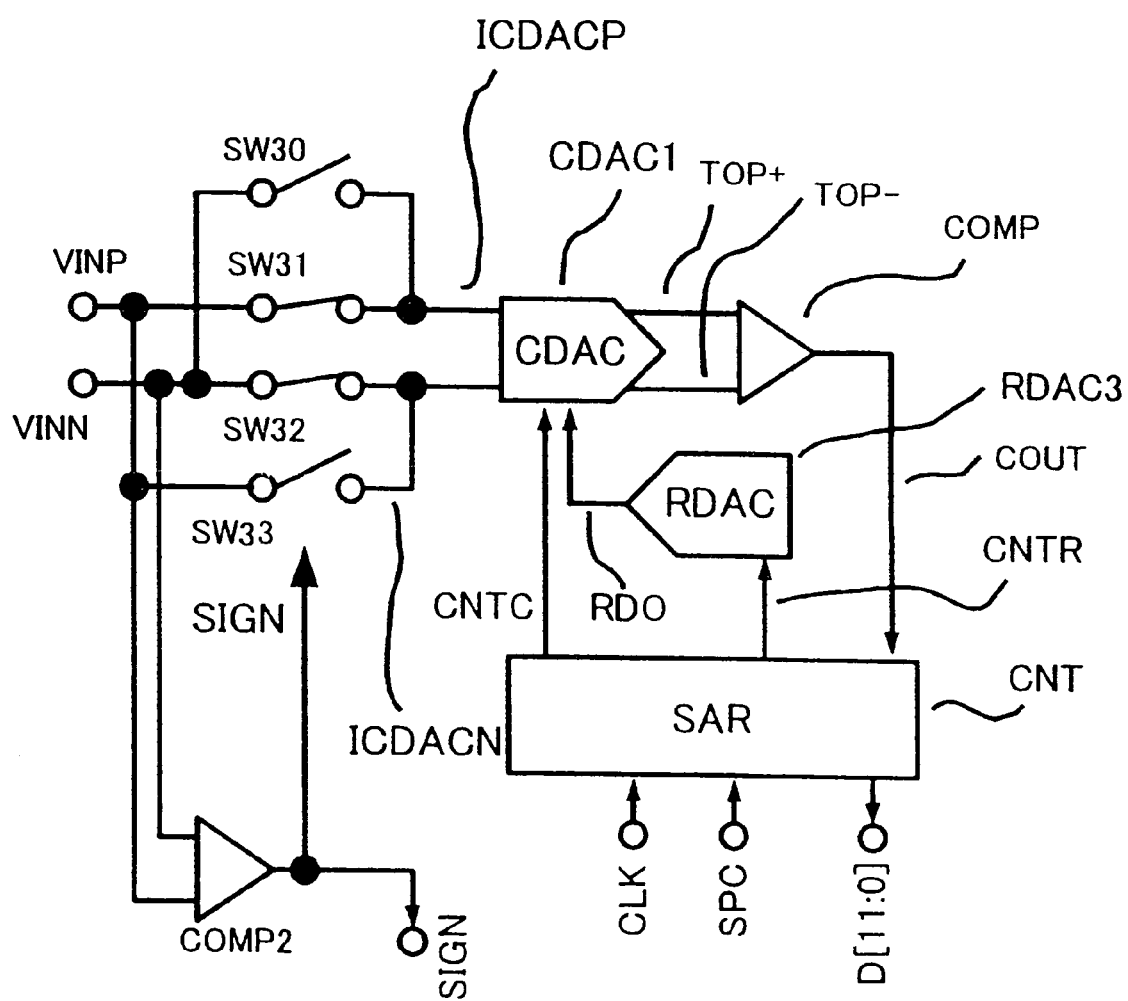
FIG. 15 is a circuit diagram showing an AD converter according to a sixth embodiment of the invention.

FIG. 15 shows one example of a block diagram of the
charge redistribution (or SAR) type AD converter circuit in
the sixth embodiment. In FIG. 15, VINP designates a (+)
analog input, VINN denotes a (−) analog input, TOP+
designates a (+) side top plate of a capacitance array, TOP−
represents a (−) side top plate of the capacitance array,
COUT is an output of the comparator circuit, RDO represents a resistance DAC output, CNTR denotes a control
signal of the resistance DAC, CNTC represents a control
signal of the capacitance DAC, CLK is a clock input for
specifying the whole timings of the AD converter circuit,
SPC is a signal that specifies a sampling period and a
discharge period (a period during which the electric charge
of the sampling capacitance is initialized to 0) during which
S3P, S3N are kept ON, D[11:0] represents (for instance) a
12-bit AD conversion result, CDAC1 is a capacitance DAC,
COMP designates a comparator, RDAC3 represents resistance DAC, ICDACP, ICDACN are capacitance DAC
inputs, SAR denotes a control circuit that controls the
sequential comparison, SW30 through SW33 are switches,
COMP2 is a comparator that judges the input polarity (plus
and minus), and SIGN is a code judged by the comparator.
In the circuit in FIG. 15, the portions corresponding to those
in the circuits in FIG. 10 are illustrated in the way of being
given the same element names and the same terminal names.

The description in each of the circuits in FIGS. 4–10 is
that on the premise that VINP is larger than VINN
(VINP>VINN), the AD conversion is conducted on the
assumption of the polarity (plus and minus), whereby the
conversion cycle can be saved and speeded up. In terms of
applications, in the case of assuring that VINP is larger than
VINN, the circuits in FIG. 1 and FIGS. 4–10 may be applied
as they are.

In the case of not always assuring that VINP is larger than
VINN, for instance, the circuit that digitally converts the
analog signal potential difference including the polarity
(plus and minus) can be actualized by taking the circuit
configuration shown in FIG. 15 without spoiling the advantages of the sixth embodiment.

The circuit in FIG. 15 has almost the same configuration
as the circuit in FIG. 10 has, and different portions therefrom
are COMP2 and SW30 through SW33, wherein the repetitive explanations of the same portions are omitted, and the
discussion will proceed in a way that focuses on the different
proportions from the circuit in FIG. 10.

The switches SW30 through SW33 are provided in the
input portions of the circuit in FIG. 10, and the comparator
COMP2 examines the relationship in magnitude between
VINP and VINN. When VINP>VINN, SW31, SW32 are
switched ON, VINP is supplied to the (+) side input of
CDAC1, and VINN is supplied to the (−) side input of
CDAC1 (SW30 trough SW33 are controlled by COMP2
output SIGN). Conversely, when VINP<VINN, SW30,
SW33 are switched ON, VINP is supplied to the (−) side
input of CDAC1, and VINN is supplied to the (+ side input
of CDAC1.

The (+) side input can be set always larger than the (−)
side input for the AD converter after CDAC by thus controlling, and consequently the proper result is acquired at all
times by the circuits explained in FIGS. 1, 6, 7, 8 and 10. If
the circuit is configured in this manner, in terms of applications, the signal code does not change so much, and, in the
case of the code being easy to predict, the code judgment
cycle can be omitted, whereby the operation can be speeded
up.

SEVENTH EMBODIMENT

Figure 16:
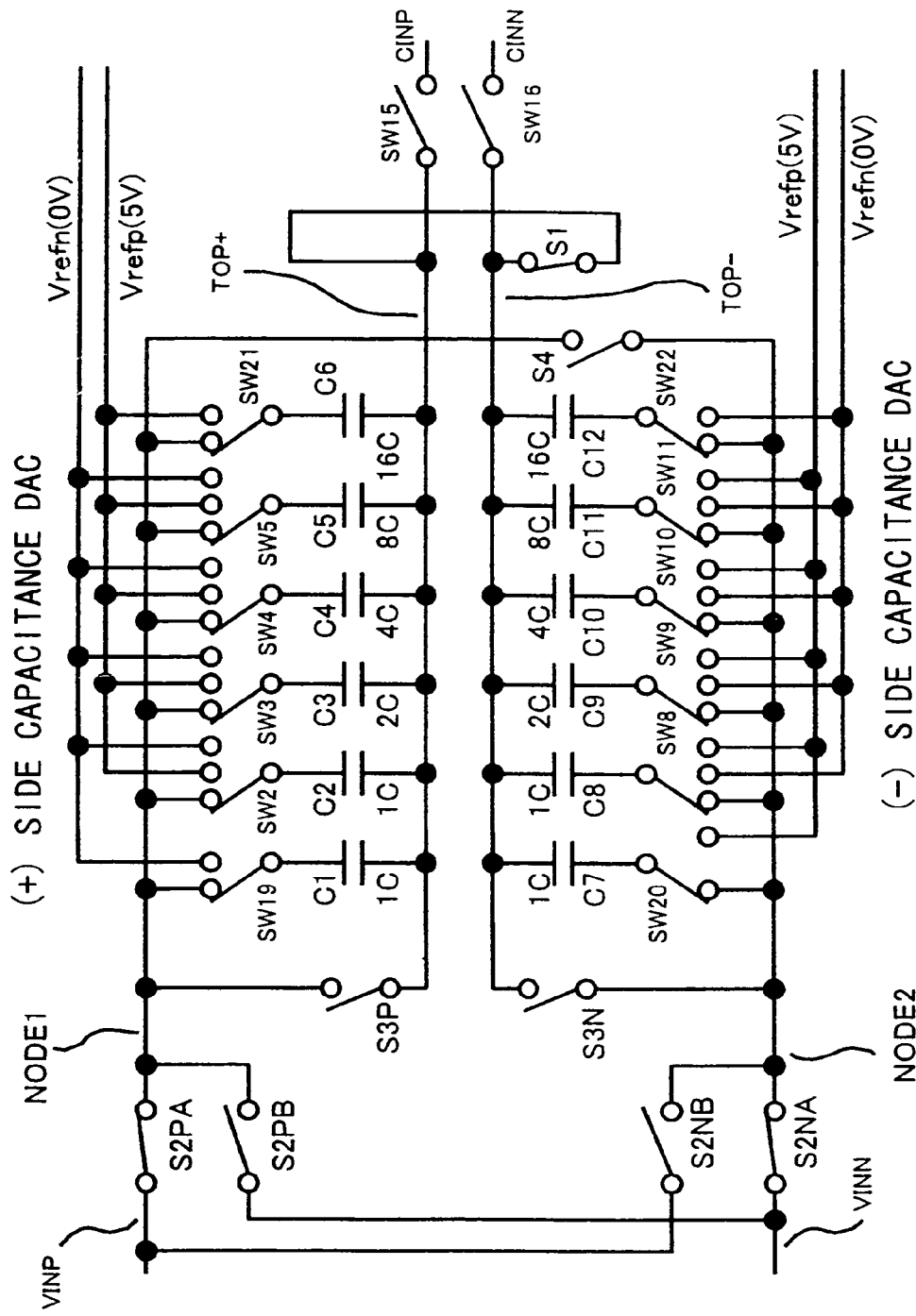
FIG. 16 is a circuit diagram showing an AD converter according to a seventh embodiment of the invention.

FIG. 16 is a circuit diagram showing an AD converter
according to a seventh embodiment of the invention. In FIG.
16, SW2 through SW5, SW8 through SW11, SW15, SW16,
SW19 through SW22, S1, S2PA, S2PB, S2NA, S2NB, S3P,
S3N and S4 represent switches, C1 through C12 designate
capacitances, VINP indicates a (+) analog input, VINN
denotes a (−) analog input, TOP+ designates a (+) side top
plate of a capacitance array, TOP− represents a (−) side top
plate of the capacitance array, Vrefp is a (+) side reference
electric potential (e.g., 5V), Vrefn is a (−) side reference
electric potential (e.g., 0V), COMP1 stands for a comparator, CINP and CINN are comparator inputs, NODE1,
NODE2 represent internal nodes, a (+) side capacitance
DAC represents DAC constructed of C1 through C6, and a
(−) side capacitance DAC designates DAC constructed of
C7 through C12. Portions corresponding to the circuit elements of the circuits etc in FIGS. 1 and 4 and the elements having the same functions as those thereof, are shown in a way that gives the same element names and the same terminal names.

The circuit in FIG. 16 has almost the same configuration as the circuit in FIG. 1 has, and different portions therefrom are S2PA, S2PB, S2NA, S2NB, wherein the repetitive explanations of the same portions are omitted, and the discussion will proceed in a way that focuses on the different proportions from the circuit in FIG. 1.

FIG. 15 shows an example of the circuit to which the idea of the invention is applied when VINP<VINN. FIG. 15 illustrates the circuit example in which the new switches are provided in the input portions of the capacitance DAC of, for example, the circuit in FIG. 1, however, a method as shown in FIG. 16 is also usable.

In FIG. 16, S2PA, S2PB, S2NA, S2NB are provided in place of S2P, S2N. When VINP>VINN, S2PA, S2NA are switched ON, VINP is supplied to NODE1, and VINN is supplied to NODE2 (for instance, the switch is controlled by the COMP2 output SIGN). Conversely when VINP<VINN, S2PB, S2NB are switched ON, VINP is supplied to NODE2, and VINN is supplied to NODE1.

An effect of reducing the number of switches, if a problem about an increase in the number of switches arises, is obtained with the configuration as shown in FIG. 15 by taking the configuration as shown in FIG. 16.

The circuit is configured as in FIG. 16, thereby enabling the circuit in FIG. 16 to operate in the same way as the circuit in FIG. 15 does.

EIGHTH EMBODIMENT

Figure 17:
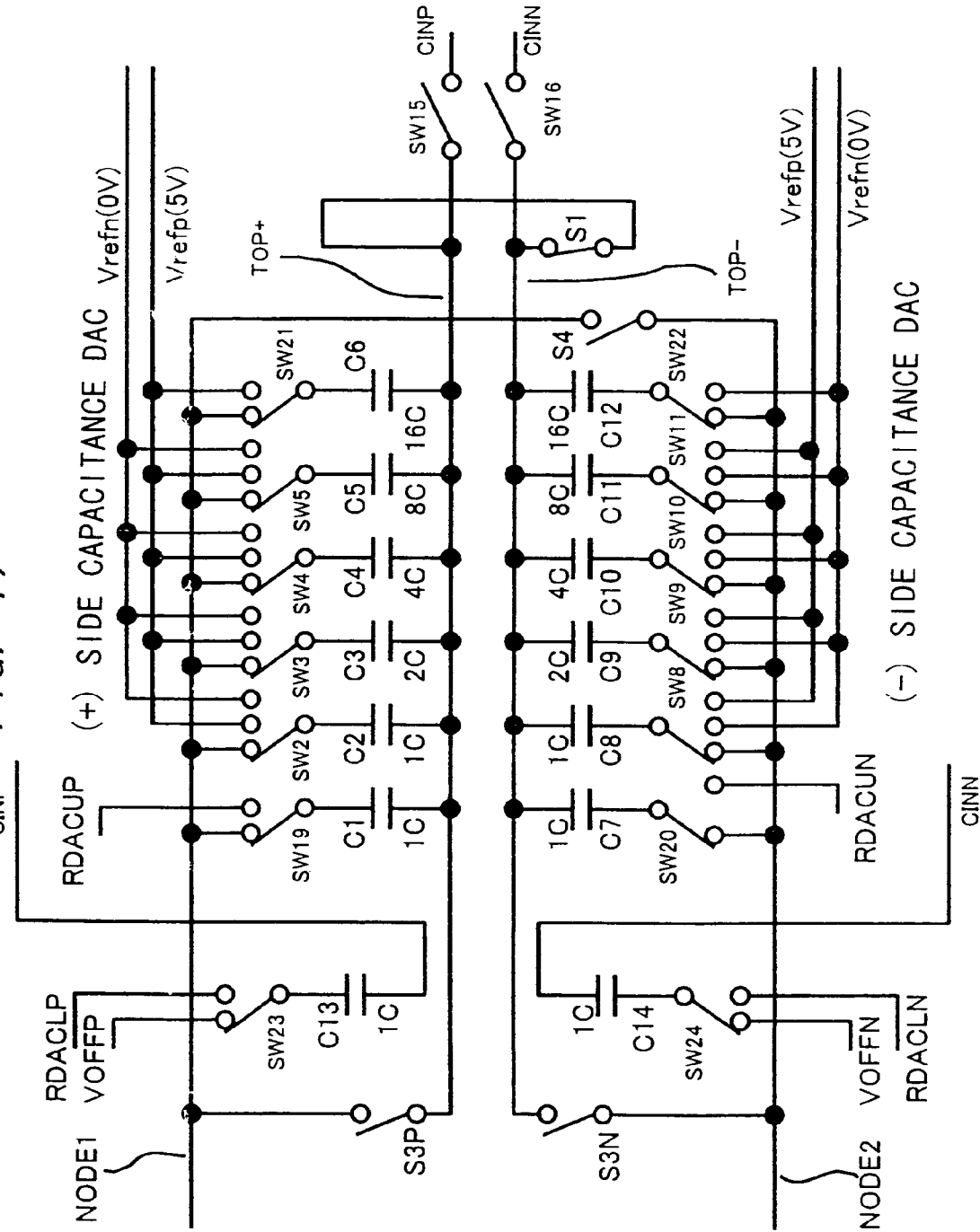
FIG. 17 is a circuit diagram showing a capacitance DAC of an AD converter according to an eighth embodiment of the invention.
Figure 18:
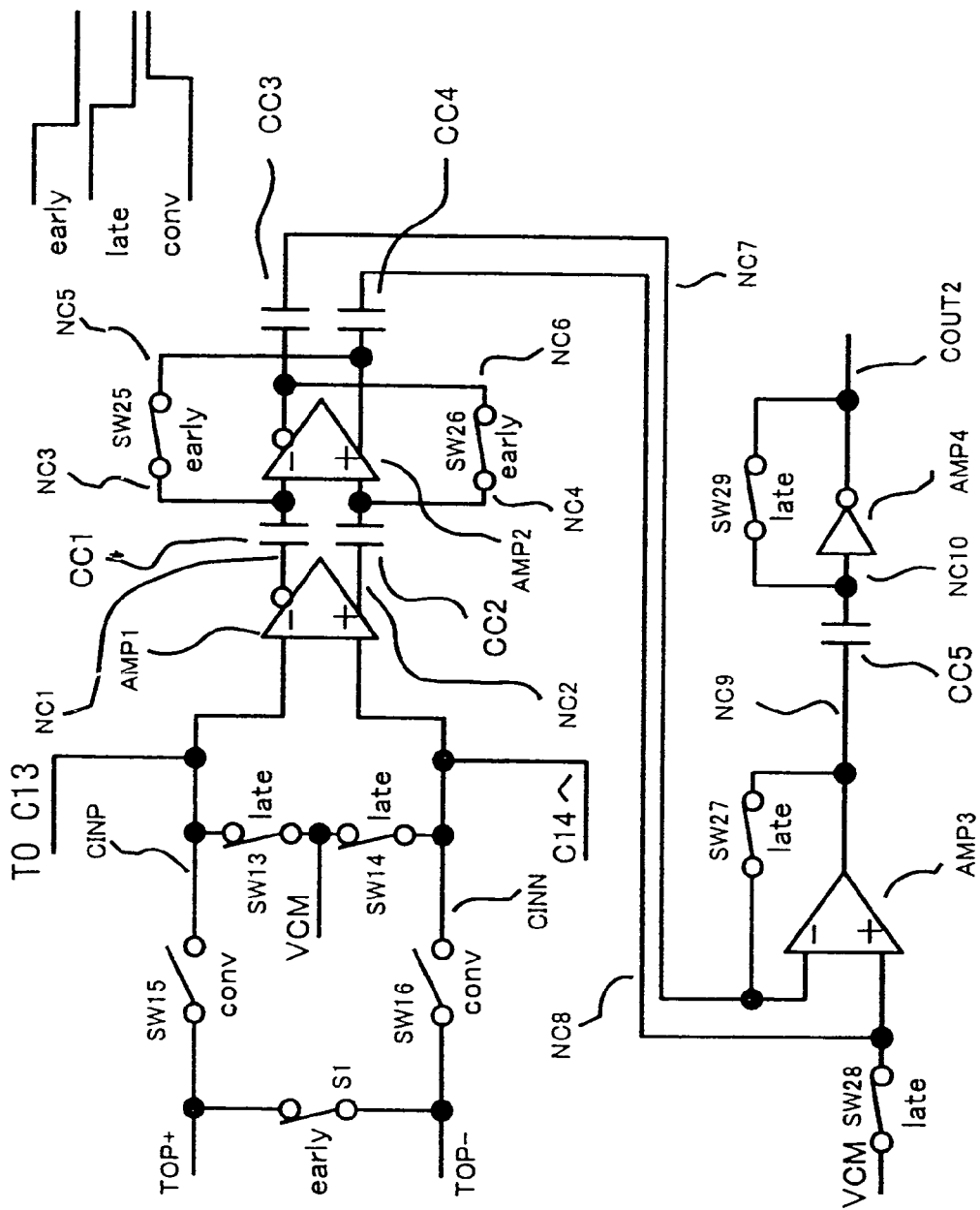
FIG. 18 is a circuit diagram showing the AD converter according to the eighth embodiment of the invention.

FIGS. 17 and 18 are circuit diagrams showing an eighth embodiment of the invention. In FIG. 17, SW2 through SW5, SW8 through SW11, SW15, SW16, SW19 through SW24, S1, S2P, S2N, S3P, S3N and S4 represent switches, C1 through C14 designate capacitances, TOP+ designates a (+) side top plate of a capacitance array, TOP− represents a (−) side top plate of the capacitance array, Vrefp is a (+) side reference electric potential (e.g., 5V), Vrefn is a (−) side reference electric potential (e.g., 0V), CINP and CINN are comparator inputs, NODE1, NODE2 represent internal nodes, a (+) side capacitance DAC represents DAC constructed of C1 through C6 and C13, a (−) side capacitance DAC designates DAC constructed of C7 through C12 and C14, RDACLP, RDACUP, RDACLN, RDACUN are resistance DAC outputs, VOFFP, VOFFN represent bias potentials for giving the offset to the conversion result.

The elements, the nodes, etc in FIG. 18 are the same as those in FIG. 9, and hence their explanations are omitted. Portions corresponding to the circuit elements in FIGS. 17 and 18 and the elements having the same functions as those thereof, are shown in a way that gives the same names. Further, for simplifying the illustration, some portions such as VINP, VINN, S2P, S2N, RDAC2, etc are omitted from the drawings, however, the omitted portions shall have the same configurations as those in FIGS. 1, 6, 7, 8, 9, etc, unless particularly specified.

The circuit in FIG. 17 has almost the same circuit configuration as that of the circuit in FIG. 8, a difference lies in a connection between C13 and C14. The circuit in FIG. 18 is the same as the circuit in FIG. 9, and a difference is such a point that connecting points to C13, C14 are written. The repetitive explanations of the same portions as those in FIGS. 8 and 9 are omitted, and portions peculiar to FIG. 17 will be explained with reference to FIG. 18.

In the circuit in FIG. 8, the top plates of C13 and C14 are TOP+ and TOP−. The capacitances C13, C14 are not the sampling capacitances that perform the sampling of the analog input signals VINP, VINN and therefore have the same function as the parasitic capacitances to TOP+ and TOP−. Namely, it is a cause of deviating the final common electric potential at the time of the comparison by the comparator from the idealistic value to some extent. There are many cases of actually having no problem with the circuit configuration in FIG. 8, however, in the case of reducing this deviation of the common electric potential to the greatest possible degree, the configuration as in FIG. 17 can be taken.

In FIG. 17, the top plates of C13, C14 are set to nodes different from the top plates TOP+, TOP− of the capacitance DAC. The capacitances C1 through C6 and C7 through C12 are respectively connected to TOP+, TOP−, so that the operation of the capacitance DAC is the same as that in the circuit in FIG. 7.

C13, C14 are not the sampling capacitances, and hence it is convenient if the top plate electric potential is set to the comparator input common electric potential VCM. Therefore, the top plates of C13, C14 are connected to the comparator inputs CINP, CINN in FIG. 18.

During the sampling, CINP, CINN each become the electric potential of VCM, so that the electric potentials of the top plates of C13, C14 also become VCM. During the sampling period, the electric potentials of TOP+, TOP− become the common electric potential of the input common electric potentials, however, TOP+, TOP− are separated from CINP, CINN by SW15, SW16, and hence there is no problem. When starting the comparison by the comparator, SW15, SW16 are switched ON, CINP, CINN and TOP+, TOP− come to have the same electric potential, and the common electric potential thereof is ½ as small as the reference voltage (the reference voltage/2). Since CINP, CINN and TOP+, TOP− come to have the same electric potential upon a start of the comparing operation even if the top plates of C13, C14 are made as the nodes different from TOP+, TOP− as in FIG. 17, the top plates can be made to function in the same way as in the circuit in FIG. 8.

The capacitances C13, C14, which do not contribute to the sampling, can be separated from TOP+, TOP− while actualizing the same operation as that in FIG. 8 by taking the configurations as in FIGS. 17 and 18, thereby acquiring the effect of being capable of reducing the deviation of the final common electric potential of TOP+, TOP− from the idealistic value.

The idea of the invention can be applied also to the configurations in FIGS. 17 and 18 while using the complicated CR double stage DAC as in the case of the configuration in FIG. 8.

EFFECTS OF EMBODIMENTS

As explained above, in the AD converters according to the first through eighth embodiments, the switch S4 or the NMOS transistors NM7, NM8 and the PMOS transistors PM7, PM8 is or are provided, whereby the electric potentials of the internal nodes NODE1, NODE2 can be controlled so that these electric potentials are not kept in the state of exceeding the power source voltage range. With this contrivance, it is possible to reduce the loss of the electric potentials of the top plates through S3P, S3N, and hence, even in the case of converting the analog input signals in the power source voltage range into the digital values, the more accurate conversion result is acquired.

According to the AD converters based on the first through eighth embodiments, on the assumption that the analog input signal VINP supplied to the bottom plate of the (+) side capacitance DAC is lager than or equal to the analog input signal VINN supplied to the bottom plate of the (−) side capacitance DAC, if VINP−VINN≧0 is previously estimated by converting the analog input potential difference of (VINP−VINN) into the digital value, the AD conversion can be conducted in a way that omits the cycle for determining the sign bit, which was needed for the conventional circuit (FIG. 2). With this contrivance, the conversion time can be reduced to a degree corresponding to the time needed for determining the code.

The circuit that converts the analog signal including the polarity, if necessary, into the digital value can be actualized by use of the AD circuit for converting the analog signal into the digital value on the assumption of the polarity in the way of providing the switches in the input portions of the AD converter that converts the differential analog input into the digital value on the assumption of the sign bit and, if VINP is the electric potential lower than VINN, exchanging the input signal by the switch.

OTHERS

The disclosures of Japanese patent application No. JP2005-334563 filed on Nov. 18, 2005 including the specification, drawings and abstract are incorporated herein by reference.

What is claimed is:

1. An analog-to-digital converter circuit comprising:
a first analog terminal receiving an input of a first analog signal;
a first input switch inputting the first analog signal to said first analog terminal;
a second analog terminal receiving an input of a second analog signal;
a second input switch inputting the second analog signal to said second analog terminal;
a first reference voltage connecting terminal supplied with a first reference voltage;
a second reference voltage connecting terminal supplied with a second reference voltage;
a first unit including a digital-to-analog converter which generates a comparison signal serving as an object of comparison of the first analog signal, the first unit taking in and retaining the first analog signal from said first analog terminal and outputting a result of comparing the comparison signal and the first analog signal;
a second unit including a digital-to-analog converter which generates a comparison signal serving as an object of comparison of the second analog signal, the second unit taking in and retaining the second analog signal from said second analog terminal and outputting a result of comparing the comparison signal and the second analog signal;
a first switch connecting in a mutually openable/closable manner an output side of said first unit to an output side of said second unit;
a comparator comparing, when said first switch is opened, a differential value between the first analog signal and the second analog signal with a differential value between the comparison signal of said first digital-to-analog converter and the comparison signal of said second digital-to-analog converter; and
an electric potential control circuit controlling a fluctuation in the electric potentials of said first analog terminal and said second analog terminal,
wherein said first digital-to-analog converter has a plurality of capacitance elements, a first set of a plurality of switches connecting respective input-side terminals of said plurality of capacitance elements to any one of said first analog terminal, said first reference voltage terminal and said second reference voltage terminal, and a first common terminal connecting in common a plurality of output-side terminals facing said respective input-side terminals of said plurality of capacitance elements,
wherein said second digital-to-analog converter has a plurality of capacitance elements, a second set of a plurality of switches connecting respective input-side terminals of said plurality of capacitance elements to any one of said second analog terminal, said first reference voltage terminal and said second reference voltage terminal, and a second common terminal connecting in common a plurality of output-side terminals facing said respective input-side terminals of said plurality of capacitance elements,
wherein at a point of time when said first unit and said second unit take in the first analog signal and the second analog signal by said first input switch and said second input switch inputting the first analog signal and the second analog signal to said first analog terminal and said second analog terminal, said first common terminal and said second common terminal are connected to each other by said first switch, the connection between said first common terminal and said second common terminal is released when completing the take-in, and
said electric potential control circuit, when said first input switch and said second input switch are opened after the completion of taking in the first analog signal and the second analog signal, restrains a fluctuation in the electric potential of said first analog terminal and the electric potential of said second analog terminal.

2. The analog-to-digital converter according to claim 1, wherein said electric potential control circuit includes a second switch connecting said first analog terminal and said second analog terminal in a mutually openable/closable manner, and
when said first input switch and said second input switch are opened after completing the take-in of the first analog signal and the second analog signal, the connection by said first switch is released, and said first analog terminal and said second analog terminal are connected to each other by said second switch.

3. The analog-to-digital converter according to claim 1, wherein each of said first input switch and said second input switch has a MOS transistor operating to open and close by controlling a gate voltage between the first reference voltage and the second reference voltage, and
said electric potential control circuit includes: a first adjusting MOS transistor of which a source and a drain are connected to said first analog terminal and of which a gate is controlled between the first reference voltage and the second reference voltage;
a second adjusting MOS transistor of which a source and a drain are connected to said second analog terminal and of which a gate is controlled between the first reference voltage and the second reference voltage; and
a gate control circuit controlling, after completing the take-in of the first analog signal and the second analog signal, when said first input switch is opened by controlling the gate voltage of said MOS transistor of said first input switch, the gate voltage of said first adjusting MOS transistor in a direction reversed to the gate voltage of said MOS transistor of said first input switch, and controlling, when said second input switch is opened by controlling the gate voltage of said MOS transistor of said second input switch, the gate voltage of said second adjusting MOS transistor in a direction reversed to the gate voltage of said MOS transistor of said second input switch.

4. The analog-to-digital converter according to claim 3, wherein each of said first switch and said second switch has a first MOS transistor of a first conductivity type and a second MOS transistor of a second conductivity type, becomes conductive by setting a gate voltage of said first MOS transistor to the first reference voltage and a gate voltage of said second MOS transistor to the second reference voltage, and is shut off by setting the gate voltage of said first MOS transistor to the second reference voltage and the gate voltage of said second MOS transistor to the first reference voltage, and each of said first adjusting MOS transistor and said second adjusting MOS transistor has a third MOS transistor of the first conductivity type and a fourth MOS transistor of the second conductivity type, when setting the gate voltage of said first MOS transistor to the second reference voltage and the gate voltage of said second MOS transistor to the first reference voltage, a gate voltage of said third MOS transistor is set to the first reference voltage, and a gate voltage of said fourth MOS transistor is set to the second reference voltage.

5. An analog-to-digital converter circuit comprising:
a first analog terminal receiving an input of a first analog signal;
a first input switch inputting the first analog signal to said first analog terminal;
a second analog terminal receiving an input of a second analog signal,
a second input switch inputting the second analog signal to said second analog terminal;
a first reference voltage connecting terminal supplied with a first reference voltage;
a second reference voltage connecting terminal supplied with a second reference voltage;
a first unit including a digital-to-analog converter which generates a comparison signal serving as an object of comparison of the first analog signal, the first unit taking in and retaining the first analog signal from said first analog terminal and outputting a result of comparing the comparison signal and the first analog signal;
a second unit including a digital-to-analog converter which generates a comparison signal serving as an object of comparison of the second analog signal, the second unit taking in and retaining the second analog signal from said second analog terminal and outputting a result of comparing the comparison signal and the second analog signal;
a first switch connecting in a mutually openable/closable manner an output side of said first unit to an output side of said second digital converter; and
a comparator comparing a differential value between the first analog signal and the second analog signal with a differential value between the comparison signal of said first digital-to-analog converter and the output signal of said second digital-to-analog converter;

wherein said first digital-to-analog converter has a plurality of capacitance elements, a first set of a plurality of switches connecting respective input-side terminals of said plurality of capacitance elements to any one of said first analog terminal, said first reference voltage terminal and said second reference voltage terminal, and a first common terminal connecting in common a plurality of output-side terminals facing said respective input-side terminals of said plurality of capacitance elements, wherein said second digital-to-analog converter has a plurality of capacitance elements, a second set of a plurality of switches connecting respective input-side terminals of said plurality of capacitance elements to any one of said second analog terminal, said first reference voltage terminal and said second reference voltage terminal, and a second common terminal connecting in common a plurality of output-side terminals facing said respective input-side terminals of said plurality of capacitance elements, wherein said plurality of capacitance elements of said first digital-to-analog converter contains a first capacitance element having a capacitance that is equivalent to ½ a capacitance of said whole plural capacitance elements of said first digital-to-analog converter, after completing the take-in of the first analog signal, any one of said first reference voltage terminal and said second reference voltage terminals is connected to an input-side terminal of said capacitance element other than said first capacitance element on the basis of a result of the comparison by said comparator, and said first reference voltage terminal is connected to the input-side terminal of said first capacitance element irrespective of the result of the comparison by said comparator, and wherein said plurality of capacitance elements of said second digital-to-analog converter contains a second capacitance element having a capacitance that is equivalent to ½ a capacitance of said whole plural capacitance elements of said second digital-to-analog converter, after completing the take-in of the second analog signal, any one of said first reference voltage terminal and said second reference voltage terminals is connected to an input-side terminal of said capacitance element other than said second capacitance element on the basis of the result of the comparison by said comparator, and said second reference voltage terminal is connected to the input-side terminal of said second capacitance element irrespective of the result of the comparison by said comparator.

6. The analog-to-digital converter according to claim 5, further comprising:
an input side comparator comparing a signal level of the first analog signal with a signal level of the second analog signal; and
a switch switching the first analog signal and the second analog signal depending on the result of the comparison by the input side comparator, and setting the signal level inputted to said first analog terminal higher than the signal level inputted to said second analog terminal.

* * * * *